(12) United States Patent
Diao et al.

(10) Patent No.: US 11,469,291 B2
(45) Date of Patent: Oct. 11, 2022

(54) DISPLAY PANEL, METHOD OF MANUFACTURING THE SAME, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yongfu Diao, Beijing (CN); Chenyu Chen, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 17/040,846

(22) PCT Filed: Nov. 29, 2019

(86) PCT No.: PCT/CN2019/121948
§ 371 (c)(1),
(2) Date: Sep. 23, 2020

(87) PCT Pub. No.: WO2021/102904
PCT Pub. Date: Jun. 3, 2021

(65) Prior Publication Data
US 2021/0193780 A1  Jun. 24, 2021

(51) Int. Cl.
*G09G 3/3233* (2016.01)
*H01L 27/32* (2006.01)

(52) U.S. Cl.
CPC ....... *H01L 27/3276* (2013.01); *G09G 3/3233* (2013.01); *H01L 27/3248* (2013.01);
(Continued)

(58) Field of Classification Search
CPC ......... G09G 3/3233; G09G 2300/0426; G09G 3/3648; H01L 27/3276; H01L 27/3265; H01L 27/3272
See application file for complete search history.

(56) References Cited

U.S. PATENT DOCUMENTS 5,953,088 A * 9/1999 Hanazawa ........ G02F 1/136213
349/110
2010/0155715 A1   6/2010 Yun et al.
(Continued)

FOREIGN PATENT DOCUMENTS

CN   105321957 A   2/2016
CN   106847170 A   6/2017
(Continued)

OTHER PUBLICATIONS

First Office Action for Russian Application No. 2021119144, dated Feb. 28, 2022, 10 Pages.
(Continued)

*Primary Examiner* — Kevin M Nguyen
(74) *Attorney, Agent, or Firm* — Brooks Kushman P.C.

(57) ABSTRACT

A display substrate includes a substrate and a plurality of sub-pixels arranged in an array on the substrate. The sub-pixel includes: a data line pattern extending along a first direction; a power signal line pattern, the power signal line pattern including a portion extending along the first direction: and a sub-pixel driving circuit. The sub-pixel driving circuit includes two switching transistors, a driving transistor, and a storage capacitor; a first/second electrode plate of the storage capacitor is coupled to a gate electrode of the driving transistor/ the power signal line pattern, second electrodes of the two switching transistors are both coupled to a first electrode of the driving transistor, and orthographic projection of a second electrode of at least one of the two switching transistors on the substrate at least partially over-
(Continued)

laps orthographic projection of the power signal line pattern or the second electrode plate on the substrate.

19 Claims, 25 Drawing Sheets

(52) U.S. Cl.
CPC ...... *H01L 27/3262* (2013.01); *H01L 27/3265* (2013.01); *H01L 27/3272* (2013.01); *G09G 2300/0426* (2013.01); *G09G 2300/0842* (2013.01); *G09G 2300/0861* (2013.01)

(56) References Cited

U.S. PATENT DOCUMENTS

| | | |
|---|---|---|
| 2010/0295756 A1 | 11/2010 | Yoshida et al. |
| 2013/0222270 A1 | 8/2013 | Winkler et al. |
| 2016/0343865 A1 | 11/2016 | Fang et al. |
| 2017/0154944 A1 | 6/2017 | Kim et al. |
| 2017/0365213 A1 | 12/2017 | Rieutort-Louis et al. |
| 2018/0061908 A1 | 3/2018 | Shim et al. |
| 2018/0102400 A1 | 4/2018 | Choi et al. |
| 2018/0249046 A1* | 8/2018 | Son .................. H01L 27/124 |
| 2021/0320130 A1 | 10/2021 | Xian et al. |

FOREIGN PATENT DOCUMENTS

| | | |
|---|---|---|
| CN | 107799556 A | 3/2018 |
| CN | 107919378 A | 4/2018 |
| CN | 104882450 B | 5/2018 |
| CN | 108154842 A | 6/2018 |
| CN | 109659350 A | 4/2019 |
| CN | 109856874 A | 6/2019 |
| CN | 110114885 A | 8/2019 |
| CN | 110190073 A | 8/2019 |
| CN | 110211975 A | 9/2019 |
| CN | 110335564 A | 10/2019 |
| KR | 20160001821 A | 1/2016 |
| RU | 2010127053 A | 3/2012 |

OTHER PUBLICATIONS

European Search Report dated Aug. 18, 2022, Application No./Patent No. 20824416.0-1020 / 3993038 PCT/CN2020132389, Applicant BOE Technology Group Co., Ltd., et al., 7 Pages.

Indian Examination Report dated Jul. 7, 2022, Application No. 202147052241, 5 Pages.

* cited by examiner

DISPLAY PANEL, METHOD OF MANUFACTURING THE SAME, AND DISPLAY DEVICE

CROSS-REFERENCE TO RELATED APPLICATION

This application is the U.S. national phase of PCT Application No. PCT/CN2019/121948 filed on Nov. 29, 2019, which is incorporated herein by reference in its entirety.

TECHNICAL FIELD

The present disclosure relates to the field of display technology, in particular to a display panel, a method of manufacturing a display panel and a display device.

BACKGROUND

Organic Light-Emitting Diode (OLED) display products are widely used in various fields due to their advantages of high brightness, low power consumption, fast response, high definition, good flexibility, and high luminous efficiency.

As the application range of OLED display products becomes wider and wider, the display quality requirements for OLED display products are getting higher and higher. There are many factors that affect the display quality of display products. Among them, the crosstalk generated by the pixel circuit structure included in the display product is widely concerned by people as an important factor.

SUMMARY

The objective of the present disclosure is to provide a display substrate, a method of manufacturing the display substrate and a display device.

In a first aspect, a display substrate includes a substrate and a plurality of sub-pixels arranged in an array on the substrate; wherein the sub-pixel includes: a data line pattern extending along a first direction; a power signal line pattern, the power signal line pattern including a portion extending along the first direction; a sub-pixel driving circuit, wherein the sub-pixel driving circuit includes two switching transistors, a driving transistor, and a storage capacitor; a first electrode plate of the storage capacitor is coupled to a gate electrode of the driving transistor, and a second electrode plate of the storage capacitor is coupled to the power signal line pattern; second electrodes of the two switching transistors are both coupled to a first electrode of the driving transistor, and orthographic projection of a second electrode of at least one of the two switching transistors on the substrate at least partially overlaps orthographic projection of the power signal line pattern on the substrate, and at least overlaps orthographic projection of the second electrode plate of the storage capacitor on the substrate.

Optionally, the second electrodes of the two switching transistors and the first electrode of the driving transistor are an integral structure, and the integral structure includes a first conductive portion extending in the first direction, orthographic projection of the first conductive portion on the substrate, orthographic projection of the power signal line pattern on the substrate, and orthographic projection of the second electrode plate of the storage capacitor on the substrate have a first overlapping region, and the first overlapping region does not overlap orthographic projection of the data line pattern on the substrate.

Optionally, orthographic projection of the first electrode of the driving transistor on the substrate is located in the orthographic projection of the second electrode plate of the storage capacitor on the substrate.

Optionally, the sub-pixel further comprises: a gate line pattern and a light emitting control signal line pattern both extending along a second direction, the second direction intersecting the first direction; the sub-pixel driving circuit further includes: a first transistor and a sixth transistor; the two switching transistors include a fourth transistor and a fifth transistor; a gate electrode of the fourth transistor is coupled to the gate line pattern, a first electrode of the fourth transistor is coupled to the data line pattern, and a second electrode of the fourth transistor is coupled to a second electrode of the fifth transistor, a gate electrode of the fifth transistor is coupled to the light emitting control signal line pattern, and a first electrode of the fifth transistor is coupled to the power signal line pattern; a gate electrode of the first transistor is coupled to the gate line pattern, a second electrode of the first transistor is coupled to the gate electrode of the driving transistor, the first electrode of the first transistor, a first electrode of the six transistor and the second electrode of the driving transistor are formed as an integral structure, and the integral structure includes a second conductive portion extending along the first direction, a gate electrode of the sixth transistor is coupled to the light emitting control signal line pattern, and a second electrode of the sixth transistor is coupled to the light emitting element in the sub-pixel; orthographic projection of a channel region of the driving transistor on the substrate is located between orthographic projection of the first conductive portion on the substrate and orthographic projection of the second conductive portion on the substrate; and along the second direction, a minimum distance between the orthographic projection of the channel region of the driving transistor on the substrate and the orthographic projection of the first conductive portion on the substrate is smaller than a minimum distance between the orthographic projection of the channel region of the driving transistor on the substrate and the orthographic projection of the second conductive portion on the substrate.

Optionally, the sub-pixel further comprises: a gate line pattern and a light emitting control signal line pattern both extending along a second direction, the second direction intersecting the first direction, the sub-pixel driving circuit further includes: a first transistor and a sixth transistor; the two switching transistors include a fourth transistor and a fifth transistor; a gate electrode of the fourth transistor is coupled to the gate line pattern, a first electrode of the fourth transistor is coupled to the data line pattern, and a second electrode of the fourth transistor is coupled to a second electrode of the fifth transistor, a gate electrode of the fifth transistor is coupled to the light emitting control signal line pattern, and a first electrode of the fifth transistor is coupled to the power signal line pattern; a gate electrode of the first transistor is coupled to the gate line pattern, a second electrode of the first transistor is coupled to the gate electrode of the driving transistor, the first electrode of the first transistor, a first electrode of the six transistor and the second electrode of the driving transistor are formed as an integral structure, and the integral structure includes a second conductive portion extending along the first direction, a gate electrode of the sixth transistor is coupled to the light emitting control signal line pattern, and a second electrode of the sixth transistor is coupled to the light emitting element in the sub-pixel; orthographic projection of a channel region of the driving transistor on the substrate is located between orthographic projection of the first conductive portion on the substrate and orthographic projection of the second conductive portion on the substrate; the first electrode and the second electrode of the driving transistor both include a first portion extending along the second direction, and a length of the first portion of the first electrode along the second direction is different from a length of the first portion of the second electrode along the second direction.

Optionally, the sub-pixel further comprises an initialization signal line pattern, the initialization signal line pattern includes a portion extending along a second direction, and the second direction intersects the first direction, and the initialization signal line pattern is used to transmit an initialization signal with a fixed potential; the sub-pixel driving circuit further includes a second transistor coupled to the gate electrode of the driving transistor, and the second transistor includes: a first semiconductor pattern, a second semiconductor pattern, and a third conductor pattern respectively coupled to the first semiconductor pattern and the second semiconductor pattern respectively, conductivity of the third conductor pattern is better than conductivity of the first semiconductor pattern and conductivity of the second semiconductor pattern; a first gate pattern and the second gate pattern, orthographic projection of the first gate pattern on the substrate at least partially overlaps orthographic projection of the first semiconductor pattern on the substrate, orthographic projection of the second gate pattern on the substrate at least partially overlaps orthographic projection of the second semiconductor pattern on the substrate; orthographic projection of the third conductor pattern on the substrate, orthographic projection of the first gate pattern on the substrate, and orthographic projection of the second gate pattern on the substrate do not overlap; orthographic projection of the third conductor pattern on the substrate at least partially overlaps orthographic projection of the initialization signal line pattern on the substrate.

Optionally, the sub-pixel driving circuit further comprises a first extension part extending from the first semiconductor pattern, and the conductivity of the first extension part is better than that of the first semiconductor pattern; the first extension includes a first part, a second part, and a third part, the first part and the third part all extend along the first direction, and the second part extends along the second direction, one end of the second part is coupled to the first part, and the other end of the second part is coupled to the third part; one end of the third part away from the second part is coupled to the first transistor.

Optionally, the sub-pixel driving circuit further comprises: a first transistor and a sixth transistor; the first transistor includes: a fourth semiconductor pattern, a fifth semiconductor pattern, and a sixth conductor pattern respectively coupled to the fourth semiconductor pattern and the fifth semiconductor pattern, conductivity of the sixth conductor pattern is better than conductivity of the fourth semiconductor pattern and conductivity of the fifth semiconductor pattern; the third gate pattern and the fourth gate pattern coupled to each other, and orthographic projection of the third gate pattern on the substrate partially overlaps orthographic projection of the fourth semiconductor pattern on the substrate, orthographic projection of the fourth gate pattern on the substrate partially overlaps orthographic projection of the fifth semiconductor pattern on the substrate; orthographic projection of the sixth conductor pattern on the substrate, orthographic projection of the third gate pattern on the substrate, and orthographic projection of the fourth gate pattern on the substrate do not overlap.

Optionally, the sub-pixel further includes an initialization signal line pattern, the initialization signal line pattern includes a portion extending along a second direction, and the second direction intersects the first direction, the initialization signal line pattern is used to transmit an initialization signal with a fixed potential; the sub-pixel driving circuit further includes: a first shielding component coupled to the initialization signal line pattern, orthographic projection of the first shielding component on the substrate at least partially overlaps the orthographic projection of the sixth conductor pattern on the substrate.

Optionally, the sub-pixel further comprises an initialization signal line pattern, the initialization signal line pattern includes a portion extending along a second direction, and the second direction intersects the first direction, and the initialization signal line pattern is used to transmit an initialization signal with a fixed potential; the sub-pixel driving circuit further includes: a first shielding component coupled with the initialization signal line pattern, a second shielding component coupled with the first shielding component, orthographic projection of the second shielding component on the substrate at least partially overlaps orthographic projections of the sixth conductor patterns on the substrate.

Optionally, the first shielding component is an extension structure extending from the initialization signal line pattern.

Optionally, the first shielding component and the initialization signal line pattern are arranged in different layers, and the orthographic projection of the first shielding component on the substrate and the orthographic projection of the initialization signal line pattern on the substrate have a first overlapping region, the first shielding component is coupled to the initialization signal line pattern through a first via hole at the first overlapping region; the second shielding component and the first shielding component are arranged in different layers, and the orthographic projection of the second shielding component on the substrate and the orthographic projection of the first shielding component on the substrate have a second overlapping region, the second shielding component and the first shielding component are coupled through a second via hole at the second overlapping region.

Optionally, the first shielding component and the data line pattern are made of a same material.

Optionally, the display substrate comprises a first interlayer insulating layer, and the first shielding component and the data line pattern are both located on a surface of the first interlayer insulating layer away from the substrate.

Optionally, the second shielding component and the initialization signal line pattern are made of a same material.

Optionally, the display substrate further comprises a second interlayer insulating layer, and the second shielding component and the initialization signal line pattern are both located on a surface of the second interlayer insulating layer away from the substrate.

Optionally, the first electrode plate of the storage capacitor is multiplexed as the gate electrode of the drive transistor, and the second electrode plate of the storage capacitor and the second shielding component are made of a same material, and the second electrode plate of the storage capacitor is located on a surface of the second interlayer insulating layer away from the substrate.

Optionally, the sub-pixel further comprises: a reset signal line pattern extending along a second direction intersecting the first direction, and the sub-pixel driving circuit further includes: a first conductive connection portion, orthographic projection of the first conductive connection portion on the substrate covers at least part of orthographic projection of the sixth conductor pattern on the substrate; a second transistor, a first electrode of the second transistor is coupled to the initialization signal line pattern through the first conductive connection portion, and a second electrode of the second transistor is coupled to the gate electrode of the driving transistor, a gate electrode of the second transistor is coupled to the reset signal line pattern.

Optionally, the sub-pixel further comprises: a gate line pattern, a light emitting control signal line pattern, a reset signal line pattern, and an initialization signal line pattern; the gate line pattern, the light emitting control signal line pattern, the reset signal line pattern, and the initialization signal line pattern all extend along a second direction, and the second direction intersects the first direction; the two switching transistors include a fourth transistor and a fifth transistor; the sub-pixel driving circuit further includes: a first transistor, a second transistor, a sixth transistor, and a seventh transistor; a gate electrode of the driving transistor is coupled to a second electrode of the first transistor, a first electrode of the driving transistor is coupled to a second electrode of the fifth transistor, and a second electrode of the driving transistor is coupled to a first electrode of the first transistor; a gate electrode of the first transistor is coupled to the gate line pattern; a gate electrode of the second transistor is coupled to the reset signal line pattern, a first electrode of the second transistor is coupled to the initialization signal line pattern, and a second electrode of the second transistor is coupled to the gate electrode of the driving transistor; a gate electrode of the fourth transistor is coupled to the gate line pattern, a first electrode of the fourth transistor is coupled to the data line pattern, and a second electrode of the fourth transistor is coupled to the first electrode of the driving transistor; a gate electrode of the fifth transistor is coupled to the light emitting control signal line pattern, and a first electrode of the fifth transistor is coupled to the power signal line pattern; a gate electrode of the sixth transistor is coupled to the light emitting control signal line pattern, a first electrode of the sixth transistor is coupled to the second electrode of the driving transistor, and a second electrode of the sixth transistor is coupled to a corresponding light emitting element in the sub-pixel; a gate electrode of the seventh transistor is coupled to the reset signal line pattern included in a next sub-pixel adjacent along the first direction, and a first electrode of the seventh transistor is connected to the initialization signal line pattern included in the next sub-pixel, and a second electrode of the seventh transistor is coupled to the light emitting element in the sub-pixel.

A second aspect of the present disclosure provides a display substrate, including: a substrate and a plurality of sub-pixels arranged in an array on the substrate; the sub-pixel includes: a data line pattern extending along a first direction; an initialization signal line pattern, the initialization signal line pattern includes a portion extending in a second direction, the second direction intersects the first direction, and the initialization signal line pattern is used to transmit an initialization signal with a fixed potential; sub-pixel driving circuit, the sub-pixel driving circuit includes: a driving transistor, a first transistor coupled to a gate electrode of the driving transistor, and a first shielding component coupled to the initialization signal line pattern, the orthographic projection of the first shielding component on the substrate is located between the orthographic projection of the first transistor on the substrate and the orthographic projection of the target data line pattern on the substrate; a next sub-pixel adjacent to the sub-pixel along the second direction includes the target data line pattern.

Optionally, the plurality of sub-pixels include a plurality of rows of sub-pixels, each row of sub-pixels includes a plurality of sub-pixels arranged along the second direction, and the initialization signal line patterns in the same row of sub-pixels are sequentially coupled to form an initialization signal line corresponding to the row of sub-pixels; the first shielding member extends along the first direction and is coupled to at least one of the initialization signal lines.

Optionally, the first shielding component is coupled to two adjacent initialization signal lines.

Optionally, the first shielding component and the initialization signal line pattern are arranged in different layers, and the orthographic projection of the first shielding component on the substrate and the orthographic projection of the initialization signal line pattern on the substrate have a first overlapping region, and the first shielding component is coupled to the initialization signal line pattern through a first via provided in the first overlapping region.

Optionally, the first shielding component and the data line pattern are made of the same material.

Optionally, the display substrate includes a first interlayer insulating layer, and both the first shielding member and the data line pattern are located on a surface of the first interlayer insulating layer away from the substrate.

Optionally, the sub-pixel driving circuit further includes a second transistor coupled to the gate electrode of the driving transistor, and the second transistor includes: a first semiconductor pattern, a second semiconductor pattern, and a third conductor pattern respectively coupled to the first semiconductor pattern and the second semiconductor pattern, the conductivity of the third conductor pattern is better than conductivity of the first semiconductor pattern and the conductivity of the second semiconductor pattern; a first gate pattern and a second gate pattern that are coupled to each other, wherein the orthographic projection of the first gate pattern on the substrate at least partially overlaps the orthographic projection of the first semiconductor pattern on the substrate, the orthographic projection of the second grid pattern on the substrate at least partially overlaps the orthographic projection of the second semiconductor pattern on the substrate; the orthographic projection of the third conductor pattern on the substrate, the orthographic projection of the first grid pattern on the substrate, and the orthographic projection of the second grid pattern on the substrate do not overlap; the orthographic projection of the third conductor pattern on the substrate at least partially overlaps the orthographic projection of the initialization signal line pattern on the substrate.

Optionally, the sub-pixel driving circuit further includes a first extension portion extending from the first semiconductor pattern, and the conductivity of the first extension portion is better than that of the first semiconductor pattern; the first extension includes a first part, a second part, and a third part, the first part and the third part all extend along the first direction, and the second part extends along the second direction, one end of the second part is coupled to the first part, and the other end of the second part is coupled to the third part; one end of the third part away from the second part is coupled to the first transistor.

Optionally, the first transistor includes: a fourth semiconductor pattern, a fifth semiconductor pattern, and a sixth conductor pattern respectively coupled to the fourth semiconductor pattern and the fifth semiconductor pattern, the conductivity of the sixth conductor pattern is better than conductivity of the fourth semiconductor pattern and the conductivity of the fifth semiconductor pattern; a third gate pattern and a fourth gate pattern coupled to each other, the orthographic projection of the third gate pattern on the substrate partially overlaps the orthographic projection of the fourth semiconductor pattern on the substrate, the orthographic projection of the fourth gate pattern on the substrate partially overlaps the orthographic projection of the fifth semiconductor pattern on the substrate; the orthographic projection of the sixth conductor pattern on the substrate, the orthographic projection of the third gate pattern on the substrate, and the orthographic projection of the fourth gate pattern on the substrate do not overlap.

Optionally, the orthographic projection of the first shielding component on the substrate at least partially overlaps the orthographic projection of the sixth conductor pattern on the substrate.

Optionally, the sub-pixel driving circuit further includes: a second shielding component coupled with the first shielding component, the orthographic projection of the second shielding component on the substrate at least partially overlaps the orthographic projection of the sixth conductor pattern on the substrate.

Optionally, the second shielding component and the first shielding component are arranged in different layers, and the orthographic projection of the second shielding component on the substrate and the orthographic projection of the first shielding component on the substrate have a second overlapping region, and the second shielding member and the first shielding member are coupled through a second via hole provided in the second overlapping region.

Optionally, the second shielding component and the initialization signal line pattern are made of the same material.

Optionally, the display substrate further includes a second interlayer insulating layer, and both the second shielding member and the initialization signal line pattern are located on a surface of the second interlayer insulating layer away from the substrate.

Optionally, the sub-pixel further includes a power signal line pattern, the power signal line pattern includes a portion extending along the first direction, and the sub-pixel driving circuit further includes a storage capacitor, and a first electrode plate of the storage capacitors is multiplexed as the gate electrode of the driving transistor, the second electrode plate of the storage capacitor is coupled to the power signal line pattern, and the second electrode plate of the storage capacitor is located one a surface of the second interlayer insulating layer away from the substrate.

Optionally, the sub-pixel further includes: a reset signal line pattern extending along a second direction intersecting the first direction, and the sub-pixel driving circuit further includes: a first conductive connection portion, the orthographic projection of the first conductive connection portion on the substrate covers at least part of the orthographic projection of the sixth conductor pattern on the substrate; a second transistor, a first electrode of the second transistor is coupled to the initialization signal line pattern through the first conductive connection portion, and a second electrode of the second transistor is coupled to the gate electrode of the driving transistor, a gate electrode of the second transistor is coupled to the reset signal line pattern.

Optionally, the sub-pixel further includes: a gate line pattern, a light emission control signal line pattern, a reset signal line pattern, and a power signal line pattern. The gate line pattern, the light emission control signal line pattern, and the reset signal line pattern all extend along the second direction, and the power signal line pattern includes a portion extending along the first direction. The sub-pixel driving circuit further includes: a second transistor, a fourth transistor, a fifth transistor, a sixth transistor, and a seventh transistor; the gate electrode of the driving transistor is coupled to the second electrode of the first transistor, the first electrode of the driving transistor is coupled to the second electrode of the fifth transistor, and the second electrode of the driving transistor is coupled to the first electrode of the first transistor; the gate electrode of the first transistor is coupled to the gate line pattern; the gate electrode of the second transistor is coupled to the reset signal line pattern, the first electrode of the second transistor is coupled to the initialization signal line pattern, and the second electrode of the second transistor is coupled to the gate electrode of the driving transistor; the gate electrode of the fourth transistor is coupled to the gate line pattern, the first electrode of the fourth transistor is coupled to the data line pattern, and the second electrode of the fourth transistor is coupled the first electrode of the driving transistor; the gate electrode of the fifth transistor is coupled to the light emission control signal line pattern, and the first electrode of the fifth transistor is coupled to the power signal line pattern; the gate electrode of the sixth transistor is coupled to the light emission control signal line pattern, the first electrode of the sixth transistor is coupled to the second electrode of the driving transistor, and the second electrode of the sixth transistor is coupled to the light emitting element in the sub-pixel; the gate electrode of the seventh transistor is coupled to the reset signal line pattern included in the next sub-pixel adjacent along the first direction, and the first electrode of the seventh transistor is connected to the initialization signal line pattern included in the next sub-pixel, and the second electrode of the seventh transistor is coupled to the light-emitting element in the sub-pixel.

Optionally, the sub-pixel further includes: a gate line pattern, a light emission control signal line pattern, a reset signal line pattern, and a power signal line pattern; the gate line pattern, the light emission control signal line pattern, and the reset signal line pattern all extend along the second direction, the power signal line pattern includes a portion extending along the first direction; the orthographic projection of the first shielding member on the substrate partially overlaps the orthographic projection of the gate line pattern on the substrate and the orthographic projection of the light-emitting control signal line pattern on the substrate.

In a third aspect, a display device including the display substrate is provided.

In a fourth aspect, a manufacturing method of a display substrate is provided. The method includes: forming a plurality of sub-pixels arranged in an array on a substrate; wherein the sub-pixel comprises: a data line pattern extending along a first direction; a power signal line pattern, the power signal line pattern including a portion extending along the first direction; a sub-pixel driving circuit, wherein the sub-pixel driving circuit includes two switching transistors, a driving transistor, and a storage capacitor; a first electrode plate of the storage capacitor is coupled to a gate electrode of the driving transistor, and a second electrode plate of the storage capacitor is coupled to the power signal line pattern; second electrodes of the two switching transistors are both coupled to a first electrode of the driving transistor, and orthographic projection of a second electrode of at least one of the two switching transistors on the substrate at least partially overlaps orthographic projection of the power signal line pattern on the substrate, and at least overlaps orthographic projection of the second electrode plate of the storage capacitor on the substrate.

BRIEF DESCRIPTION OF THE DRAWINGS

The drawings described here are used to provide a further understanding of the present disclosure and constitute a part of the present disclosure. The embodiments of the present disclosure are used for illustration, and do not limit the present disclosure.

DETAILED DESCRIPTION

In order to further illustrate the display substrate, a method of manufacturing the display panel, and the display device provided by the embodiments of the present disclosure, a detailed description will be given below in conjunction with the accompanying drawings.

In the related art, there are many reasons for crosstalk in OLED display products. The main crosstalk is caused by the data line pattern around the driving transistor in the sub-pixel driving circuit to the driving transistor. More specifically, when the sub-pixel driving circuit is laid out, various types of transistors with other functions are arranged at the periphery of the driving transistor in the sub-pixel driving circuit. These transistors are composed of multilayer conductive patterns. Moreover, the periphery of the driving transistor is also provided with various types of signal lines for transmitting different signals. When the sub-pixel driving circuit is in operation, the signal changes on the conductive patterns included in the various transistors and the various signal line patterns are likely to cause crosstalk to the drive transistor, thereby affecting the operating performance of the drive transistor.

Based on the existence of the above problems, the inventors of the present disclosure have discovered through research that the crosstalk that affects the operating performance of the driving transistor mainly includes: crosstalk caused by the coupling between the data line pattern and the gate electrode of the driving transistor, and the crosstalk caused by the coupling between the data line pattern and the first electrode of the driving transistor.

The inventor of the present disclosure has further studied and found that a pattern with a fixed potential can be formed on the first electrode of the driving transistor, and the first electrode of the driving transistor can be shielded by the pattern with the fixed potential, thereby reducing the coupling effect between the first electrode of the driving transistor and the data line pattern which is adjacent to the first electrode of the driving transistor, thereby reducing the crosstalk caused by the data line pattern to the driving transistor, and enabling display products to achieve better display effects.

It should be noted that one or more embodiments described herein correspond to a display substrate having a 7T1C (that is, 7 thin film transistors and 1 capacitor) sub-pixel driving circuit. In another embodiment, the display substrate may include different sub-pixel driving circuits, for example, more or less than 7 thin film transistors, and one or more capacitors.

Figure 1:
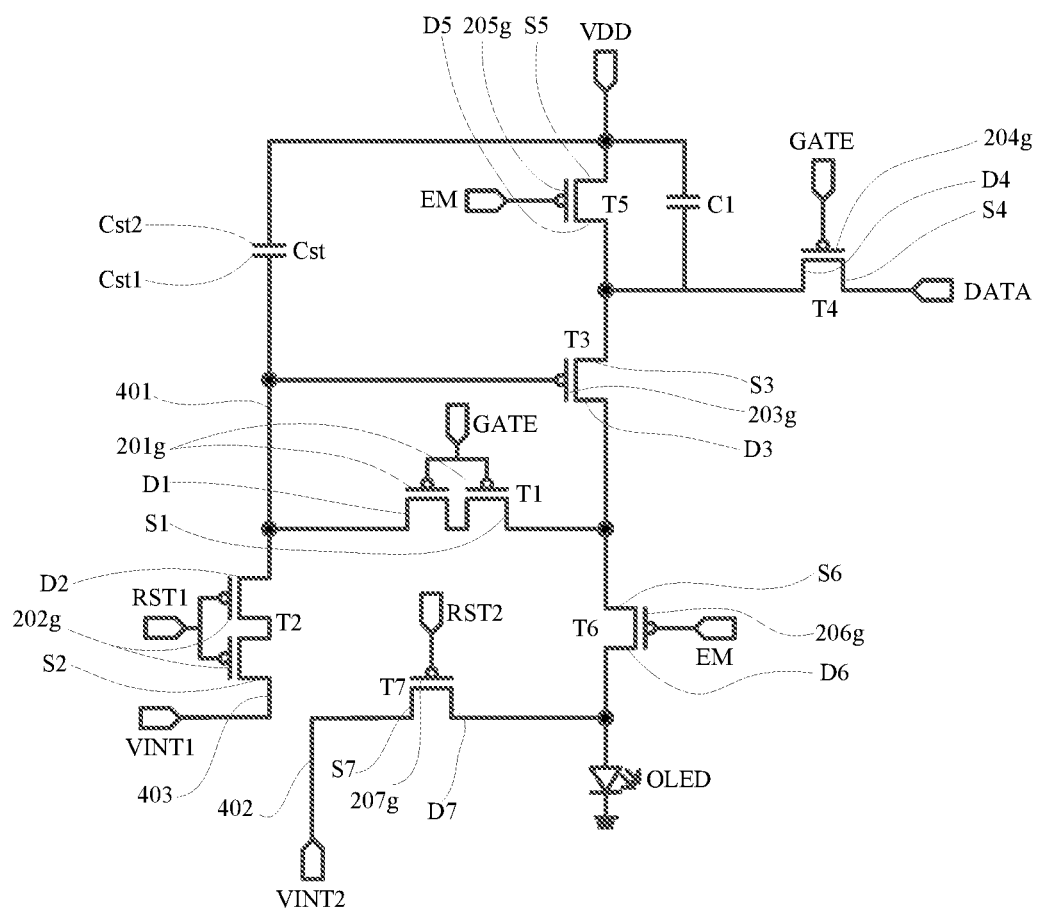
FIG. 1 is a schematic structural diagram of a sub-pixel driving circuit provided by an embodiment of the disclosure.

As shown in FIG. 1, the display substrate provided by the present disclosure includes a plurality of sub-pixels, and each sub-pixel may include: a gate line pattern GATE, a first reset signal line pattern RST1, a first initialization signal line pattern VINT1, a data line pattern DATA, a light emitting control signal line pattern EM, a power signal line pattern VDD, a second reset signal line pattern RST2, and a second initialization signal line pattern VINT2.

The sub-pixel driving circuit in each sub-pixel may include: a first transistor T1, a second transistor T2, a third transistor T3, a fourth transistor T4, a fifth transistor T5, a sixth transistor T6, a seventh transistor T7, and a storage capacitor Cst. In addition, FIG. 1 also includes a first capacitor C1, which is a parasitic capacitor.

Taking a sub-pixel driving circuit as an example, each transistor included in the sub-pixel driving circuit is a P-type transistor, wherein the first transistor T1 has a double-gate structure, and a gate electrode 201g of the first transistor T1 is coupled to the gate line pattern GATE, a source electrode S1 of the first transistor T1 is coupled to a drain electrode D3 of the third transistor T3, and a drain electrode D1 of the first transistor T1 is coupled to a gate electrode 203g of the third transistor T3.

The second transistor T2 has a double-gate structure, a gate electrode 202g of the second transistor T2 is coupled to the first reset signal line pattern RST1, a source electrode S2 of the second transistor T2 is coupled to the first initialization signal line pattern VINT1, and a drain electrode D2 of the second transistor T2 is coupled to the gate electrode 203g of the third transistor T3.

A gate electrode 204g of the fourth transistor T4 is coupled to the gate line pattern GATE, a source electrode S4 of the fourth transistor T4 is coupled to the data line pattern DATA, and a drain electrode D4 of the fourth transistor T4 is coupled to the source electrode S3 of the third transistor T3.

Agate electrode 205g of the fifth transistor T5 is coupled to the light emitting control signal line pattern EM, a source electrode S5 of the fifth transistor T5 is coupled to the power signal line pattern VDD, a drain electrode D5 of the fifth transistor T5 is coupled to the source electrode S3 of the third transistor T3.

A gate electrode 206g of the sixth transistor T6 is coupled to the light emitting control signal line pattern EM, a source electrode S6 of the sixth transistor T6 is coupled to the drain electrode D3 of the third transistor T3, and a drain electrode D6 of the sixth transistor T6 is coupled to an anode of the light emitting element OLED.

A gate electrode 207g of the seventh transistor T7 is coupled to the second reset signal line pattern RST2, a drain electrode D7 of the seventh transistor T7 is coupled to the anode of the light emitting element OLED, and a source electrode S7 of the seventh transistor T7 is coupled to the second initialization signal line pattern VINT2.

A first plate Cst1 of the storage capacitor Cst is coupled to the gate electrode 203g of the third transistor T3, and a second plate Cst2 of the storage capacitor Cst is coupled to the power signal line pattern VDD.

Figure 2:
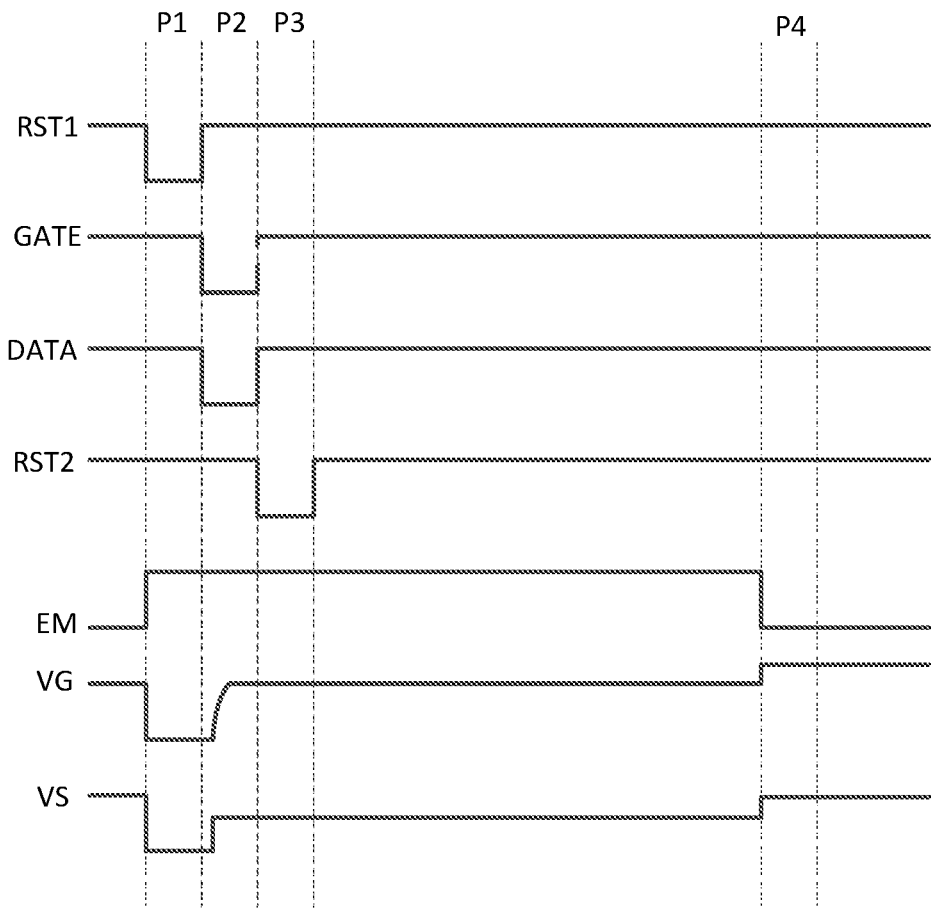
FIG. 2 is a working timing diagram corresponding to the sub-pixel driving circuit provided by an embodiment of the disclosure.

As shown in FIG. 2, when the sub-pixel driving circuit with the above structure is in operation, each work cycle includes a first reset period P1, a written-in compensation period P2, a second reset period P3, and a light emitting period P4.

In the first reset period P1, the first reset signal inputted by the first reset signal line pattern RST1 is at a valid level, the second transistor T2 is turned on, and the initialization signal transmitted by the first initialization signal line pattern VINT1 is inputted to the gate electrode 203g of the third transistor T3, so that the gate-source voltage Vgs held on the third transistor T3 in the previous frame is cleared to reset the gate electrode 203g of the third transistor T3.

In the written-in compensation period P2, the first reset signal is at an invalid level, the second transistor T2 is turned off, and the gate scanning signal inputted by the gate line pattern GATE is at a valid level, to control the first transistor T1 and the fourth transistor T4 to be turned on, the data signal is written into the data line pattern DATA and transmitted to the source electrode S3 of the third transistor T3 through the fourth transistor T4. At the same time, the first transistor T1 and the fourth transistor T4 are turned on, so that the third transistor T3 forms a diode structure, so the first transistor T1, the third transistor T3 and the fourth transistor T4 work together to realize the threshold voltage compensation of the third transistor T3. When the compensation time is long enough, the potential of the gate electrode 203g of the third transistor T3 can be controlled to reach Vdata+Vth finally, where Vdata represents the voltage value of the data signal, and Vth represents the threshold voltage of the third transistor T3.

In the second reset period P3, the gate scan signal is at an invalid level, the first transistor T1 and the fourth transistor T4 are both turned off, and the second reset signal inputted by the second reset signal line RST2 is at a valid level, and the seven transistor T7 is turned on, and the initialization signal transmitted by the second initialization signal line pattern VINT2 is inputted to the anode of the light emitting element OLED, and the light emitting element OLED is controlled to not emit light.

In the light emitting period P4, the light emitting control signal written by the light emitting control signal line pattern EM is at a valid level, and the fifth transistor T5 and the sixth transistor T6 are turned on, so that the power signal transmitted by the power signal line pattern VDD is inputted to the source electrode S3 of the third transistor T3, and the gate electrode 203g of the third transistor T3 is held at Vdata+Vth, so that the third transistor T3 is turned on, the corresponding gate-source voltage of the third transistor T3 is Vdata+Vth-VDD, where VDD is the voltage value corresponding to the power signal, the leakage current generated based on the gate-source voltage flows to the anode of the corresponding light emitting element OLED, and drives the corresponding light emitting element OLED to emit light.

Figure 3:
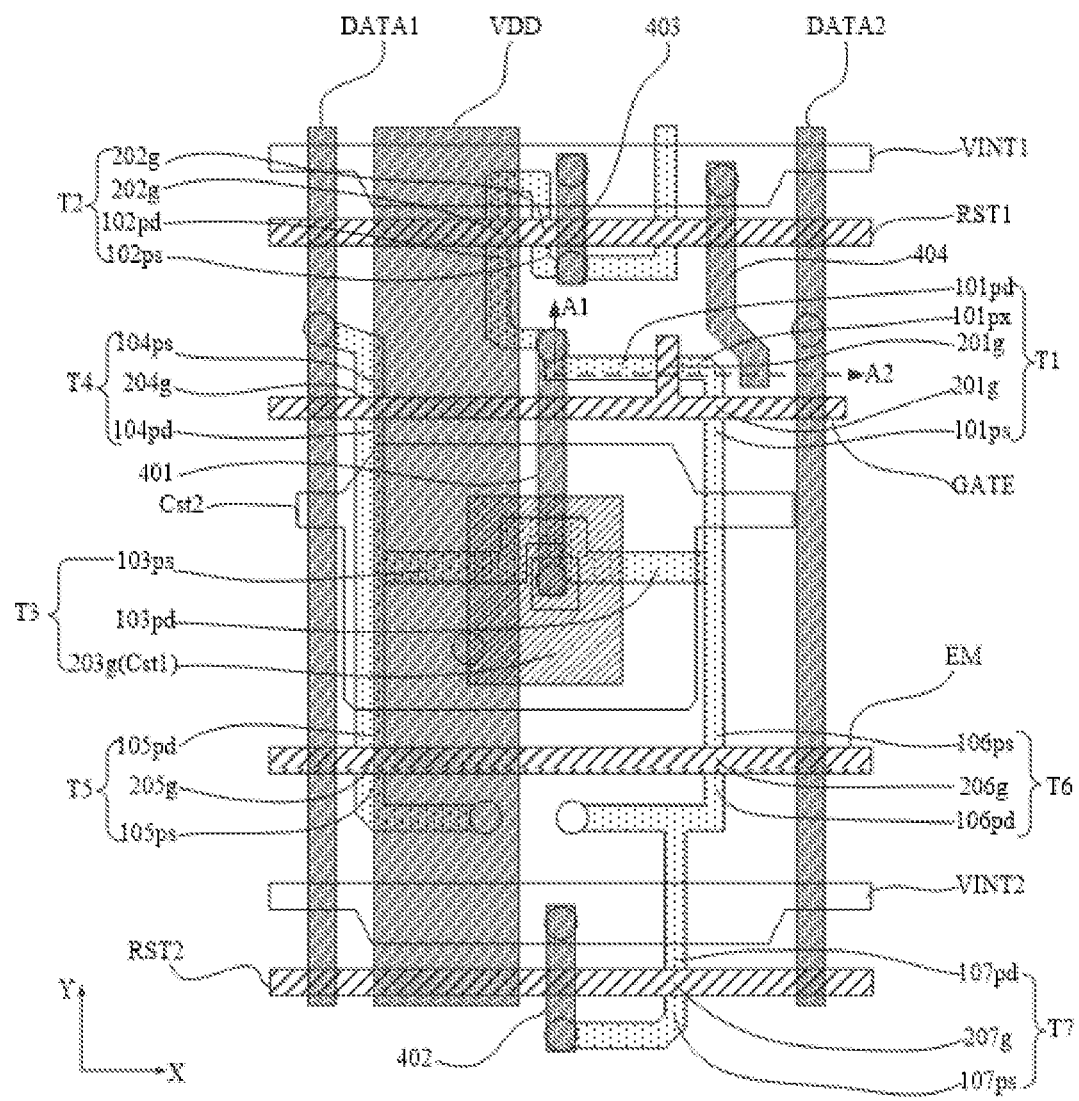
FIG. 3 is a schematic diagram of a first layout of a sub-pixel driving circuit in a display substrate provided by an embodiment of the disclosure.

As shown in FIG. 3, when the above-mentioned sub-pixel driving circuit is manufactured, the layout of various film layers corresponding to the sub-pixel driving circuit is as follows.

An active film layer, a gate insulating layer, a first gate metal layer, a first interlayer insulating layer, a second gate metal layer, a second interlayer insulating layer, a first source-drain metal layer and a third interlayer insulating layer are sequentially stacked in a direction away from the substrate.

Figure 4:
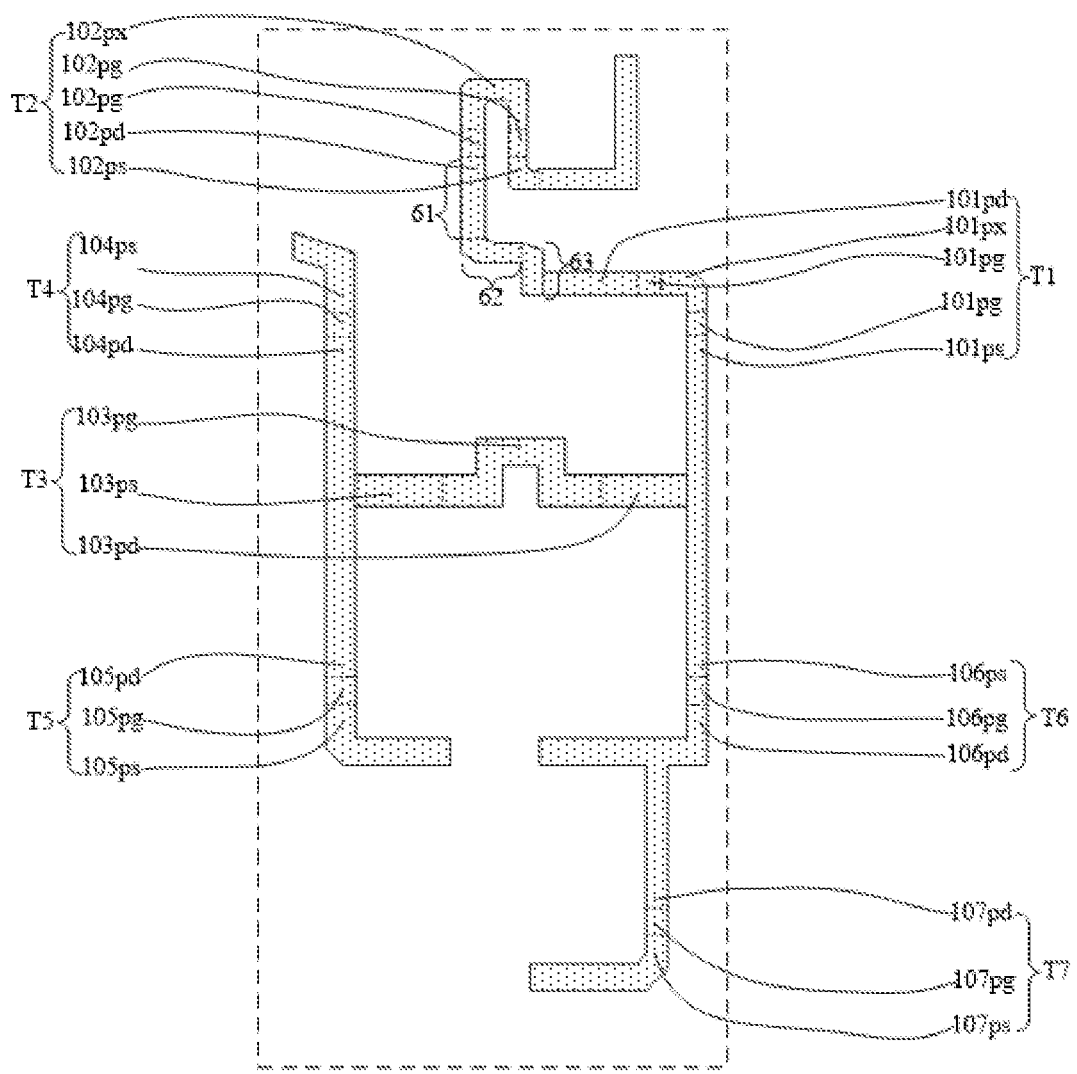
FIG. 4 is a schematic diagram of a first layout of an active film layer provided by an embodiment of the disclosure.

As shown in FIG. 4, the active film layer is used to form channel regions (such as 101pg-107pg), source formation regions (such as 101ps-107ps) and drain formation regions (such as 101pd-107pd), the active film layer corresponding to the source formation regions and drain formation regions will have better conductivity than the active film layer corresponding to the channel regions due to the doping effect; the active film layer can be made of amorphous silicon, polysilicon, oxide semiconductor materials, etc. It should be noted that the aforementioned source regions and drain regions may be regions doped with n-type impurities or p-type impurities.

In addition, the active film layer corresponding to the source formation regions and the drain formation regions can be directly used as the corresponding source or drain electrodes, or the source electrodes contacting with the source formation regions are made of a metal material, the drain electrodes contacting with the drain formation regions are made of a metal material.

Figure 5:
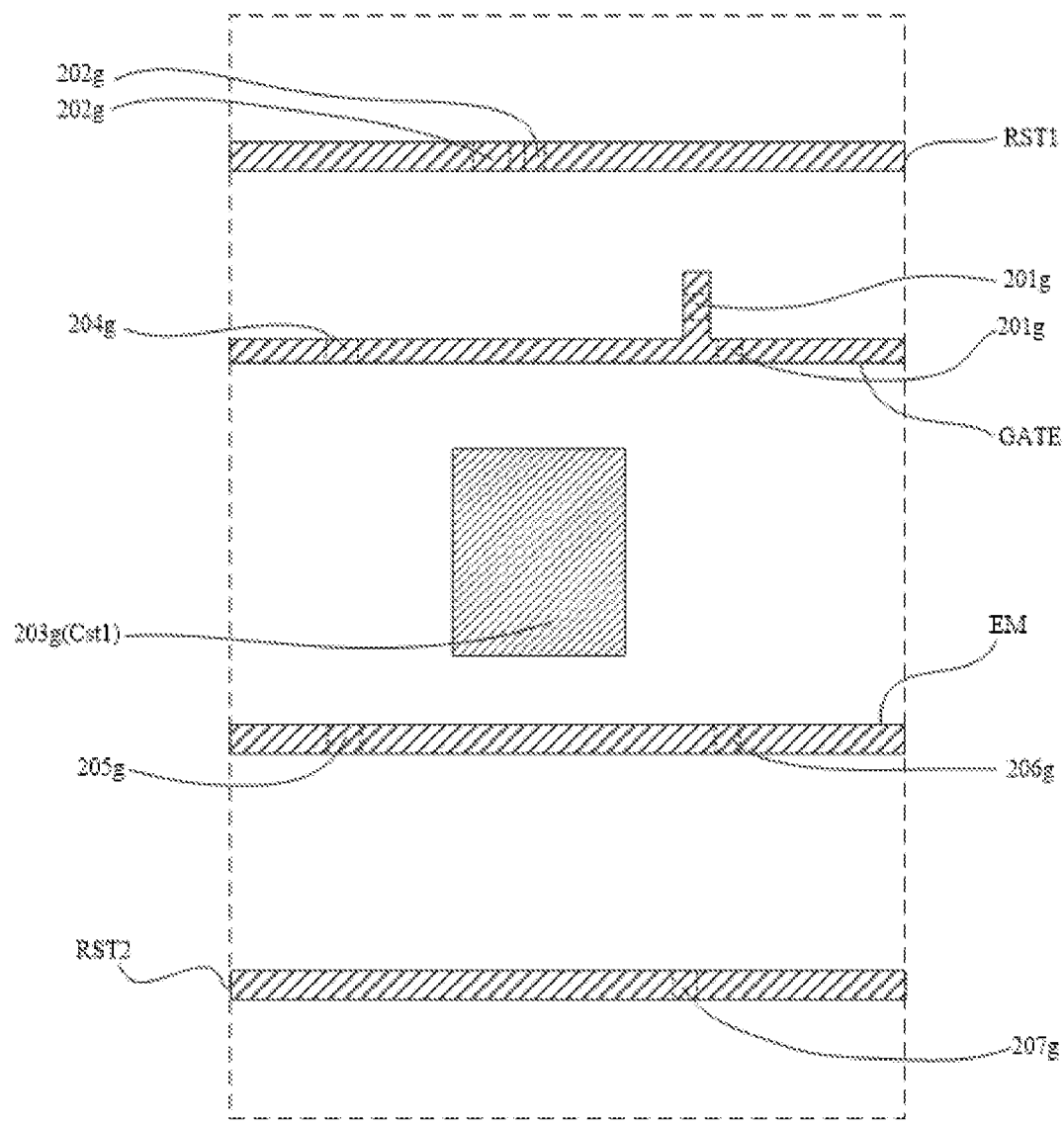
FIG. 5 is a schematic diagram of a first layout of a first gate metal layer provided by an embodiment of the disclosure.

As shown in FIG. 5, the first gate metal layer is used to form the gate electrodes of various transistors in the sub-pixel driving circuit (for example: 201g-207g), and the gate line pattern GATE, the light emitting control signal line pattern EM, the first reset signal line pattern RST1 and a second reset signal line pattern RST2 included in the display substrate. The gate electrode 203g of the third transistor T3 in each sub-pixel driving circuit is multiplexed as the first plate Cst1 of the storage capacitor Cst in the sub-pixel driving circuit.

Figure 6:
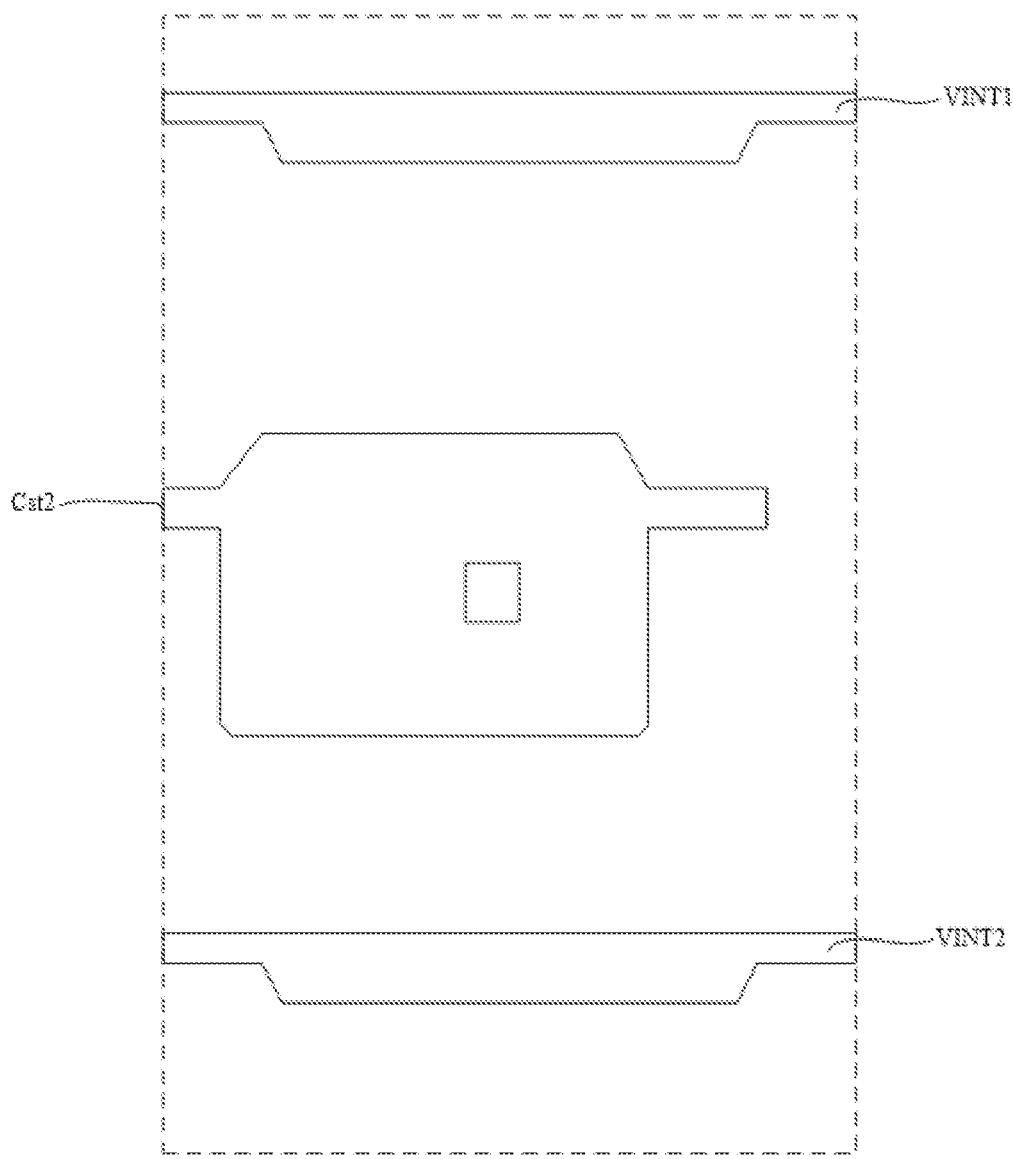
FIG. 6 is a schematic diagram of a first layout of a second gate metal layer provided by an embodiment of the disclosure.

As shown in FIG. 6, the second gate metal layer is used to form the second plate Cst2 of the storage capacitor Cst, and the first initialization signal line pattern VINT1 and the second initialization signal line pattern VINT2 included in the display substrate.

Figure 7:
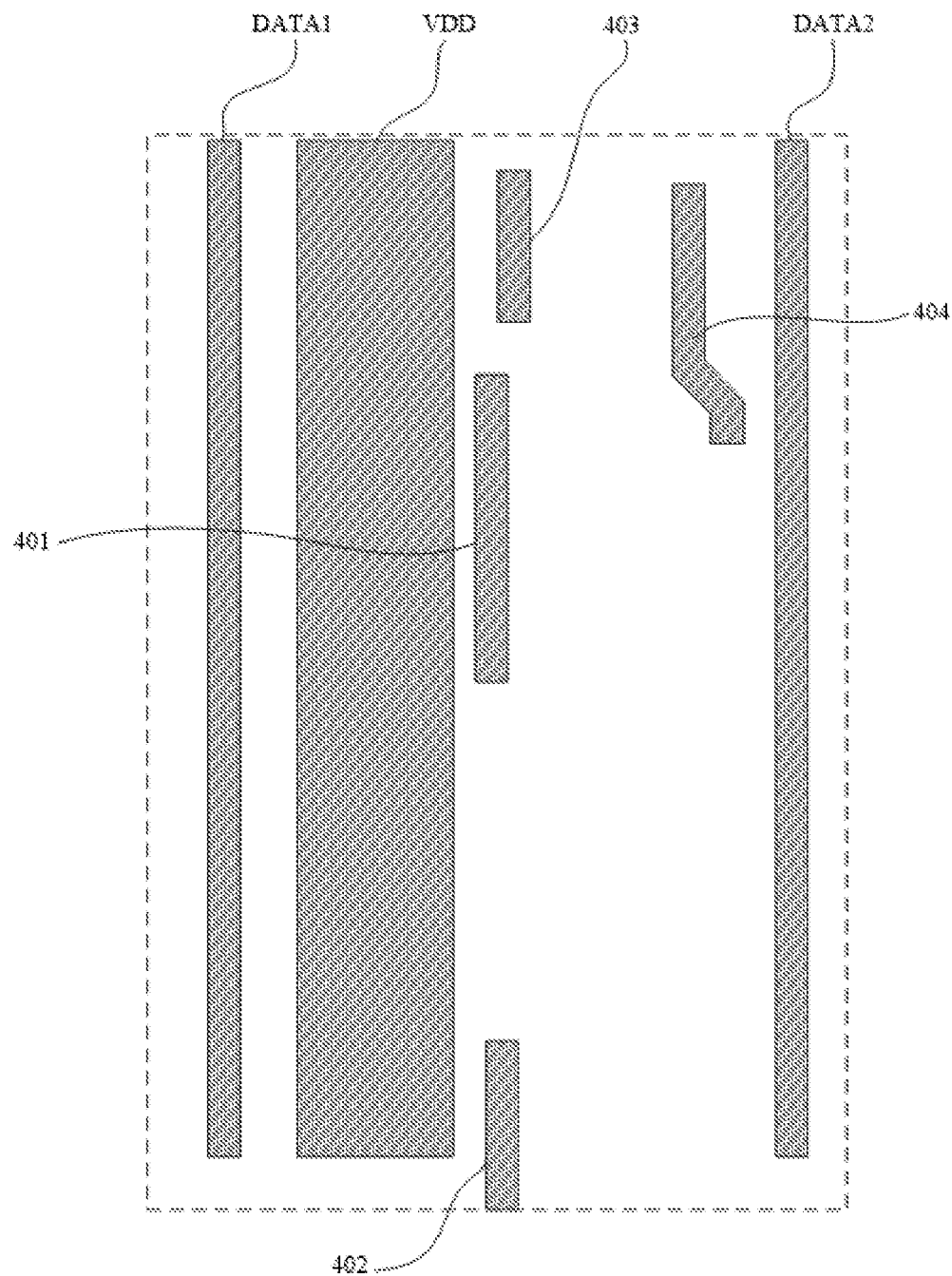
FIG. 7 is a schematic diagram of a first layout of a source-drain metal layer provided by an embodiment of the disclosure.

As shown in FIGS. 1, 3 and 7, the first source-drain metal layer is used to form the source electrodes (such as: S1-S7) and drain electrodes (such as: D1-D7) of various transistors in the sub-pixel driving circuit, and data line patterns (such as DATA1 and DATA2) and power signal line patterns VDD included in the display substrate.

In more details, referring to FIGS. 3 and 7 to 10, the gate electrode 201g of the first transistor T1 covers the first channel region 101pg, and the source electrode S1 of the first transistor T1 is located in the first source formation region 101ps, the drain electrode D1 of the first transistor T1 is located in the first drain formation region 101pd.

The gate electrode 202g of the second transistor T2 covers the second channel region 102pg, the source electrode S2 of the second transistor T2 is located in the second source formation region 102ps, and the drain electrode D2 of the second transistor T2 is located in the second drain formation region 102pd.

The gate electrode 203g of the third transistor T3 covers the third channel region 103pg, the source electrode S3 of the third transistor T3 is located in the third source formation region 103ps, and the drain electrode D3 of the third transistor T3 is located in the third drain formation region 103pd.

The gate electrode 204g of the fourth transistor T4 covers the fourth channel region 104pg, the source electrode S4 of the fourth transistor T4 is located in the fourth source formation region 104ps, and the drain electrode D4 of the fourth transistor T4 is located in the fourth drain formation region 104pd.

The gate electrode 205g of the fifth transistor T5 covers the fifth channel region 105pg, the source electrode S5 of the fifth transistor T5 is located in the fifth source formation region 105ps, and the drain electrode D5 of the fifth transistor T5 is located in the fifth drain formation region 105pd.

The gate electrode 206g of the sixth transistor T6 covers the sixth channel region 106pg, the source electrode S6 of the sixth transistor T6 is located in the sixth source formation region 106ps, and the drain electrode D6 of the sixth transistor T6 is located in the sixth drain formation region 106pd.

The gate electrode 207g of the seventh transistor T7 covers the seventh channel region 107pg, the source electrode S7 of the seventh transistor T7 is located in the seventh source formation region 107ps, and the drain electrode D7 of the seventh transistor T7 is located in the seventh drain formation region 107pd.

The gate electrode 203g of the third transistor T3 is multiplexed as the first plate Cst1 of the storage capacitor Cst, and the second plate Cst2 of the storage capacitor Cst is coupled to the power signal line pattern VDD.

It should be noted that the connecting lines 401, 402, and 403 in FIG. 1 are all formed by the first source-drain metal layer, and the specific layout is shown in FIGS. 3 and 7. The first capacitor C1 in FIG. 1 is a parasitic capacitor. As shown in FIG. 3, there is an overlap region between the orthographic projection of the second plate Cst2 of the storage capacitor Cst on the substrate and the orthographic projection of a part of the fourth drain formation region 104pd extended downward corresponding to the fourth transistor T4 on the substrate, and the overlap region is formed as the first capacitor C1.

In addition, the plurality of sub-pixels included in the display substrate provided by the present disclosure may be arranged in an array, and the plurality of sub-pixels may be divided into multiple rows of sub-pixels and multiple columns of sub-pixels, and each row of sub-pixels include a plurality of sub-pixels arranged in the second direction, each column of sub-pixels include a plurality of sub-pixels arranged in a first direction, the first direction intersects the second direction; the gate line pattern GATE, the first reset signal line pattern RST1, the first initialization signal line pattern VINT1, the light emitting control signal line pattern EM, the second reset signal line pattern RST2, and the second initialization signal line pattern VINT2 included in the sub-pixel may all extend in the second direction; the data line pattern DATA and the power supply signal line pattern VDD included in the sub-pixel both extend in the first direction.

The gate line pattern GATE located in the same row can be formed as a gate line of an integrated structure, the first reset signal line pattern RST1 located in the same row can be formed as a first reset signal line of an integrated structure, and the first initialization signal line pattern VINT1 located in the same row can be formed as a first initialization signal line of an integrated structure, the light emitting control signal line pattern EM in the same row can be formed as a light emitting control signal line of an integrated structure, and the second reset signal line pattern RST2 in the same row can be formed a second reset signal line of an integrated structure, and the second initialization signal line pattern VINT2 in the same row may be formed as a second initialization signal line of an integrated structure. The data line pattern DATA located in the same column can be formed as a data line of an integrated structure, and the power signal line pattern VDD located in the same column can be formed as a power signal line of an integrated structure.

In order to simplify the layout space of sub-pixels, the second reset signal line corresponding to one row of sub-pixels can be multiplexed as the first reset signal line corresponding to an adjacent next row of sub-pixels; similarly, the second initialization signal line corresponding to one row of sub-pixels can be multiplexed as the first initialization signal line corresponding to the adjacent next row of sub-pixels.

As shown in FIG. 3, in some embodiments, taking the sub-pixel driving circuit included in one sub-pixel as an example, in the first direction (such as the Y direction), the gate electrode 204g of the fourth transistor T4, the gate electrode 201g of the first transistor T1, and the gate electrode 202g of the second transistor T2 are all located on the first side of the gate electrode of the driving transistor (i.e., the gate electrode 203g of the third transistor T3), the gate electrode of the seventh transistor T7 and the gate electrode 206g of the sixth transistor T6 and the gate electrode of the fifth transistor T5 are all located on the second side of the gate electrode of the driving transistor.

Exemplarily, the first side and the second side of the gate electrode of the driving transistor are opposite sides of the gate electrode of the driving transistor in the first direction. Further, the first side of the gate electrode of the driving transistor may be the upper side of the gate electrode of the driving transistor, the second side of the gate electrode of the driving transistor may be the lower side of the gate electrode of the driving transistor T1. The lower side, for example, the side of the display substrate for bonding the IC is the lower side of the display substrate, and the lower side of the gate electrode of the driving transistor is the side of the gate electrode of the driving transistor close to the IC. The upper side is the opposite side of the lower side, for example, the side of the gate electrode of the driving transistor away from the IC.

In some embodiments, as shown in FIG. 3, in the second direction (such as the X direction), the gate electrode 204g of the fourth transistor T4 and the gate electrode 205g of the fifth transistor T5 are both located at the third side of the gate electrode of the driving transistor. The gate electrode 201g of the first transistor T1 and the gate electrode 206g of the sixth transistor T6 are both located on the fourth side of the gate electrode of the driving transistor T1. Exemplarily, the third side and the fourth side of the gate electrode of the driving transistor are opposite sides of the gate electrode of the driving transistor in the second direction X. Further, the third side of the gate electrode of the driving transistor may be the left side of the gate electrode of the driving transistor and the fourth side of the gate electrode of the driving transistor may be the right side of the gate electrode of the driving transistor. The left and right sides, for example, in the same sub-pixel, the first data line pattern DATA1 is located on the left side of the power signal line pattern VDD, and the power signal line pattern VDD is located on the right side of the first data line pattern DATA1.

Figure 8:
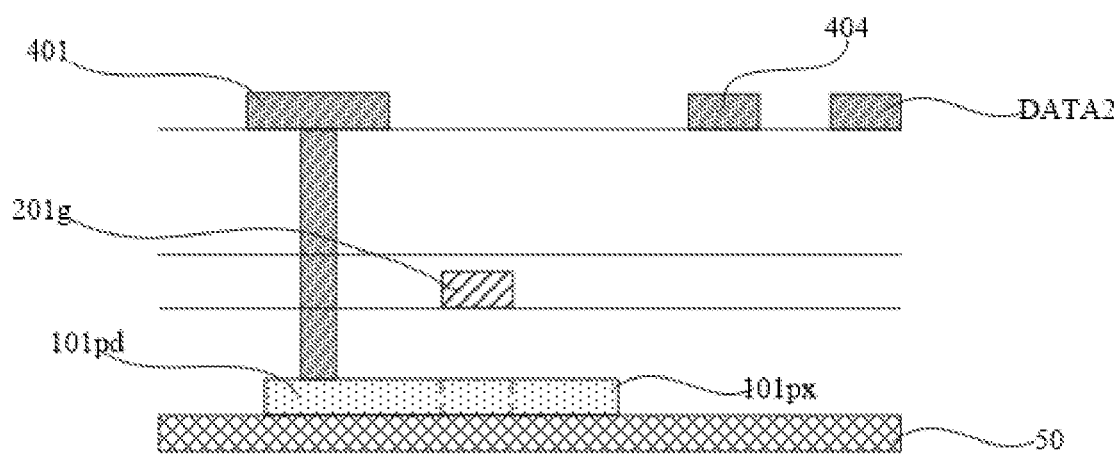
FIG. 8 is a schematic cross-sectional view along the direction A1-A2 in FIG. 3.

Referring to FIGS. 3 and 8, an embodiment of the present disclosure provides a display substrate, which includes: a substrate 50 and a plurality of sub-pixels arranged in an array on the substrate 50; the sub-pixels include: a data line pattern extending along the first direction (DATA1 in FIG. 3); an initialization signal line pattern (VINT1 in FIG. 3), wherein the initialization signal line pattern includes a portion extending in a second direction, the second direction intersects the first direction, and the initialization signal line pattern is used to transmit the initialization signal with a fixed potential; and a sub-pixel driving circuit, the sub-pixel driving circuit includes: a driving transistor (T3 in FIG. 3), a first transistor T1 coupled to the gate electrode of the driving transistor, and a first shielding component 404 coupled to the initialization signal line pattern, the orthographic projection of the first shielding component 404 on the substrate 50 is arranged between the orthographic projection of the first transistor T1 on the substrate 50 and the orthographic projection of the target data line pattern (DATA2 in FIG. 3) on the substrate 50; a next sub-pixel adjacent to the sub-pixel along the second direction includes the target data line pattern.

Specifically, the above-mentioned display substrate generally includes a plurality of sub-pixels arranged in an array, and each sub-pixel includes: a data line pattern (DATA1 in FIG. 3) extending in a first direction, and an initialization signal line pattern (VINT1 in FIG. 3) at least partially extending in a second direction; the data line pattern is used to transmit a data signal, and the initialization signal line pattern is used to transmit an initialization signal with a fixed potential; exemplary, the first direction includes the Y direction, the second direction includes the X direction.

The target data line pattern is a data line pattern included in the next sub-pixel adjacent to the current sub-pixel along the second direction.

Each sub-pixel also includes a sub-pixel driving circuit and a light emitting element corresponding to the sub-pixel driving circuit in a one-to-one way. The light emitting element includes an anode, an organic light emitting material layer, and a cathode that are stacked, wherein the anode of the light emitting element is coupled to the corresponding sub-pixel driving circuit, and the light emitting element emits light under the driving of the driving signal provided by the sub-pixel driving circuit.

In more details, as shown in FIGS. 1, 3, and 4, taking the sub-pixel driving circuit including the above-mentioned 7T1C as an example, the gate electrode 203g of the third transistor T3 (that is, the driving transistor) is connected to the drain electrode D1 of the transistor T1 through the connecting line 401, and the drain electrode D3 of the third transistor T3 is coupled to the source electrode S1 of the first transistor T1. Along the X direction, distance between the orthographic projection of the first channel region 101pg of the first transistor T1 on the substrate 50 and the orthographic projection of the target data line pattern (DATA2 in FIG. 3) on the substrate 50 is a minimum distance, which is smaller than the distance between the orthographic projection of the third channel region 103pg of the third transistor T3 on the substrate 50 and the orthographic projection of the target data line pattern on the substrate 50. The minimum distance between orthographic projection of the above-mentioned channel regions (such as the first channel region 101pg and the third channel region 103pg) on the substrate 50 and the orthographic projections of the target data line pattern (DATA2 in FIG. 3) on the substrate 50 means the minimum distance between the boundary of the orthographic projection of the above-mentioned channel regions on the substrate 50 closest the target data line pattern and the orthographic projection of the target data line pattern on the substrate 50.

In the sub-pixel driving circuit of the above structure, when the data signal transmitted by the target data line pattern changes, it will affect the performance of the first transistor T1. Since the first transistor T1 is coupled to the third transistor T3 through the connection line 401, which further affects the performance of the third transistor T3.

In the embodiment of the present disclosure, a first shielding component 404 coupled to the initialization signal line pattern (VINT1 in FIG. 3) is provided in the sub-pixel driving circuit, so that the first shielding component 404 has the same fixed potential as the initialization signal. The orthographic projection of the first shielding component 404 on the substrate 50 is arranged between the orthographic projection of the first transistor T1 on the substrate 50 and the orthographic projection of the target data line pattern (DATA2 in FIG. 3) on the substrate 50, so that the first shielding component 404 can reduce the influence of the signal transmitted on the target data line pattern on the performance of the first transistor T1, thereby reducing the influence of the coupling between the gate electrode (203g) of the driving transistor and the target data line pattern, avoiding the problem of vertical crosstalk, so that the display substrate can obtain a better display effect.

In addition, the above coupling of the first shielding component 404 with the initialization signal line pattern not only makes the first shielding component 404 have a fixed potential, but also realizes the enhancement of the voltage of the initialization signal line pattern, so that the voltage of the initialization signal transmitted on the initialization signal line pattern is more stable, which improves working performance of the sub-pixel driving circuit.

In addition to coupling the first shielding component 404 to the initialization signal line pattern, the first shielding component 404 may also be coupled to the power supply signal line pattern VDD included in the sub-pixel, so that the first shielding component 404 has the same fixed potential as the power signal transmitted by the power signal line pattern VDD.

The above method of coupling the first shielding component 404 to the power signal line pattern VDD can ensure that the first shielding component 404 has a fixed potential, but it will increase the parasitic capacitance generated by the power signal line pattern VDD, which makes the RC load of the power signal line pattern VDD larger, which is not conducive to reducing the vertical crosstalk phenomenon.

As shown in FIG. 3, in some embodiments, the gate electrode 201g of the first transistor T1 and the gate line pattern GATE are an integrated structure, and the gate electrode 201g of the first transistor T1 is a portion of the integrated structure that forms an overlapping area with the active film layer in a direction perpendicular to the substrate.

As shown in FIG. 3, in some embodiments, the plurality of sub-pixels include multiple rows of sub-pixels, and each row of sub-pixels includes a plurality of the sub-pixels arranged along the second direction. The initialization signal line patterns of the same row are sequentially coupled to form the initialization signal line corresponding to the row of sub-pixels; the first shielding component 404 extends along the first direction and is coupled to at least one initialization signal line.

Specifically, the multiple sub-pixels may be divided into multiple rows of sub-pixels and multiple columns of sub-pixels, each row of sub-pixels includes multiple sub-pixels arranged in the second direction, and each column of sub-pixels includes multiple sub-pixels arranged in the first direction, the first direction and the second direction intersect to each other; the initialization signal line patterns located in the same row of sub-pixels are sequentially coupled to form an initialization signal line corresponding to the row of sub-pixels.

The above arrangement of the first shielding component 404 extending along the first direction and being coupled to at least one of the initialization signal lines enables the first shielding component 404 to reduce the effect of the change of signals transmitted on the target data line pattern to the performance of the first transistor T1, thereby reducing the impact of the coupling between the gate electrode of the driving transistor (203g) and the target data line pattern, reducing the problem of vertical crosstalk, so that the display substrate can have a better display effect. Moreover, the voltage of the initialization signal line is enhanced, so that the voltage of the initialization signal transmitted on the initialization signal line is more stable, which is more conducive to the working performance of the sub-pixel driving circuit.

Figure 9:
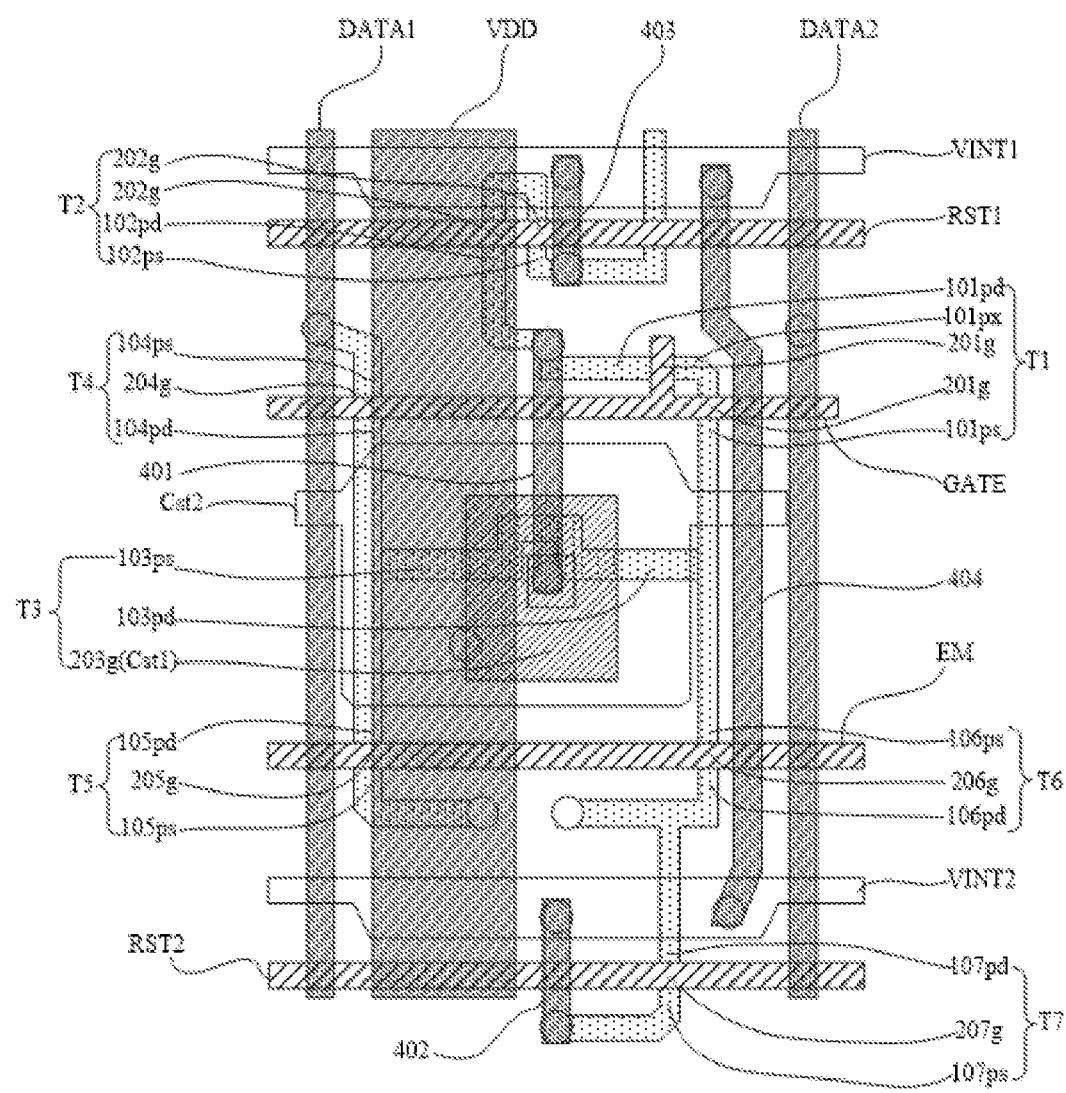
FIG. 9 is a schematic diagram of a second layout of a sub-pixel driving circuit in a display substrate provided by an embodiment of the disclosure.

As shown in FIG. 9, in some embodiments, the first shielding component 404 is coupled to the two adjacent initialization signal lines.

Specifically, when the first shielding component 404 is set to be coupled to the initialization signal line, the coupling mode of the first shielding component 404 and the initialization signal line, and specific structures and arrangements of the first shielding component 404 are various. Illustratively, as shown in FIG. 3, the first shielding component 404 can be set to be coupled to two adjacent initialization signal lines respectively; this arrangement not only makes the orthographic projection of the first shielding component 404 on the substrate 50 to be located between the orthographic projection of the first transistor T1 on the substrate 50 and the orthographic projection of the target data line pattern on the substrate 50, but also makes the orthographic projection of the first shielding component 404 on the substrate 50 to be located between the orthographic projection of the connecting line 401 on the substrate 50 and the orthographic projection of the target data line pattern on the substrate 50. At the same time, the orthographic projection of the first shielding component 404 on the substrate 50 can be located between the orthographic projection of the driving transistor (the third transistor T3) on the substrate 50 and the orthographic projections of the target data line on the substrate 50.

The above-mentioned arrangement greatly reduces a first crosstalk generated between the target signal line pattern and the first transistor T1, and a second crosstalk generated between the target signal line pattern and the connecting line 401, thereby reducing an indirect crosstalk to the driving transistor caused by the first crosstalk and the second crosstalk. In addition, the above arrangement also reduces the direct crosstalk between the target signal line pattern and the driving transistor, thereby ensuring the working performance of the display substrate.

Referring to FIG. 3, in some embodiments, the first shielding component 404 and the initialization signal line pattern (VINT1 in FIG. 3) are arranged in different layers, and there is a first overlap region between the orthographic projection of the first shielding component 404 on the substrate 50 and the orthographic projection of the initialization signal line pattern on the substrate, and the first shielding component 404 is coupled with the initialization signal line pattern through the first via hole arranged in the first overlap region.

Specifically, the first shielding component 404 and the initialization signal line pattern can be arranged in the same layer or in different layers. When the first shielding component 404 and the initialization signal line pattern are arranged in different layers, there is an overlap region between the orthographic projection of the first shielding component 404 on the substrate 50 and the orthographic projection of the initialization signal line pattern on the substrate 50, so that the first shielding component 404 is coupled with the initialization signal line by the via hole arranged in the first overlap region.

It should be noted that "the first shielding component 404 and the initialization signal line pattern are arranged in the same layer" includes at least one of: the first shielding component 404 and the initialization signal line pattern are located on the same horizontal plane; the first shield component 404 and the initialization signal line pattern are located in the same film layer; the first shielding component 404 and the initialization signal line pattern are both disposed on a surface of the same insulating layer away from the substrate; and the first shielding component 404 and the initialization signal line pattern is formed by a single patterning process.

The above "the first shielding component 404 and the initialization signal line pattern are arranged in different layers" includes at least one of: the first shielding component 404 and the initialization signal line pattern are not located in the same film layer; the first shielding component 404 and the initialization signal line pattern cannot be formed by a single patterning process.

In some embodiments, the first shielding component 404 and the data line pattern (DATA1 in FIG. 3) can be made of the same material.

In some embodiments, it may be provided that the display substrate includes a first interlayer insulating layer, and the first shielding component 404 and the data line pattern (DATA1 in FIG. 3) are both located in a surface of the first interlayer insulating layer away from the substrate.

Specifically, the first shielding component 404 is arranged in the above-mentioned manner, so that the first shielding component 404 and the data line pattern can be simultaneously formed on the surface of the first interlayer insulating layer away from the substrate through a single patterning process, so as to avoid adding an additional patterning process for manufacturing the first shielding component 404, thereby simplifying the manufacturing process of the display substrate and saving the manufacturing cost.

As shown in FIG. 3, in some embodiments, the sub-pixel driving circuit further includes a second transistor T2 coupled to the gate electrode of the driving transistor. The second transistor T2 includes: a first semiconductor pattern, a second semiconductor pattern, and a third conductor pattern respectively coupled to the first semiconductor pattern and the second semiconductor pattern, the conductivity of the third conductor pattern is better than that of the first semiconductor pattern and that of the second semiconductor pattern; a first gate pattern and a second gate pattern that are coupled to each other, and the orthographic projection of the first gate pattern on the substrate 50 partially overlaps the orthographic projection of the first semiconductor pattern on the substrate 50, the orthographic projection of the second gate pattern on the substrate 50 partially overlaps the orthographic projection of the second semiconductor pattern on the substrate 50; the orthographic projection of the third conductor pattern on the substrate 50, the orthographic projection of the first gate pattern on the substrate 50, and the orthographic projection of the second gate pattern on the substrate 50 do not overlap to each other; the orthographic projection of the third conductor pattern on the substrate 50 at least partially overlaps the orthographic projection of the initialization signal line pattern (VINT1 in FIG. 3) on the substrate 50.

Specifically, as shown in FIG. 7, the second transistor T2 has a double-gate structure, and the first semiconductor pattern and the second semiconductor pattern included in the second transistor T2 form the channel region of the second transistor T2 (corresponding to 102pg in the FIG. 7), the third conductor pattern 102px included in the second transistor T2 has a better conductivity than those of first semiconductor pattern and the second semiconductor pattern due to the doping. The first gate pattern and the second gate pattern included in the second transistor T2 cover the first semiconductor pattern and the second semiconductor pattern in a one-to-one correspondence, and can serve as the gate electrode 202g of the second transistor T2 together.

In the second transistor T2 of the above-mentioned structure, since the third conductive pattern 102px has good conductivity and is not covered by the gate pattern, it is easy to couple with other conductive patterns in the vicinity thereof, thereby causing crosstalk. In the technical solution provided by the embodiment, by setting the orthographic projection of the third conductor pattern on the substrate 50 at least partially overlapping the orthographic projection of the initialization signal line pattern (VINT1 in FIG. 3) on the substrate 50, so that the initialization signal line pattern can cover the third conductor pattern 102px. Since an initialization signal with a fixed potential is transmitted in the initialization signal line pattern, the coupling effect between the third conductive pattern 102px and other conductive patterns in the vicinity thereof is reduced, thereby making the work performance of the display substrate more stable.

As shown in FIG. 4, in some embodiments, the sub-pixel driving circuit further includes a first extension part extending from the first semiconductor pattern, and the conductivity of the first extension part is better than that of the first semiconductor pattern. The first extension part includes a first portion 61, a second portion 62 and a third portion 63, the first portion 61 and the third portion 63 extend along the first direction, the second portion 62 extends in the second direction, one end of the second portion 62 is coupled to the first portion 61, and the other end of the second portion 62 is coupled to the third portion 63; one end of the third portion 63 away from the second portion 62 is coupled to the first transistor T1.

Specifically, the first extension portion and the first semiconductor pattern can be manufactured in a single patterning process, and after the first semiconductor pattern is formed, the first extension part is doped so that the conductivity of the first extension part is better than that of the first semiconductor pattern.

After the first shielding component 404 is added, the first extension part is set to have the above structure, so that when the second transistor T2 is coupled to gate electrodes of the first transistor T1 and the driving transistor through the first extension part, respectively, the impact of the signal change transmitted on the target data line pattern on the performance of the first transistor T1 and the performance of the second transistor T2 is reduced, thereby reducing the impact of the coupling between the gate electrode of the driving transistor (203g) and the target data line pattern, avoiding the problem of vertical crosstalk, so that the display substrate can obtain a better display effect.

As shown in FIGS. 3 and 4, in some embodiments, the first transistor T1 includes: a fourth semiconductor pattern, a fifth semiconductor pattern, and a sixth conductor pattern respectively coupled to the fourth semiconductor pattern and the fifth semiconductor pattern, the conductivity of the sixth conductor pattern is better than that of the fourth semiconductor pattern and that of the fifth semiconductor pattern; a third gate pattern and a fourth gate pattern that are coupled to each other, and the orthographic projection of the third gate pattern on the substrate 50 partially overlapping the orthographic projection of the fourth semiconductor pattern on the substrate 50, the orthographic projection of the fourth gate pattern on the substrate 50 partially overlapping the orthographic projection of the fifth semiconductor pattern on the substrate 50; the orthographic projection of the sixth conductor pattern on the substrate 50 not overlapping the orthographic projection of the third gate pattern on the substrate 50, and the orthographic projection of the fourth gate pattern on the substrate 50.

Specifically, as shown in FIG. 4, the first transistor has a double gate structure, and the fourth semiconductor pattern and the fifth semiconductor pattern included in the first transistor form the channel region of the first transistor (corresponding to 101pg in FIG. 4), the sixth conductor pattern 101px included in the first transistor has a better conductivity than those of the fourth semiconductor pattern and the fifth semiconductor pattern due to doping. The third gate pattern and the fourth gate pattern included in the first transistor cover the fourth semiconductor pattern and the fifth semiconductor pattern in a one-to-one correspondence, and can serve as the gate electrode 201g of the first transistor T1 together.

Figure 10:
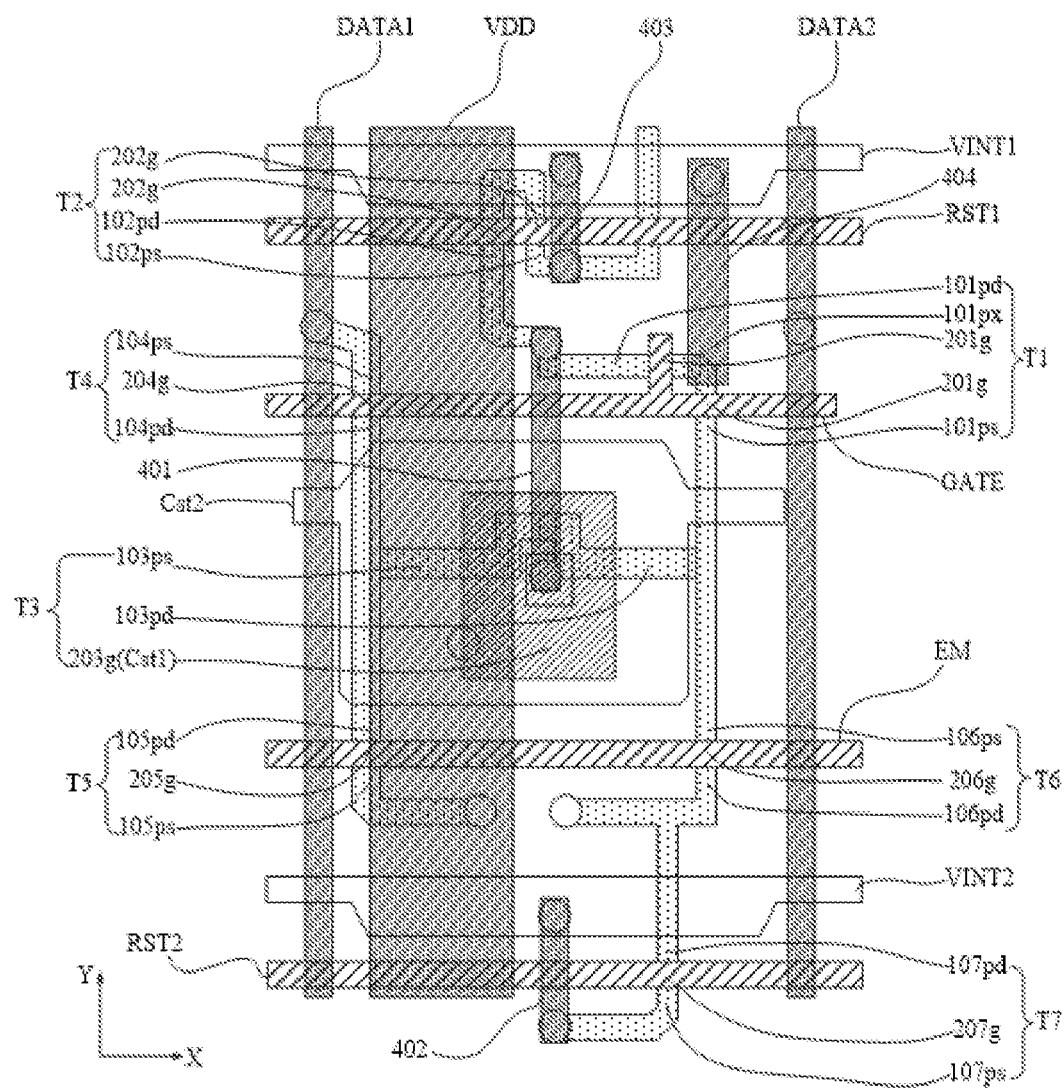
FIG. 10 is a schematic diagram of a third layout of a sub-pixel driving circuit in a display substrate provided by an embodiment of the disclosure.

As shown in FIG. 10, in some embodiments, the orthographic projection of the first shielding component 404 on the substrate 50 at least partially overlaps the orthographic projection of the sixth conductor pattern 101px on the substrate 50.

Specifically, in the first transistor T1 having the above-mentioned structure, since the sixth conductor pattern 101px has good conductivity and is not covered by the gate pattern, it is easy to couple to other conductive patterns in vicinity thereof, thereby causing crosstalk. In the technical solution provided by the embodiment, the orthographic projection of the first shielding component 404 on the substrate 50 at least partially overlap the orthographic projection of the sixth conductor pattern 101px on the substrate 50, so that the first shielding component 404 can cover the sixth conductor pattern 101px, and because the first shielding component 404 has a fixed potential, the coupling effect between the sixth conductor pattern 101px and other conductor patterns in vicinity thereof are reduced, thereby making the working performance of the display substrate more stable.

Figure 11:
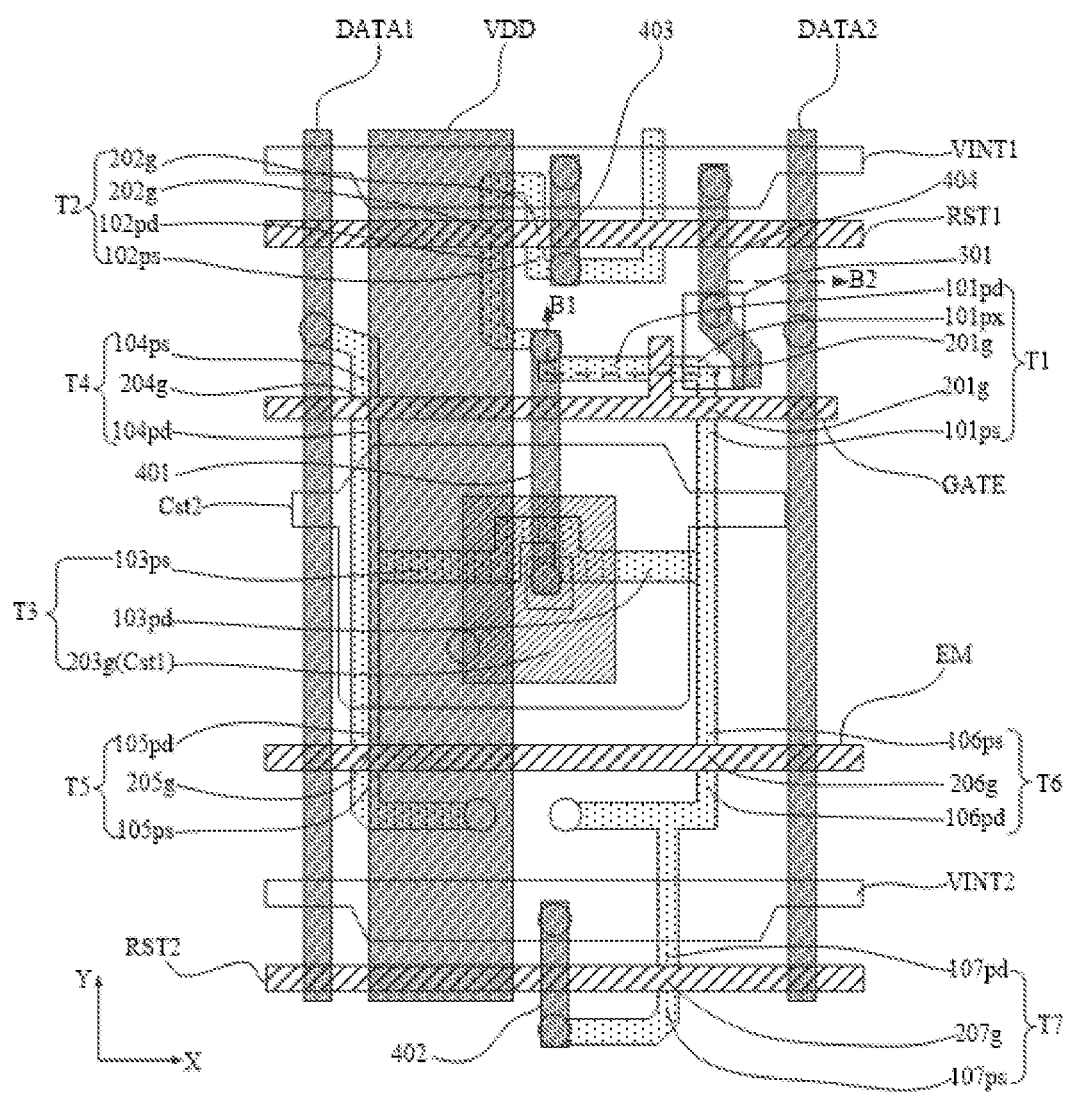
FIG. 11 is a schematic diagram of a fourth layout of a sub-pixel driving circuit in a display substrate provided by an embodiment of the disclosure.
Figure 12:
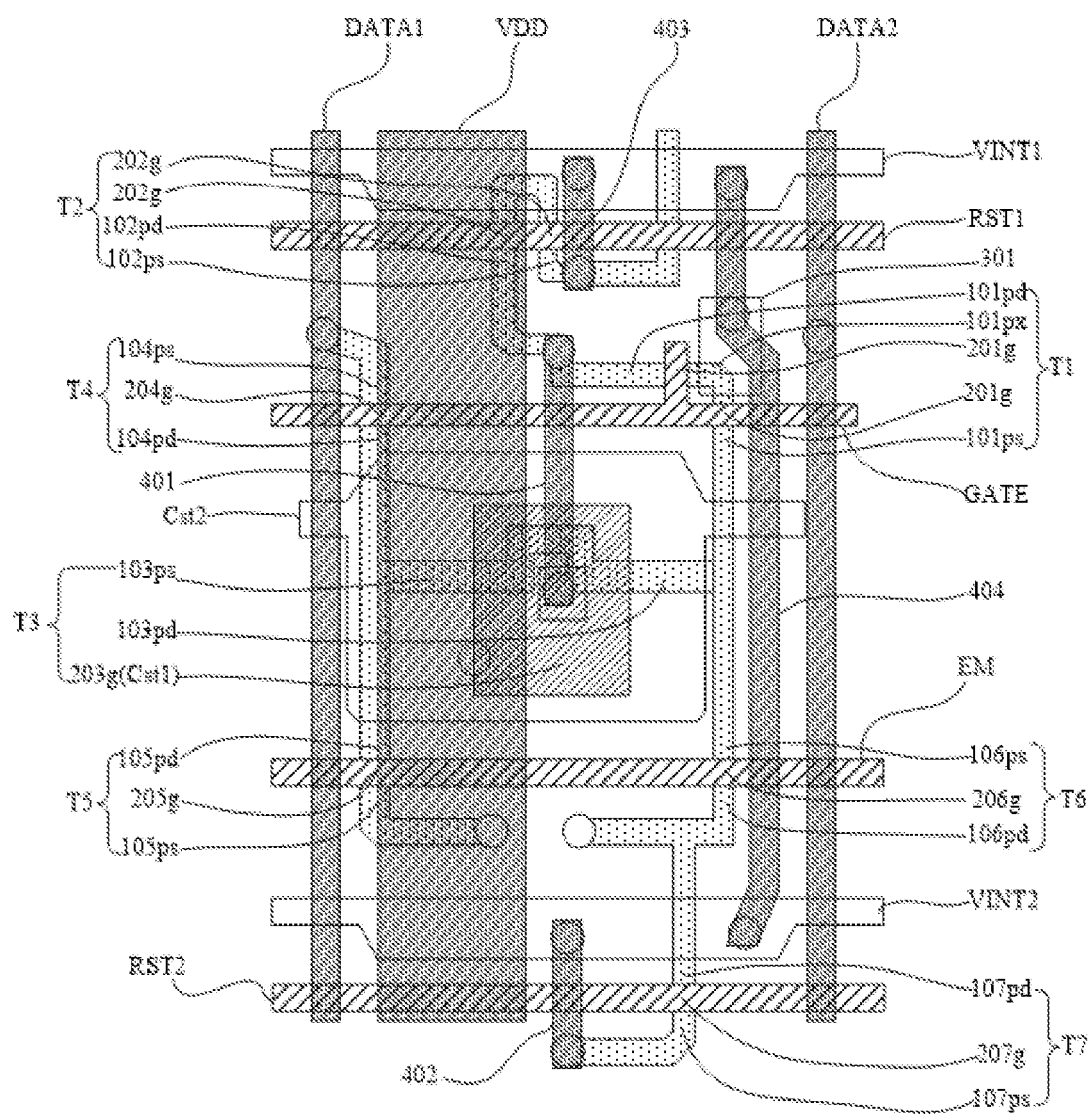
FIG. 12 is a schematic diagram of a fifth layout of a sub-pixel driving circuit in a display substrate provided by an embodiment of the disclosure.
Figure 13:
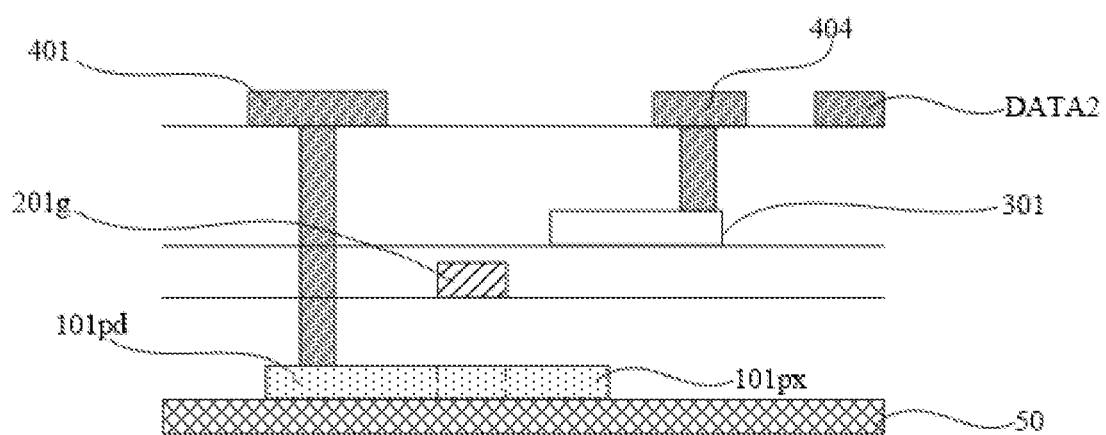
FIG. 13 is a schematic cross-sectional view along the direction B1-B2 in FIG. 11.

As shown in FIGS. 11, 12 and 13, in some embodiments, the sub-pixel driving circuit further includes: a second shielding component 301 coupled to the first shielding component 404, and the orthographic projection of the second shielding component 301 on the substrate 50 at least partially overlap the orthographic projection of the sixth conductor pattern 101px on the substrate 50.

Specifically, the orthographic projection of the second shielding component 301 on the substrate 50 at least partially overlap the orthographic projection of the sixth conductor pattern 101px on the substrate 50, so that the second shielding component 301 can cover the sixth conductor pattern 101px, and since the second shielding component 301 is coupled to the first shielding component 404, the second shielding component 301 has a fixed potential, thereby reducing the coupling effect between the sixth conductor pattern 101px and other conductive patterns in vicinity thereof is reduced, thereby making the working performance of the display substrate more stable.

Therefore, in the display substrate provided by the above-mentioned embodiment, since the first shielding component 404 and the second shielding component 301 both have fixed potential, a parasitic capacitance is avoided or reduced between the first transistor T1 and the target data line pattern (DATA2), which effectively prevents or reduces vertical crosstalk defects.

Further, the orthographic projection of the second shielding component 301 on the substrate 50 can be arranged to cover all of the orthographic projection of the sixth conductor pattern on the substrate 50.

Specifically, the orthographic projection of the second shielding component 301 on the substrate 50 is arranged to cover all of the orthographic projection of the sixth conductor pattern 101px on the substrate 50, so that the second shielding component 301 can completely cover the sixth conductor pattern 101px, thereby minimizing the coupling effect between the sixth conductor pattern 101px and other conductive patterns in vicinity thereof, and improving the working stability of the display substrate.

In some embodiments, the second shielding component 301 and the first shielding component 404 are arranged in different layers, and there is a second overlap region between the orthographic projection of the second shielding component 301 on the substrate 50 an the orthographic projection of the first shielding component 404 on the substrate 50, and the second shielding component 301 and the first shielding component 404 are coupled through a second via provided in the second overlap region.

Specifically, the second shielding component 301 and the first shielding component 404 can be arranged in the same layer or in different layers. When the second shielding component 301 and the first shielding component 404 are arranged in different layers, there is a second overlap region between the orthographic projection of the second shielding component 301 on the substrate 50 and the orthographic projection of the first shielding component 404 on the substrate 50. In this way, a second via hole is provided in the second overlap region so that the second shielding component 301 and the first shielding component 404 can be coupled through the second via hole.

In some embodiments, the second shielding component 301 and the initialization signal line pattern may be made of the same material.

In some embodiments, the display substrate further includes a second interlayer insulating layer, and the second shielding component 301 and the initialization signal line pattern (VINT1 in FIG. 3) are both located on a surface of the second interlayer insulating layer away from the substrate.

Specifically, as described above, the second shielding component 301 and the initialization signal line pattern are made of the same material, and the second shielding component 301 and the initialization signal line pattern (VINT1 in FIG. 3) are both located at the surface of the second interlayer insulating layer away from the substrate, so that the second shielding component 301 and the initialization signal line pattern can be formed at the same time in the same patterning process, thereby avoiding an additional dedicated manufacturing process for the second shielding component 301, simplifying the manufacturing process of the display substrate and saving the production cost.

As shown in FIG. 3, in some embodiments, the sub-pixel further includes a power signal line pattern VDD, the power signal line pattern VDD includes a portion extending along the first direction, and the sub-pixel driving circuit further includes a storage capacitor Cst, the first plate Cst1 of the storage capacitor Cst is multiplexed as the gate electrode of the driving transistor, and the second plate Cst2 of the storage capacitor Cst is coupled to the power signal line pattern VDD, the second plate Cst2 of the storage capacitor Cst is located on the surface of the second interlayer insulating layer away from the substrate.

Specifically, the storage capacitor Cst included in the sub-pixel driving circuit has a first plate Cst1 and a second plate Cst2, the first plate Cst1 and the second plate Cst2 are arranged oppositely, and the first plate Cst1 is coupled to the gate electrode of the driving transistor, and the second plate Cst2 is coupled to the power signal line pattern VDD. When laying out the storage capacitor Cst, the first plate Cst1 can be directly multiplexed as the gate electrode of the driving transistor, which ensures that the storage capacitor Cst is coupled to the gate electrode of the driving transistor, reduces the space occupied by the pixel driving circuit, and improves the resolution of the display substrate. In addition, the second plate Cst2 of the storage capacitor Cst is located on the surface of the second interlayer insulating layer away from the substrate, so that the second plate Cst2 of the storage capacitor Cst, the second shielding components 301 and the initialization signal line pattern are formed at the same time in the same patterning process, which greatly simplifies the manufacturing process of the display substrate and saves the production cost.

Figure 14:
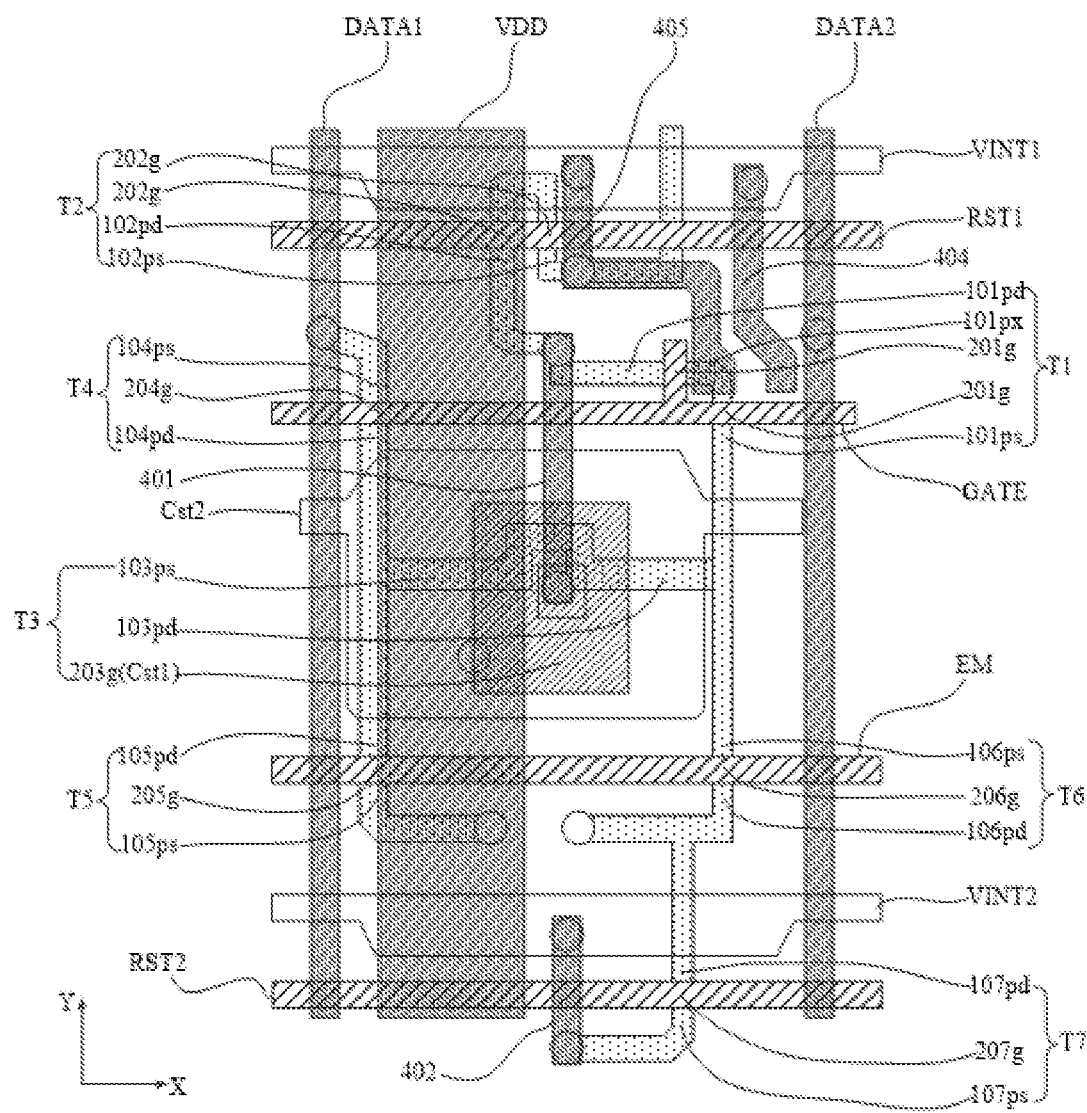
FIG. 14 is a schematic diagram of a sixth layout of a sub-pixel driving circuit in a display substrate provided by an embodiment of the disclosure.

As shown in FIG. 14, in some embodiments, the sub-pixel further includes: a reset signal line pattern (RST1 in FIG. 3) extending in a second direction crossing the first direction, and the sub-pixel driving circuit further includes: a first conductive connection portion 405, the orthographic projection of the first conductive connection portion 405 on the substrate 50 covers at least part of the orthographic projection of the sixth conductor pattern 101px on the substrate 50; a second transistor T2, a first electrode (such as the source electrode S2) of the second transistor T2 is coupled to the initialization signal line pattern (such as VINT1) through the first conductive connection portion 405, and a second electrode (such as the drain electrode D2) of the second transistor T2 is coupled to the gate electrode of the driving transistor, and a gate electrode 202g of the second transistor T2 is coupled to the reset signal line pattern (such as RST1).

Specifically, the first conductive connection portion 405 can be made of a metal material, and can be formed in the same patterning process as the data line pattern.

The orthographic projection of the first conductive connecting portion 405 on the substrate 50 covers at least part of the orthographic projection of the sixth conductor pattern 101px on the substrate 50, so that the first conductive connecting portion 405 can cover the sixth conductor pattern 101px, and since the first conductive connection portion 405 is coupled to the initialization signal line pattern, the first conductive connection portion 405 has a fixed potential, thereby reducing the coupling effect between the sixth conductive pattern 101px and other conductive patterns nearby in a better way and making the working performance of the display substrate more stable.

As shown in FIG. 3, in some embodiments, the sub-pixel further includes: a gate line pattern GATE, a light emitting control signal line pattern EM, a reset signal line pattern (RST1 in FIG. 3), and a power signal line pattern VDD. The gate line pattern GATE, the light emitting control signal line pattern EM, and the reset signal line pattern all extend along the second direction, and the power signal line pattern VDD includes a portion extending along the first direction;

The sub-pixel driving circuit further includes: a second transistor T2, a fourth transistor T4, a fifth transistor T5, a sixth transistor T6, and a seventh transistor T7.

The gate electrode of the driving transistor (such as the gate electrode 203g of the third transistor T3) is coupled to the second electrode of the first transistor T1, and the first electrode of the driving transistor is connected to the second electrode of the fifth transistor T5, the second electrode of the driving transistor is coupled to the first electrode of the first transistor T1.

The gate electrode 201g of the first transistor T1 is coupled to the gate line pattern GATE.

The gate electrode 202g of the second transistor T2 is coupled to the reset signal line pattern, the first electrode of the second transistor T2 is coupled to the initialization signal line pattern, and the second electrode of the second transistor T2 is coupled to the gate electrode of the driving transistor.

The gate electrode 204g of the fourth transistor T4 is coupled to the gate line pattern GATE, the first electrode of the fourth transistor T4 is coupled to the data line pattern (DATA1 in FIG. 3), and the second electrode of the four transistor T4 is coupled to the first electrode of the driving transistor.

The gate electrode 205g of the fifth transistor T5 is coupled to the light emitting control signal line pattern EM, and the first electrode of the fifth transistor T5 is coupled to the power signal line pattern VDD.

The gate electrode 206g of the sixth transistor T6 is coupled to the light emitting control signal line pattern EM, the first electrode of the sixth transistor T6 is coupled to the second electrode of the driving transistor, and the second electrode of the sixth transistor T6 is coupled to the light emitting element in the sub-pixel.

The gate electrode 207g of the seventh transistor T7 is coupled to the reset signal line pattern (such as RST2) included in an adjacent next sub-pixel along the first direction, and the first electrode of the seventh transistor T7 is coupled to the initialization signal line pattern (such as VINT2) included in the next sub-pixel, and the second electrode of the seventh transistor T7 is coupled to the light emitting element in the sub-pixel.

Specifically, in the above-mentioned display substrate, the plurality of sub-pixels may be arranged in an array, and the plurality of sub-pixels may be divided into a plurality of rows of sub-pixels and a plurality of columns of sub-pixels, and each row of sub-pixels includes a plurality of sub-pixels arranged along the second direction, each column of sub-pixels includes a plurality of sub-pixels arranged along a first direction, and the first direction is crossing the second direction.

It should be noted that the above-mentioned adjacent next sub-pixel along the first direction is an adjacent next sub-pixel located in the same column as the seventh transistor T7.

The structure of the sub-pixel and the sub-pixel driving circuit included in the sub-pixel can effectively reduce the layout space occupied by the sub-pixel driving circuit while ensuring the working performance of the sub-pixel driving circuit, which is beneficial to improve the resolution of the display substrate.

It should be noted that gate electrodes of the transistors included in the sub-pixel driving circuit, and the functional patterns coupled to them may be formed as an integral structure. For example, both the gate electrode of the first transistor and the gate electrode of the fourth transistor may form an integrated structure with the corresponding gate line pattern coupled thereto, both the gate electrode of the fifth transistor and the gate electrode of the sixth transistor may form an integrated structure with the corresponding light emitting control signal line pattern coupled thereto, and the gate electrode of the second transistor and the gate electrode of the seventh transistor may form an integrated structure with the reset signal line pattern coupled thereto.

In addition, the first transistor T1 is used for threshold compensation of the driving transistor (such as the third transistor T3), the second transistor T2 is used for resetting the gate electrode of the driving transistor, and the fourth transistor T4 is used for writing the data signal transmitted by the data line pattern, the fifth transistor T5 is used for writing the power signal transmitted by the power signal line pattern to the first electrode of the driving transistor, and the sixth transistor T6 is used for controlling whether the corresponding light emitting element emits light, the seventh transistor T7 is used for resetting the anode of the light emitting element.

In some embodiments, the sub-pixel further includes: a gate line pattern GATE, a light emitting control signal line pattern EM, a reset signal line pattern RST, and a power signal line pattern VDD; the gate line pattern GATE, the light emitting control signal line pattern EM and the reset signal line pattern RST extend in the second direction, the power signal line pattern VDD includes a portion extending in the first direction. The orthographic projection of the first shielding component 404 on the substrate 50 partially overlaps the orthographic projection of the gate line pattern GATE on the substrate 50 and the orthographic projection of the light emitting control signal line pattern EM on the substrate 50, respectively.

Specifically, the first shielding component 404 is laid out in the above-mentioned manner, so that the first shielding component 404 can isolate the first transistor T1 and the driving transistor from the target data line pattern (such as DATA2). Therefore, it is more beneficial to reduce the crosstalk to the first transistor T1 and the driving transistor caused by the change of data signal on the target data line pattern.

In some embodiments, the second electrode of the seventh transistor T7 is coupled to the light emitting element in the sub-pixel in various ways. For example, the orthographic projection of the anode of the light emitting element on the substrate overlaps the orthographic projection of the second electrode of the seventh transistor T7 on the substrate, and the anode of the light emitting element can be coupled to the second electrode of the seventh transistor T7 by a via hole at the overlapping region; or, the orthographic projection of the anode of the light emitting element on the substrate does not overlap the orthographic projection of the second electrode of the seventh transistor T7 on the substrate. The sub-pixel driving circuit further includes a second conductive connection portion 406 and a third conductive connection portion 407. The orthographic projection of the anode of the light emitting element on the substrate overlaps the orthographic projection of the first end of the third conductive connection portion 407 on the substrate. The anode of the light emitting element is coupled to the first end of the third conductive connection portion 407 through a via hole at the overlapping region, and the second end of the third conductive connection portion 407 overlap the first end of the second conductive connecting portions 406, the second end of the third conductive connecting portion 407 and the first end of the second conductive connecting portion 406 are coupled through a via hole at the overlapping region, and the orthographic projection of the second electrode of the seventh transistor T7 on the substrate overlaps the orthographic projection of the second end of the second conductive connection portion 406 on the substrate, and the second electrode of the seventh transistor T7 is coupled to the second end of the second conductive connecting portion 406 through a via hole at the overlapping region, so that the anode of the light emitting element can be coupled to the second electrode of the seventh transistor T7 through the second conductive connecting portion 406 and the third conductive connecting portion 407.

When the anode of the light emitting element is coupled to the second electrode of the seventh transistor T7 through the second conductive connection portion 406 and the third conductive connection portion 407, the second conductive connection portion 406 may include a portion extending in the first direction, the anode of the light emitting element may be located above the light emitting control signal line pattern in the corresponding sub-pixel, and the second electrode of the seventh transistor T7 may be located below the light emitting control signal line pattern in the corresponding sub-pixel.

Figure 15:
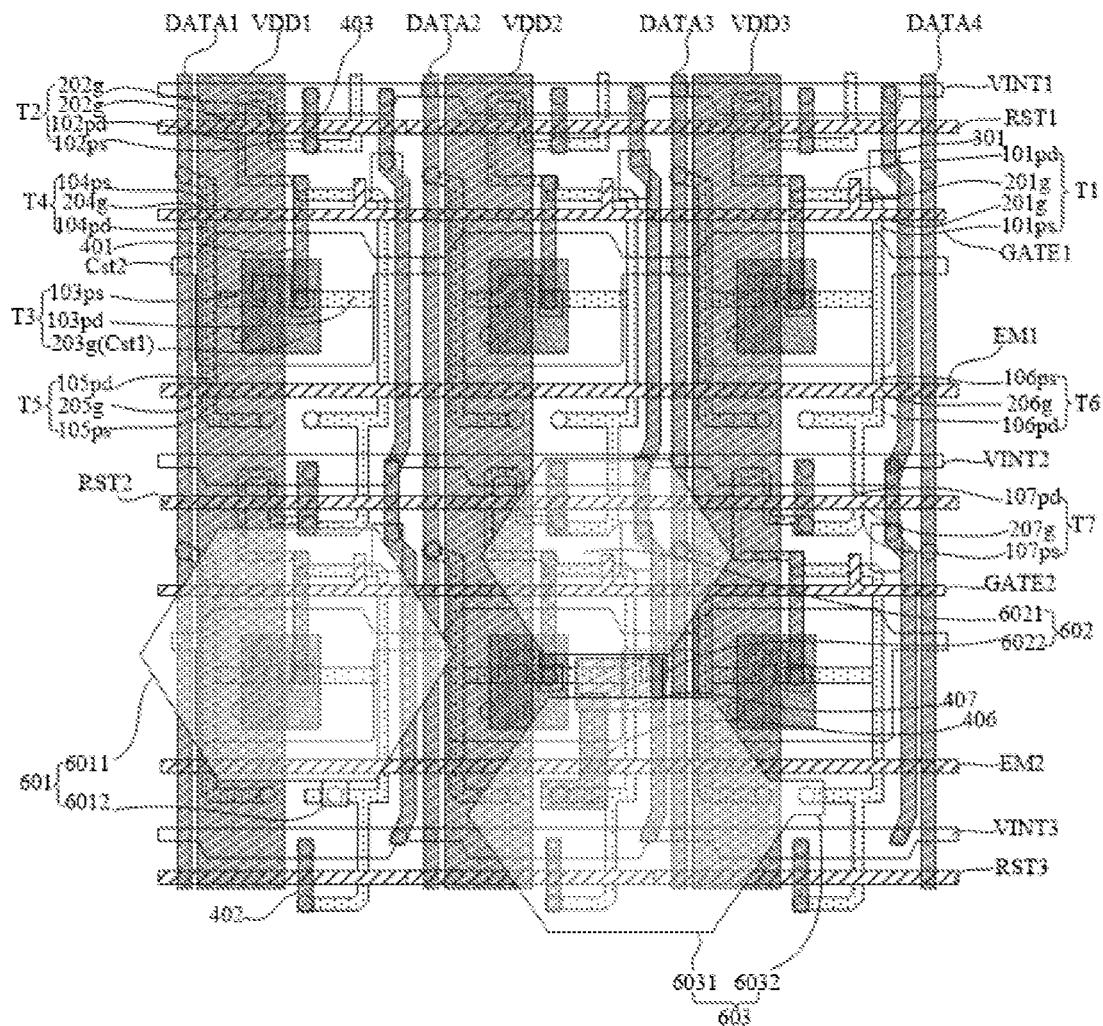
FIG. 15 is a schematic diagram of a first layout of a plurality of sub-pixels in a display substrate provided by an embodiment of the disclosure.
Figure 24:
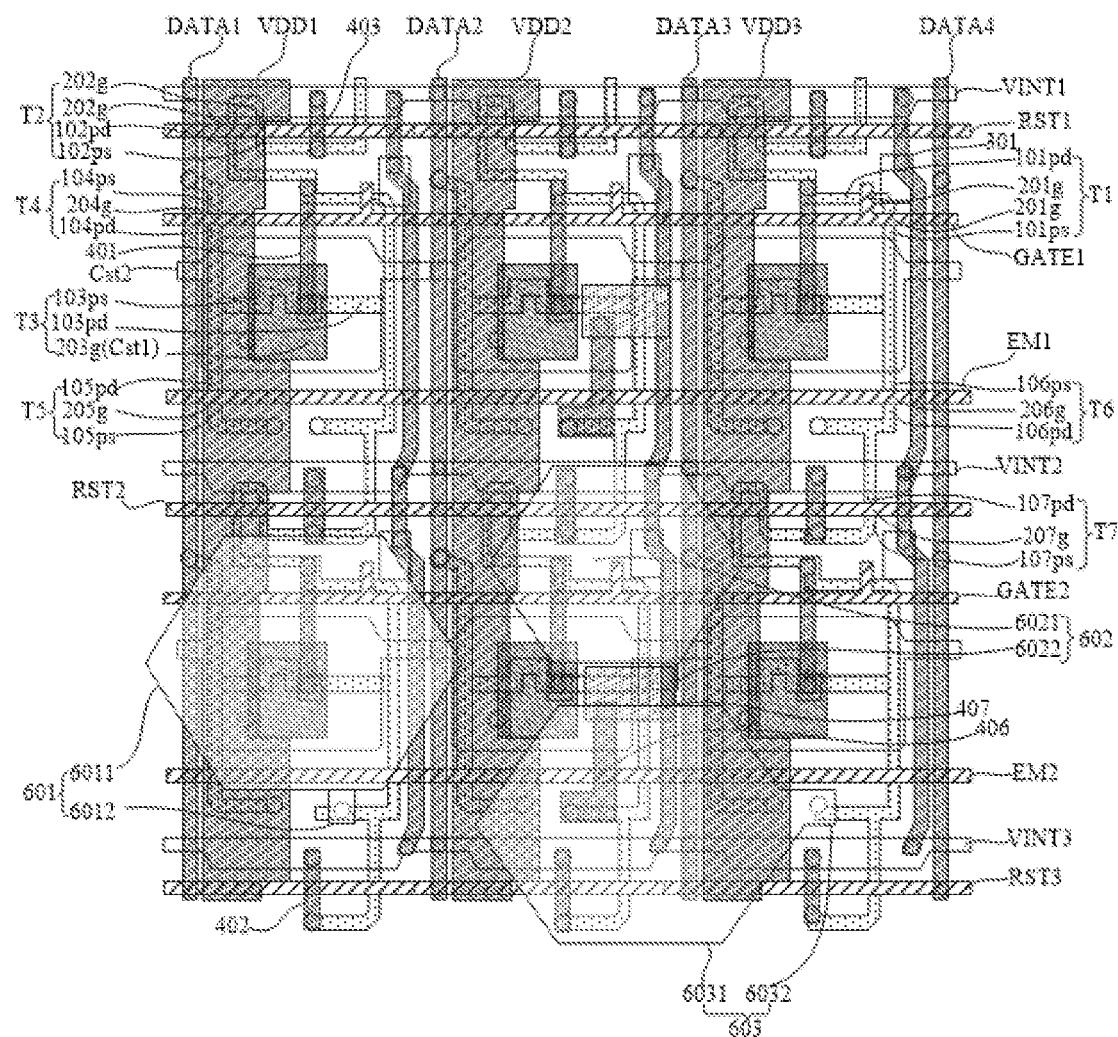
FIG. 24 is a schematic diagram of a second layout of a plurality of sub-pixels in a display substrate provided by an embodiment of the disclosure.

As shown in FIG. 15 and FIG. 24, taking the sub-pixels in three colors as an example, the structure of the sub-pixels in three colors will be described.

The light emitting element in the sub-pixel in the first color includes a first anode 601, a first organic light emitting material layer, and a first cathode that are sequentially stacked in a direction away from the substrate; the orthographic projection of the first anode 601 on the substrate overlaps the orthographic projection of the second electrode of the corresponding seventh transistor T7 on the substrate, and the first anode 601 is coupled to the second electrode of the seventh transistor T7 through the via hole at the overlapping region.

The light emitting element in the sub-pixel in the second color includes a second anode 602, a second organic light emitting material layer, and a second cathode that are sequentially stacked in a direction away from the substrate; the orthographic projection of the second anode 602 on the substrate does not overlap the orthographic projection of the second electrode of the corresponding seventh transistor T7 on the substrate, and the sub-pixel driving circuit in the sub-pixel in the second color further includes a second conductive connection portion 406 and a third conductive connection portion 407, the second anode 602 is coupled to the second electrode of the corresponding seventh transistor T7 through the second conductive connection portion 406 and the third conductive connection portion 407.

The light emitting element in the sub-pixel in the third color includes a third anode 603, a third organic light emitting material layer, and a third cathode that are sequentially stacked in a direction away from the substrate; the orthographic projection of the third anode 603 on the substrate overlaps the orthographic projection of the second electrode of the seventh transistor T7 on the substrate, and the third anode 603 is coupled to the second electrode of the seventh transistor T7 through the via hole at the overlapping region.

For example, as shown in FIG. 15, the anode of the organic light emitting element of sub-pixels in various colors includes a main electrode and a connecting electrode, and the shape of the main electrode is hexagonal.

As shown in FIG. 15, the first anode 601 of the sub-pixel in the first color includes a first main electrode 6011 and a first connection electrode 6012. The first main electrode 6011 and the first connection electrode 6012 may be an integral structure, and the first connection electrode 6012 is connected to the second electrode of the seventh transistor T7 of the sub-pixel in the first color through the connection hole. The second anode 602 of the sub-pixel in the second color includes a second main electrode 6021 and a second connection electrode 6022. The second main electrode 6021 and the second connection electrode 6022 may be an integral structure, and the second connection electrode 6022 is connected to the second electrode of the seventh transistor T7 of the sub-pixel in the second color through the second conductive connection portion 406 and the third conductive connection portion 407. The third anode 603 of the sub-pixel in the third color includes a third main electrode 6031 and a third connection electrode 6032. The third main electrode 6031 and the third connection electrode 6032 may be an integral structure, and the third connection electrode 6032 is connected to the second electrode of the seventh transistor T7 of the sub-pixel in the third color through a connection hole.

For example, the first connecting electrode 6012 of the sub-pixel in the first color is located on a side of the first main electrode 6011 away from the data line pattern of the sub-pixel pixel circuit in the X direction, and located at a side of the first main electrode 6011 away from the side of the light emitting control signal line of the sub-pixel pixel circuit in the Y direction. For example, the first connection electrode 6012 and the first main electrode 6011 of the sub-pixel in the first color are arranged in the Y direction, and the first connection electrode 6012 is located at the lower right corner of the first main electrode 6011. For example, the second connection electrode 6022 of the sub-pixel in the second color is located on the side of the second main electrode 6021 away from the data line of the sub-pixel pixel circuit in the X direction, and is located a side of the second main electrode 6021 close to the pixel circuit light emitting control signal line of the sub-pixel in the Y direction. For example, the second connection electrode 6022 and the second main electrode 6021 of the sub-pixel in the second color are arranged in the Y direction, and the second connection electrode 6022 is located at the lower right corner of the first main electrode 1231. For example, the third connection electrode 6032 and the third main electrode 6031 of the sub-pixel in the third color are arranged in the X direction, and the third connection electrode 6032 is located on the right side of the third main electrode 6031, that is, close to a side of pixel circuit of the sub-pixel close to the shield line.

As shown in FIG. 15, the first main electrode 6011 of the first anode 601 of the sub-pixel in the first color covers the driving transistor of the sub-pixel in the first color, and the second main electrode 6021 of the second anode 602 of the sub-pixel in the second color and the driving transistors of the sub-pixel in the second color basically do not overlap or partially overlap, and the third main electrode 6031 of the third anode 603 of the sub-pixel in the third color does not overlap the driving transistors of the sub-pixel in the third color.

As shown in FIG. 15, the first main electrode 6011 of the sub-pixel in the first color 601 (for example, the blue sub-pixel) overlaps the gate line pattern and the light emitting control signal line pattern; the second main electrode 6021 of the sub-pixel in the second color (for example, the red sub-pixel) overlaps the gate line pattern and the reset signal line pattern; the third main electrode 6031 of the sub-pixel in the third color (for example, the green sub-pixel) overlaps the light emitting control signal line pattern, the reset signal line pattern of the next row of sub-pixel driving circuit and the initialization signal line pattern of the next row of sub-pixel driving circuit. For example, the third main electrode 6031 of the sub-pixel in the third color (for example, the green sub-pixel) overlaps the pixel driving circuit area of the next row of the sub-pixel in the first color (for example, the blue sub-pixel) adjacent to the third main electrode 6031.

For example, the first main electrode 6011 of the sub-pixel 601 in the first color partially overlaps the driving transistor of an adjacent sub-pixel in the third color, and the first main electrode 6011 of the sub-pixel in the first color 601 partially overlaps each of the data line pattern and the first shielding component 404 of the sub-pixel driving circuit of the sub-pixel in the first color and the data line patterns in the sub-pixel driving circuit of the adjacent sub-pixel in the second color. The second main electrode 6021 of the sub-pixel in the second color does not overlap the data line pattern in the sub-pixel driving circuit thereof, and overlaps the power signal line pattern in the sub-pixel driving circuit thereof, and overlaps the power signal line pattern and the data line pattern in the sub-pixel driving circuit of an adjacent sub-pixel in the third color. The third main electrode 6031 of the sub-pixel in the third color overlaps the data line pattern and power signal line pattern in the sub-pixel driving circuit thereof, and overlaps with the power signal line in the sub-pixel driving circuit of the adjacent sub-pixel in the second color.

For example, as shown in FIG. 15, a first connection electrode 6012 is arranged at a side of the first main electrode 6011 of the sub-pixel in the first color 601 close to next row of the reset signal line pattern and connected to the first main electrode 6011; a second connection electrode 6022 is arranged at a side of the second main electrode 6021 of the sub-pixel in the second color 602 close to next row of the reset signal line pattern and connected to the second main electrode 6021; and a third connection electrode 6032 is arranged at a side of the third main electrode 6031 of the sub-pixel in the third color 603 close to next row of the reset signal line pattern and connected to the third main electrode 6031.

For example, as shown in FIG. 15, the first connecting electrode 6012 of the sub-pixel in the first color 601 overlaps with the second electrode of the seventh transistor T7 in the sub-pixel driving circuit thereof. The second connection electrode 6022 of the sub-pixel in the second color does not overlap the second electrode of the seventh transistor T7 in the sub-pixel driving circuit thereof, while the second electrode of the seventh transistor T7 of the sub-pixel in the second color overlaps the third main electrode 6031 of the sub-pixel in the third color. The third connecting electrode 6032 of the sub-pixel in the third color overlaps with the second electrode of the seventh transistor T7 in the sub-pixel driving circuit thereof.

Figure 26:
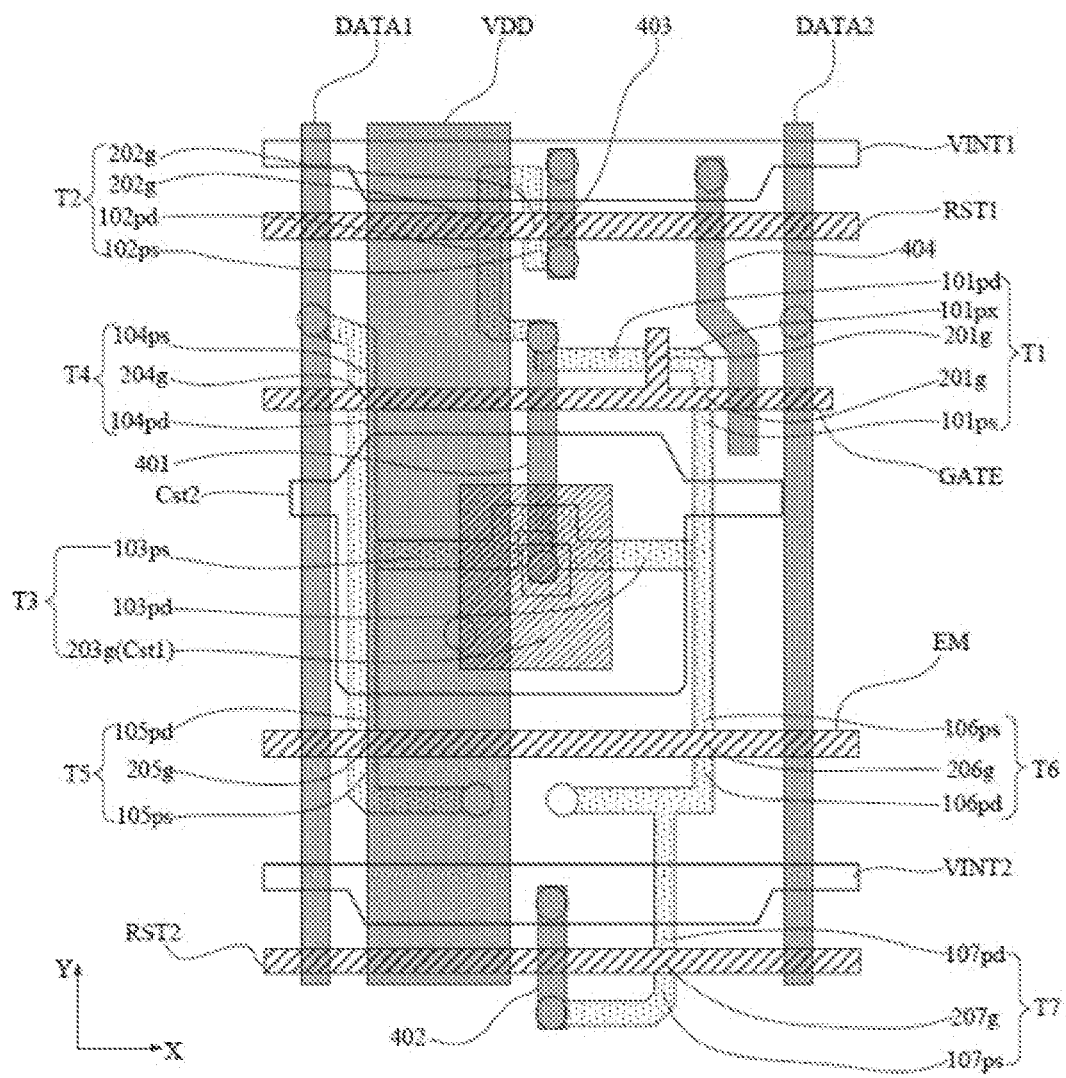
FIG. 26 is a schematic diagram of an eleventh layout of a sub-pixel driving circuit in a display substrate provided by an embodiment of the present disclosure.

As shown in FIG. 26, an embodiment of the present disclosure also provides a display substrate, including: a substrate 50 and a plurality of sub-pixels arranged in an array on the substrate 50; the sub-pixel includes: a data line pattern (such as DATA1) extending along the first direction; an initialization signal line pattern (such as: VINT1), the initialization signal line pattern includes a portion extending in a second direction, the second direction intersects the first direction, and the initialization signal line pattern is used to transmit an initialization signal having a fixed potential; and a sub-pixel driving circuit, the sub-pixel driving circuit includes: a driving transistor (such as a third transistor T3), a first transistor T1 coupled to the gate electrode of the driving transistor, and a first shielding component 404 coupled to the initialization signal line pattern, the first shielding component 404 is used to form a coupling capacitor, the orthographic projection of the first shielding component 404 on the substrate 50 does not overlap the orthographic projection of the target data line pattern (such as DATA2) on the substrate 50, and the target data line pattern is included in the next sub-pixel adjacent to the sub-pixel along the second direction.

Specifically, the above-mentioned display substrate generally includes a plurality of sub-pixels arranged in an array, and each sub-pixel includes: a data line pattern (DATA1 in FIG. 3) extending in a first direction, and an initialization signal line pattern (VINT1 in FIG. 3) at least partially extending in a second direction. The data line pattern is used to transmit data signals, and the initialization signal line pattern is used to transmit initialization signals with a fixed potential. For example, the first direction includes the Y direction, the second direction includes the X direction.

The target data line pattern is the data line pattern included in the next sub-pixel adjacent to the current sub-pixel along the second direction.

Each sub-pixel also includes a sub-pixel driving circuit and a light emitting element corresponding to the sub-pixel driving circuit in a one-to-one manner. The light emitting element includes an anode, an organic light emitting material layer, and a cathode that are stacked, wherein the anode of the light emitting element is coupled to the corresponding sub-pixel driving circuit, and the light emitting element realizes light emitting under the driving of the driving signal provided by the sub-pixel driving circuit.

In more detail, as shown in FIGS. 1, 3, and 4, taking the sub-pixel driving circuit including the above-mentioned 7T1C as an example, the gate electrode 203g of the third transistor T3 (that is, the driving transistor) is connected to the drain electrode D1 of the first transistor T1 through the connecting line 401, and the drain electrode D3 of the third transistor T3 is coupled to the source electrode S1 of the first transistor T1. Along the X direction, the distance between the orthographic projection of the first channel region 101pg of the first transistor T1 on the substrate 50 and the orthographic projection of the target data line pattern (DATA2 in FIG. 3) on the substrate 50 has a minimum value, which is smaller than the minimum distance between the orthographic projection of the third channel region 103pg of the third transistor T3 on the substrate 50 and the orthographic projection of the target data line pattern on the substrate 50. It is worth noting that the minimum distance between the orthographic projection of the above-mentioned channel regions (such as the first channel region 101pg and the third channel region 103pg) on the substrate 50 and the orthographic projection of the target data line pattern (DATA2 in FIG. 3) on the substrate means the minimum distance between the boundary of the orthographic projection of the channel region on the substrate 50 closest to the target data line pattern and the orthographic projections of the target data line pattern (as shown in Fig. DATA2 in 3) on the substrate 50.

In the sub-pixel driving circuit of the above structure, when the data signal transmitted by the target data line pattern changes, it will affect the performance of the first transistor T1. Since the first transistor T1 is coupled to the third transistor T3 through the connection line 401, which further affects the performance of the third transistor T3.

In the embodiment of the present disclosure, a first shielding component 404 coupled to the initialization signal line pattern (VINT1 in FIG. 3) is provided in the sub-pixel driving circuit, so that the first shielding component 404 has the same fixed potential as the initialization signal. The first shielding component 404 and the first electrode (source electrode S) of the first transistor T1 can form a coupling capacitance, so that the first shielding component 404 can reduce the influence of the change of the signal transmitted on the target data line pattern on the performance of the first transistor T1, thereby reducing the influence of the coupling between the gate electrode of the driving transistor (203g) and the target data line pattern, reducing the problem of vertical crosstalk, making the display substrate having a display effect.

In addition, the above first shielding component 404 is coupled to the initialization signal line pattern, so that the first shielding component 404 have a fixed potential, and the voltage of the initialization signal line pattern is enhanced, the voltage of the initialization signal transmitted on the initialization signal line pattern is more stable, which is beneficial to the working performance of the sub-pixel driving circuit.

It is worth noting that in addition to coupling the first shielding component 404 to the initialization signal line pattern, the first shielding component 404 may also be coupled with the power supply signal line pattern VDD included in the sub-pixel, so that the first shielding component 404 has the same fixed potential as the power signal transmitted by the power signal line pattern VDD.

The above method of coupling the first shielding component 404 and the power signal line pattern VDD can ensure that the first shielding component 404 has a fixed potential, but it will increase the parasitic capacitance generated by the power signal line pattern VDD, which makes the RC load of the power signal line pattern VDD larger, and the vertical crosstalk phenomenon cannot be reduced.

As shown in FIG. 3, in some embodiments, the gate electrode 201g of the first transistor T1 and the gate line pattern GATE are an integrated structure, and the gate electrode 201g of the first transistor T1 is a portion of the integrated structure that forms an overlapping area with the active film layer in a direction perpendicular to the substrate.

As shown in FIG. 3, in some embodiments, the plurality of sub-pixels include a plurality of rows of sub-pixels, and each row of sub-pixels includes a plurality of sub-pixels arranged along the second direction, and the initialization signal line patterns located in the same row of sub-pixels are sequentially coupled to form the initialization signal line corresponding to the row of sub-pixels; the first shielding component 404 extends along the first direction and is coupled to at least one initialization signal line.

Specifically, the plurality of sub-pixels may be divided into a plurality of rows of sub-pixels and a plurality of columns of sub-pixels, each row of sub-pixels includes a plurality of sub-pixels arranged in the second direction, and each column of sub-pixels includes a plurality of sub-pixels arranged in the first direction, the first direction intersects the second direction; the initialization signal line patterns located in the same row of sub-pixels are sequentially coupled to form an initialization signal line corresponding to the row of sub-pixels.

The above arrangement of the first shielding component 404 extending along the first direction and being coupled to at least one of the initialization signal lines not only enables the first shielding component 404 to reduce the impact of the change of the signal transmitted on the target data line pattern on the performance of the first transistor T1, thereby reducing the impact of the coupling between the gate electrode of the driving transistor (203g) and the target data line pattern, reducing the problem of vertical crosstalk, so that a better display effect may be achieved when the display substrate is used for display. Furthermore, the voltage of the initialization signal line is enhanced, so that the voltage of the initialization signal transmitted on the initialization signal line is more stable, which is beneficial to the working performance of the sub-pixel driving circuit.

As shown in FIG. 9, in some embodiments, the first shielding component 404 is coupled to the two adjacent initialization signal lines.

Specifically, when the first shielding component 404 is coupled to the initialization signal line, the coupling manner of the first shielding component 404 and the initialization signal line, and the specific structures and arrangements of the first shielding component 404 are various. Illustratively, as shown in FIG. 3, the first shielding component 404 can be set to be coupled to the two adjacent initialization signal lines respectively; this arrangement makes the orthographic projection of the first shielding component 404 on the substrate 50 to be located between the orthographic projection of the first transistor T1 on the substrate 50 and the orthographic projection of the target data line pattern on the substrate 50, and makes the orthographic projection of the first shielding component 404 on the substrate 50 to be located between the orthographic projection of the connecting line 401 on the substrate 50 and the orthographic projection of the target data line pattern on the substrate 50. At the same time, the orthographic projection of the first shielding component 404 on the substrate 50 can be located on the orthographic projection of the driving transistor (the third transistor T3) on the substrate 50 and the orthographic projection of the target data line pattern on the substrate 50.

The above-mentioned arrangement greatly reduces the first crosstalk generated between the target signal line pattern and the first transistor T1, and the second crosstalk generated between the target signal line pattern and the connecting line 401, thereby reducing indirect crosstalk to the driving transistor caused by the above-mentioned first crosstalk and second crosstalk. In addition, the above arrangement also reduces the direct crosstalk between the target signal line pattern and the driving transistor, thereby better ensuring the working performance of the display substrate.

Please continue to refer to FIG. 3, in some embodiments, the first shielding component 404 and the initialization signal line pattern (VINT1 in FIG. 3) are arranged in different layers, and there is a first overlapping region between the orthographic projection of the first shielding component 404 on the substrate 50 and the orthographic projection of the initialization signal line pattern on the substrate, and the first shielding component 404 is coupled to the initialization signal line through the first via hole provided in the first overlapping region.

Specifically, the first shielding component 404 and the initialization signal line pattern can be arranged in the same layer or in different layers. When the first shielding component 404 and the initialization signal line pattern are arranged in different layers, the orthographic projection of the first shielding component 404 on the substrate 50 and the orthographic projection of the initialization signal line pattern on the substrate 50 both have a first overlapping region, so that the first shielding component 404 may be coupled to the initialization signal line by setting a first via hole at the first overlapping region.

It should be noted that the above "the first shielding component 404 can be arranged on the same layer as the initialization signal line pattern" includes at least one of: the first shielding component 404 and the initialization signal line pattern are located on the same horizontal plane; the first shield component 404 and the initialization signal line pattern are located in the same film layer; the first shielding component 404 and the initialization signal line pattern are both disposed on a surface of the same insulating layer facing away from the substrate; and the first shielding component 404 and the initialization signal line pattern are formed by a signal patterning process.

The above "the first shielding component 404 and the initialization signal line pattern can be arranged in different layers" includes at least one of: the first shielding component 404 and the initialization signal line pattern are not located in the same film layer; the first shielding component 404 and the initialization signal line pattern cannot be formed by a single patterning process.

In some embodiments, the first shielding component 404 and the data line pattern (DATA1 in FIG. 3) can be made of the same material.

In some embodiments, it may be provided that the display substrate includes a first interlayer insulating layer, and the first shielding component 404 and the data line pattern (DATA1 in FIG. 3) are both located on one surface of the first interlayer insulating layer away from the substrate.

Specifically, the first shielding component 404 is arranged in the above-mentioned manner, so that the first shielding component 404 and the data line pattern can be simultaneously formed on a surface of the first interlayer insulating layer away from the substrate through a single patterning process, thereby avoiding adding an additional patterning process for manufacturing the first shielding component 404, simplifying the manufacturing process of the display substrate and saving the manufacturing cost.

As shown in FIG. 3, in some embodiments, the sub-pixel driving circuit further includes a second transistor T2 coupled to the gate electrode of the driving transistor, and the second transistor T2 includes: a first semiconductor pattern, a second semiconductor pattern, and a third conductor pattern respectively coupled to the first semiconductor pattern and the second semiconductor pattern, the conductivity of the third conductor pattern is better than that of the first semiconductor pattern and the conductivity of the second semiconductor pattern; a first gate pattern and a second gate pattern coupled to each other, and the orthographic projection of the first gate pattern on the substrate 50 partially overlaps the orthographic projection of the first semiconductor pattern on the substrate 50, the orthographic projection of the second gate pattern on the substrate 50 partially overlaps the orthographic projection of the second semiconductor pattern on the substrate 50; the orthographic projection of the third conductor pattern on the substrate 50, the orthographic projection of the first gate pattern on the substrate 50, and the orthographic projection of the second gate pattern on the substrate 50 do not overlap to each other; the orthographic projection of the third conductor pattern on the substrate 50 at least partially overlaps with the orthographic projection of the initialization signal line pattern (VINT1 in FIG. 3) on the substrate 50.

Specifically, as shown in FIG. 7, the second transistor T2 has a double-gate structure, and the first semiconductor pattern and the second semiconductor pattern included in the second transistor T2 are formed as the channel region of the second transistor T2 (corresponding to 102$pg$ in the FIG. 7), due to the doping, the conductivity of the third conductor pattern 102$px$ is better than those of the first semiconductor pattern and the second semiconductor pattern. The first gate pattern and the second gate pattern included in the second transistor T2 cover the first semiconductor pattern and the second semiconductor pattern in a one-to-one manner, and can serve as the gate electrode 202$g$ of the second transistor T2 together.

In the second transistor T2 of the above-mentioned structure, since the third conductive pattern 102$px$ has good conductivity and is not covered by the gate pattern, it is easy to couple with other conductive patterns in the vicinity thereof, thereby causing crosstalk. In the technical solution provided by the foregoing embodiment, by setting the orthographic projection of the third conductor pattern on the substrate 50 at least partially overlapping the orthographic projection of the initialization signal line pattern (VINT1 in FIG. 3) on the substrate 50, the initialization signal line pattern can cover the third conductor pattern 102$px$. Since the initialization signal line pattern transmits the initialization signal having a fixed potential, the coupling effect between the third conductor pattern 102$px$ and other conductive patterns nearby is reduced, thereby making the work performance of the display substrate more stable.

As shown in FIG. 4, in some embodiments, the sub-pixel driving circuit further includes a first extension part extending from the first semiconductor pattern, and the conductivity of the first extension part is better than that of the first semiconductor pattern. The first extension part includes a first portion 61, a second portion 62 and a third portion 63, the first portion 61 and the third portion 63 extend along the first direction, the second portion 62 extends in the second direction, one end of the second portion 62 is coupled to the first portion 61, and the other end of the second portion 62 is coupled to the third portion 63; one end of the third portion 63 away from the second portion 62 is coupled to the first transistor T1.

Specifically, the first extension portion and the first semiconductor pattern can be fabricated in a single patterning process, and after the first semiconductor pattern is formed, the first extension portion is doped so that the conductivity of the first extension portion is better than that of the first semiconductor pattern.

After the first shielding component 404 is added, the first extension is set to the above structure, so that when the second transistor T2 is coupled to the gate electrodes of the first transistor T1 and the driving transistor through the first extension portion respectively, it is more conducive to reducing the impact of the change of the signal transmitted on the target data line pattern on the performance of the first transistor T1 and the performance of the second transistor T2, thereby reducing the influence of the coupling between the gate electrode (203*g*) of the driving transistor and the target data line pattern, reducing the problem of vertical crosstalk, so that the display substrate can obtain a better display effect.

As shown in FIGS. 3 and 4, in some embodiments, the first transistor T1 includes: a fourth semiconductor pattern, a fifth semiconductor pattern, and a sixth conductor pattern respectively coupled to the fourth semiconductor pattern and the fifth semiconductor pattern, the conductivity of the sixth conductor pattern is better than that of the fourth semiconductor pattern, the conductivity of the fifth semiconductor pattern; a third gate pattern and a fourth gate pattern coupled to each other, and the orthographic projection of the third gate pattern on the substrate 50 partially overlaps the orthographic projection of the fourth semiconductor pattern on the substrate 50, the orthographic projection of the fourth gate pattern on the substrate 50 partially overlaps the orthographic projection of the fifth semiconductor pattern on the substrate 50; the orthographic projection of the sixth conductor pattern on the substrate 50, the orthographic projection of the third gate pattern on the substrate 50, and the orthographic projection of the fourth gate pattern on the substrate 50 do not overlap to each other.

Specifically, as shown in FIG. 4, the first transistor has a double-gate structure, and the fourth semiconductor pattern and the fifth semiconductor pattern included in the first transistor are formed as the channel region of the first transistor (corresponding to 101*pg* in FIG. 4), due to doping, the conductivity of the sixth conductor pattern 101*px* is better than those of the fourth semiconductor pattern and the fifth semiconductor pattern. The third gate pattern and the fourth gate pattern included in the first transistor cover the fourth semiconductor pattern and the fifth semiconductor pattern in a one-to-one manner, and can be used as the gate electrode 201*g* of the first transistor T1 together.

As shown in FIG. 10, in some embodiments, the orthographic projection of the first shielding component 404 on the substrate 50 at least partially overlaps the orthographic projection of the sixth conductor pattern 101*px* on the substrate 50.

Specifically, in the first transistor T1 of the above-mentioned structure, since the sixth conductor pattern 101*px* has good conductivity and is not covered by the gate pattern, it is easy to couple with other conductive patterns nearby, causing crosstalk. In the technical solution provided by the foregoing embodiment, the orthographic projection of the first shielding component 404 on the substrate 50 at least partially overlaps the orthographic projection of the sixth conductor pattern 101*px* on the substrate 50, so that the first shielding component 404 can cover the sixth conductor pattern 101*px*, and because the first shielding component 404 has a fixed potential, the coupling effect between the sixth conductor pattern 101*px* and other conductive patterns nearby are reduced. The working performance of the display substrate is more stable.

As shown in FIGS. 11, 12 and 13, in some embodiments, the sub-pixel driving circuit further includes: a second shielding component 301 coupled to the first shielding component 404, and the orthographic projection of the second shielding component 301 on the substrate 50 at least partially overlaps the orthographic projection of the sixth conductor pattern 101*px* on the substrate 50.

Specifically, the orthographic projection of the second shielding component 301 on the substrate 50 at least partially overlaps the orthographic projection of the sixth conductor pattern 101*px* on the substrate 50, so that the second shielding component 301 can cover the sixth conductor pattern 101*px*, and since the second shielding component 301 is coupled to the first shielding component 404, the second shielding component 301 has a fixed potential, thereby better reducing the coupling effect between the sixth conductor pattern 101*px* and other conductive patterns nearby, so that the working performance of the display substrate is more stable.

Therefore, in the display substrate provided by the above-mentioned embodiment, since the first shielding component 404 and the second shielding component 301 both have a fixed potential, it may prevent or reduce forming of the parasitic capacitance between the first transistor T1 and the target data line pattern (DATA2), effectively prevent or reduce vertical crosstalk defects.

Further, the orthographic projection of the second shielding component 301 on the substrate 50 cover the whole orthographic projection of the sixth conductor pattern on the substrate 50.

Specifically, the orthographic projection of the second shielding component 301 on the substrate 50 covers the whole orthographic projection of the sixth conductor pattern 101*px* on the substrate 50, so that the second shielding component 301 can completely cover the sixth conductor pattern 101*px*, thereby minimizing the coupling effect between the sixth conductor pattern 101*px* and other conductive patterns nearby, and improving the working stability of the display substrate.

In some embodiments, the second shielding component 301 and the first shielding component 404 are arranged in different layers, and there is a second overlapping region between the orthographic projection of the second shielding component 301 on the substrate 50 and the orthographic projection of the first shielding component 404 on the substrate 50, and the second shielding component 301 and the first shielding component 404 are coupled through a second via hole at the second overlapping region.

Specifically, the second shielding component 301 and the first shielding component 404 can be arranged in the same layer or in different layers. When the second shielding component 301 and the first shielding component 404 are arranged in different layers, there is a second overlapping region between the orthographic projection of the second shielding component 301 on the substrate 50 and the orthographic projection of the first shielding component 404 on the substrate 50. In this way, the second shielding component 301 and the first shielding component 404 can be coupled through the second via hole at the second overlapping region.

In some embodiments, the second shielding component 301 and the initialization signal line pattern may be made of the same material.

In some embodiments, the display substrate may further include a second interlayer insulating layer, and the second shielding component 301 and the initialization signal line pattern (VINT1 in FIG. 3) are both located on a surface of the second interlayer insulating layer away from the substrate.

Specifically, as described above, the second shielding component 301 and the initialization signal line pattern are made of the same material, and the second shielding component 301 and the initialization signal line pattern (VINT1 in FIG. 3) are both located at a surface of the second interlayer insulating layer away from the substrate, so that the second shielding component 301 and the initialization signal line pattern can be formed at the same time in the same patterning process, reducing an additional manufacturing process for the second shielding component 301, thereby simplifying the manufacturing process of the display substrate and saving the production cost.

As shown in FIG. 3, in some embodiments, the sub-pixel further includes a power signal line pattern VDD, the power signal line pattern VDD includes a portion extending along the first direction, and the sub-pixel driving circuit further includes a storage capacitor Cst, the first electrode plate Cst1 of the storage capacitor Cst is multiplexed as the gate electrode of the driving transistor, and the second electrode plate Cst2 of the storage capacitor Cst is coupled to the power signal line pattern VDD, the second electrode plate Cst2 of the storage capacitor Cst is located on the surface of the second interlayer insulating layer away from the substrate.

Specifically, the storage capacitor Cst included in the sub-pixel driving circuit has a first electrode plate Cst1 and a second electrode plate Cst2, the first electrode plate Cst1 and the second electrode plate Cst2 are arranged opposite to each other, and the first electrode plate Cst1 is coupled to the gate electrode of the driving transistor, and the second electrode plate Cst2 is coupled to the power signal line pattern VDD. When laying out the storage capacitor Cst, the first electrode plate Cst1 can be directly multiplexed as the gate electrode of the driving transistor, which not only ensures the coupling between the storage capacitor Cst and the gate electrode of the driving transistor, but also reduces the space occupied by the sub-pixel driving circuit, which is more conducive to improving the resolution of the display substrate. In addition, the second electrode plate Cst2 of the storage capacitor Cst is located on the surface of the second interlayer insulating layer away from the substrate, so that the second electrode plate Cst2 of the storage capacitor Cst, the second shielding components 301 and the initialization signal line pattern are formed at the same time in the same patterning process, which greatly simplifies the manufacturing process of the display substrate and saves the production cost.

As shown in FIG. 14, in some embodiments, the sub-pixel further includes: a reset signal line pattern (RST1 in FIG. 3) extending in a second direction intersecting the first direction, and the sub-pixel driving circuit also includes: a first conductive connection portion 405, the orthographic projection of the first conductive connection portion 405 on the substrate 50 at least partially covers the orthographic projection of the sixth conductor pattern 101px on the substrate 50; the second transistor T2, the first electrode (such as the source electrode S2) of the second transistor T2 is coupled to the initialization signal line pattern (such as VINT1) through the first conductive connection portion 405, and the second electrode (such as the drain electrode D2) of the second transistor T2 is coupled to the gate electrode of the driving transistor, and the gate electrode 202g of the second transistor T2 is coupled to the reset signal line pattern (such as RST1).

Specifically, the first conductive connection portion 405 can be made of a metal material, and can be formed in the same patterning process as the data line pattern.

The orthographic projection of the first conductive connecting portion 405 on the substrate 50 at least partially covers the orthographic projection of the sixth conductor pattern 101px on the substrate 50, so that the first conductive connecting portion 405 can cover the sixth conductor pattern 101px, and since the first conductive connection portion 405 is coupled to the initialization signal line pattern, the first conductive connection portion 405 has a fixed potential, thereby better reducing the coupling effect between the sixth conductive pattern 101px and other conductive patterns nearby, and making the working performance of the display substrate more stable.

As shown in FIG. 3, in some embodiments, the sub-pixel further includes: a gate line pattern GATE, a light emitting control signal line pattern EM, a reset signal line pattern (RST1 in FIG. 3), and a power signal line pattern VDD. The gate line pattern GATE, the light emitting control signal line pattern EM, and the reset signal line pattern all extend along the second direction, and the power signal line pattern VDD includes a portion extending along the first direction.

The sub-pixel driving circuit further includes: a second transistor T2, a fourth transistor T4, a fifth transistor T5, a sixth transistor T6, and a seventh transistor T7.

The gate electrode of the driving transistor (such as the gate electrode 203g of the third transistor T3) is coupled to the second electrode of the first transistor T1, and the first electrode of the driving transistor is coupled to the second electrode of the fifth transistor T5, the second electrode of the driving transistor is coupled to the first electrode of the first transistor T1.

The gate electrode 201g of the first transistor T1 is coupled to the gate line pattern GATE.

The gate electrode 202g of the second transistor T2 is coupled to the reset signal line pattern, the first electrode of the second transistor T2 is coupled to the initialization signal line pattern, and the second electrode of the second transistor T2 is coupled to the gate electrode of the driving transistor.

The gate electrode 204g of the fourth transistor T4 is coupled to the gate line pattern GATE, the first electrode of the fourth transistor T4 is coupled to the data line pattern (DATA1 in FIG. 3), and the second electrode of the four transistor T4 is coupled to the first electrode of the driving transistor.

The gate electrode 205g of the fifth transistor T5 is coupled to the light emitting control signal line pattern EM, and the first electrode of the fifth transistor T5 is coupled to the power signal line pattern VDD.

The gate electrode 206g of the sixth transistor T6 is coupled to the light emitting control signal line pattern EM, the first electrode of the sixth transistor T6 is coupled to the second electrode of the driving transistor, and the second electrode of the sixth transistor T6 is coupled to the light emitting element in the sub-pixel.

The gate electrode 207g of the seventh transistor T7 is coupled to the reset signal line pattern (such as RST2) included in an adjacent next sub-pixel along the first direction, and the first electrode of the seventh transistor T7 is coupled to the initialization signal line pattern (such as VINT2) included in the next sub-pixel, and the second electrode of the seventh transistor T7 is coupled to the light emitting element in the sub-pixel.

Specifically, in the above-mentioned display substrate, the plurality of sub-pixels may be arranged in an array, and the plurality of sub-pixels may be divided into a plurality of rows of sub-pixels and a plurality of columns of sub-pixels, and each row of sub-pixels includes a plurality of sub-pixels arranged along the second direction. Each column of sub-pixels includes a plurality of sub-pixels arranged along a first direction, and the first direction intersects the second direction.

It should be noted that the above-mentioned adjacent next sub-pixel in the first direction is the adjacent next sub-pixel located in the same column as the seventh transistor T7.

The arrangement of the sub-pixel and the sub-pixel driving circuit included in the sub-pixel can effectively reduce the layout space occupied by the sub-pixel driving circuit while ensuring the working performance of the sub-pixel driving circuit, which is beneficial to improve the resolution of the display substrate.

It should be noted that the gate electrodes of the transistors included in the sub-pixel driving circuit, and the functional patterns coupled thereto may be formed as an integral structure. For example, the gate electrode of the first transistor and the gate electrode of the fourth transistor both form an integral structure with the correspondingly coupled gate line pattern, the gate electrode of the fifth transistor and the gate electrode of the sixth transistor both form an integral structure with the correspondingly coupled light emitting control signal line pattern, and the gate electrode of the second transistor and the gate electrode of the seventh transistor form an integrated structure with the correspondingly coupled reset signal line pattern.

In addition, the first transistor T1 is used for threshold compensation of the driving transistor (such as the third transistor T3), the second transistor T2 is used for resetting the gate electrode of the driving transistor, and the fourth transistor T4 is used for writing the data signal transmitted by the data line pattern, the fifth transistor T5 is used for writing the power signal transmitted by the power signal line pattern to the first electrode of the driving transistor, and the sixth transistor T6 is used to control whether the corresponding light emitting element emits light, the seventh transistor T7 is used to reset the anode of the light emitting element.

In some embodiments, the sub-pixel further includes: a gate line pattern GATE, a light emitting control signal line pattern EM, a reset signal line pattern RST, and a power signal line pattern VDD. The gate line pattern GATE, the light emitting control signal line pattern EM and the reset signal line pattern RST extend in the second direction, the power signal line pattern VDD includes a portion extending in the first direction. The orthographic projection of the first shielding component 404 on the substrate 50 partially overlaps the orthographic projection of the gate line pattern GATE on the substrate 50 and the orthographic projection of the light emitting control signal line pattern EM on the substrate 50 respectively.

Specifically, the first shielding component 404 is laid out in the above-mentioned manner, so that the first shielding component 404 can isolate the first transistor T1 and the driving transistor from the target data line pattern (such as DATA2) Therefore, it is more beneficial to reduce the crosstalk to the first transistor T1 and the driving transistor caused by the change of the data signal on the target data line pattern.

In some embodiments, the second electrode of the seventh transistor T7 is coupled to the light emitting element in the sub-pixel in various ways. For example, the orthographic projection of the anode of the light emitting element on the substrate overlaps the orthographic projection of the second electrode of the seventh transistor T7 on the substrate, and the anode of the light emitting element can be coupled to the second electrode through the via hole at the overlapping region; or the orthographic projection of the anode of the light emitting element on the substrate does not overlap the orthographic projection of the second electrode of the seventh transistor T7 on the substrate, and the sub-pixel driving circuit further includes a second conductive connection portion 406 and a third conductive connection portion 407. The orthographic projection of the anode of the light emitting element on the substrate overlaps the orthographic projection first end of the third conductive connection portion 407 on the substrate. The anode of the light emitting element is coupled to the first end of the third conductive connection portion 407 through the via hole at the overlapping region, and the second end of the third conductive connection portion 407 overlaps the first end of the second conductive connecting portions 406, the second end of the third conductive connecting portion 407 and the first end of the second conductive connecting portion 406 are coupled through a via at the overlapping region, and the orthographic projection of the second electrode of the seventh transistor T7 on the substrate overlaps the orthographic projection of the second end of the second conductive connection portion 406 on the substrate, and the second electrode of the seventh transistor T7 is coupled to the second end of the second conductive connecting portion 406 through the via hole in the overlapping region, so that the anode of the light emitting element can be couple to the second electrode of the seventh transistor T7 through the second conductive connecting portion 406 and the third conductive connecting portion 407.

When the anode of the light emitting element is coupled to the second electrode of the seventh transistor T7 through the second conductive connection portion 406 and the third conductive connection portion 407, the second conductive connection portion 406 may include a portion extending in the first direction, the anode of the light emitting element may be located above the light emitting control signal line pattern in the corresponding sub-pixel, and the second electrode of the seventh transistor T7 may be located below the light emitting control signal line pattern in the corresponding sub-pixel.

As shown in FIG. 15, taking the sub-pixels in three colors as an example, the structure of the sub-pixels in three colors will be described.

The light emitting element in the sub-pixel in the first color includes a first anode 601, a first organic light emitting material layer, and a first cathode that are sequentially stacked in a direction away from the substrate; the orthographic projection of the first anode 601 on the substrate partially overlaps the orthographic projection of the second electrode of the seventh transistor T7 on the substrate, and the first anode 601 is coupled to the second electrode of the seventh transistor T7 through the via hole at the overlapping region.

The light emitting element in the sub-pixel in the second color includes a second anode 602, a second organic light emitting material layer, and a second cathode that are sequentially stacked in a direction away from the substrate; the orthographic projection of the second anode 602 on the substrate does not overlap the orthographic projection of the second electrode of the seventh transistor T7 on the substrate, and the sub-pixel driving circuit in the sub-pixel in the second color further includes a second conductive connection portion 406 and a third conductive connection portion 407, the second anode 602 is coupled to the second electrode of the corresponding seventh transistor T7 through the second conductive connection portion 406 and the third conductive connection portion 407.

The light emitting element in the sub-pixel in the third color includes a third anode 603, a third organic light emitting material layer, and a third cathode that are sequentially stacked in a direction away from the substrate; the orthographic projection of the third anode 603 on the substrate overlaps the orthographic projection of the second electrode of the corresponding seventh transistor T7 on the substrate, and the third anode 603 is connected to the second electrode of the seventh transistor T7 through the via hole at the overlapping region.

For example, as shown in FIG. 15, the anode of the organic light emitting element of sub-pixel in each color includes a main electrode and a connecting electrode, and the shape of the main electrode is hexagonal.

As shown in FIG. 15, the first anode 601 of the sub-pixel in the first color includes a first main electrode 6011 and a first connection electrode 6012. The first main electrode 6011 and the first connection electrode 6012 may be an integral structure, and the first connection electrode 6012 is connected to the second electrode of the seventh transistor T7 of the sub-pixel in the first color through the connection hole. The second anode 602 of the sub-pixel in the second color includes a second main electrode 6021 and a second connection electrode 6022. The second main electrode 6021 and the second connection electrode 6022 may be an integral structure, and the second connection electrode 6022 is connected to the second electrode of the seventh transistor T7 of the sub-pixel in the second color through the second conductive connection portion 406 and the third conductive connection portion 407. The third anode 603 of the sub-pixel in the third color includes a third main electrode 6031 and a third connection electrode 6032. The third main electrode 6031 and the third connection electrode 6032 may be an integral structure, and the third connection electrode 6032 is connected to the second electrode of the seventh transistor T7 of the sub-pixel in the third color.

For example, the first connecting electrode 6012 of the sub-pixel in the first color is located on a side of the first main electrode 6011 away from the data line pattern of the sub-pixel pixel circuit in the X direction, and located at a side of the first main electrode 6011 away from the side of the light emitting control signal line of the sub-pixel pixel circuit in the Y direction. For example, the first connection electrode 6012 and the first main electrode 6011 of the sub-pixel in the first color are arranged in the Y direction, and the first connection electrode 6012 is located at the lower right corner of the first main electrode 6011. For example, the second connection electrode 6022 of the sub-pixel in the second color is located on the side of the second main electrode 6021 away from the data line of the sub-pixel pixel circuit in the X direction, and is located a side of the second main electrode 6021 close to the pixel circuit light emitting control signal line of the sub-pixel in the Y direction. For example, the second connection electrode 6022 and the second main electrode 6021 of the sub-pixel in the second color are arranged in the Y direction, and the second connection electrode 6022 is located at the lower right corner of the first main electrode 1231. For example, the third connection electrode 6032 and the third main electrode 6031 of the sub-pixel in the third color are arranged in the X direction, and the third connection electrode 6032 is located on the right side of the third main electrode 6031, that is, close to a side of pixel circuit of the sub-pixel close to the shield line.

As shown in FIG. 15, the first main electrode 6011 of the first anode 601 of the sub-pixel in the first color covers the driving transistor of the sub-pixel in the first color, and the second main electrode 6021 of the second anode 602 of the sub-pixel in the second color and the driving transistors of the sub-pixel in the second color basically do not overlap or partially overlap, and the third main electrode 6031 of the third anode 603 of the sub-pixel in the third color does not overlap the driving transistors of the sub-pixel in the third color.

As shown in FIG. 15, the first main electrode 6011 of the sub-pixel in the first color 601 (for example, the blue sub-pixel) overlaps the gate line pattern and the light emitting control signal line pattern; the second main electrode 6021 of the sub-pixel in the second color (for example, the red sub-pixel) overlaps the gate line pattern and the reset signal line pattern; the third main electrode 6031 of the sub-pixel in the third color (for example, the green sub-pixel) overlaps the light emitting control signal line pattern, the reset signal line pattern of the next row of sub-pixel driving circuit and the initialization signal line pattern of the next row of sub-pixel driving circuit. For example, the third main electrode 6031 of the sub-pixel in the third color (for example, the green sub-pixel) overlaps the pixel driving circuit area of the next row of the sub-pixel in the first color (for example, the blue sub-pixel) adjacent to the third main electrode 6031.

For example, the first main electrode 6011 of the sub-pixel 601 in the first color partially overlaps the driving transistor of an adjacent sub-pixel in the third color, and the first main electrode 6011 of the sub-pixel in the first color 601 partially overlaps each of the data line pattern and the first shielding component 404 of the sub-pixel driving circuit of the sub-pixel in the first color and the data line patterns in the sub-pixel driving circuit of the adjacent sub-pixel in the second color. The second main electrode 6021 of the sub-pixel in the second color does not overlap the data line pattern in the sub-pixel driving circuit thereof, and overlaps the power signal line pattern in the sub-pixel driving circuit thereof, and overlaps the power signal line pattern and the data line pattern in the sub-pixel driving circuit of an adjacent sub-pixel in the third color. The third main electrode 6031 of the sub-pixel in the third color overlaps the data line pattern and power signal line pattern in the sub-pixel driving circuit thereof, and overlaps the power signal line in the sub-pixel driving circuit of the adjacent sub-pixel in the second color.

For example, as shown in FIG. 15, a first connection electrode 6012 is arranged at a side of the first main electrode 6011 of the sub-pixel in the first color 601 close to next row of the reset signal line pattern and connected to the first main electrode 6011; a second connection electrode 6022 is arranged at a side of the second main electrode 6021 of the sub-pixel in the second color 602 close to next row of the reset signal line pattern and connected to the second main electrode 6021; and a third connection electrode 6032 is arranged at a side of the third main electrode 6031 of the sub-pixel in the third color 603 close to next row of the reset signal line pattern and connected to the third main electrode 6031.

For example, as shown in FIG. 15, the first connecting electrode 6012 of the sub-pixel in the first color 601 overlaps the second electrode of the seventh transistor T7 in the sub-pixel driving circuit thereof. The second connection electrode 6022 of the sub-pixel in the second color does not overlap the second electrode of the seventh transistor T7 in the sub-pixel driving circuit thereof, while the second electrode of the seventh transistor T7 of the sub-pixel in the second color overlaps the third main electrode 6031 of the sub-pixel in the third color. The third connecting electrode 6032 of the sub-pixel in the third color overlaps with the second electrode of the seventh transistor T7 in the sub-pixel driving circuit thereof.

An embodiment of the present disclosure also provides a display device including the above display substrate.

In the display substrate provided by the above-mentioned embodiment, the setting of the first shielding component 404 can reduce the influence of the change of the signal transmitted on the target data line pattern on the performance of the first transistor T1, thereby reducing the influence of coupling the gate electrode (203g) of the driving transistor and the target data line pattern, reducing the problem of vertical crosstalk, so that the display substrate can obtain a better display effect. In addition, in the display substrate provided by the above-mentioned embodiment, the first shielding component 404 is coupled to the initialization signal line pattern, so that the first shielding component 404 have a fixed potential, the initialization signal line is also strengthened, the voltage of the initialization signal transmitted on the initialization signal line pattern is more stable, which is more conducive to the working performance of the sub-pixel driving circuit.

Therefore, when the display device provided by the embodiment of the present disclosure includes the above-mentioned display substrate, it also has the above-mentioned beneficial effects, which will not be repeated here.

It should be noted that the display device may be any product or component with a display function such as a TV, a monitor, a digital photo frame, a mobile phone, a tablet computer, etc.

The embodiments of the present disclosure also provide a manufacturing method of a display substrate, which is used to manufacture the display substrate provided in the above embodiment, and the manufacturing method includes: forming a plurality of sub-pixels in an array on the substrate 50; the sub-pixel includes: a data line pattern extending along the first direction (DATA1 in FIG. 3); an initialization signal line pattern (VINT1 in FIG. 3), the initialization signal line pattern includes a portion extending in a second direction, the second direction intersects the first direction, and the initialization signal line pattern is used to transmit the initialization signal with fixed potential; a sub-pixel driving circuit, the sub-pixel driving circuit includes: a driving transistor (T3 in FIG. 3), a first transistor T1 coupled to the gate electrode of the driving transistor, and a first shielding component 404 coupled to the initialization signal line pattern, the orthographic projection of the first shielding component 404 on the substrate 50 is arranged between the orthographic projection of the first transistor T1 on the substrate 50 and the orthographic projection of the target data line pattern (as shown in FIG. 3 DATA2) on the substrate 50; the next sub-pixel adjacent to the sub-pixel in the second direction includes the target data line pattern.

When the above-mentioned display substrate is manufactured using the manufacturing method provided by the embodiment of the present disclosure, a first shielding component 404 coupled to the initialization signal line pattern (VINT1 in FIG. 3) is provided in the sub-pixel driving circuit, so that the first shielding component 404 has the same fixed potential as the initialization signal, and the orthographic projection of the first shielding component 404 on the substrate 50 is between the orthographic projection of the first transistor T1 on the substrate 50 and the orthographic projection of the target data line pattern (DATA2 in FIG. 3) on the substrate 50, so that the first shielding component 404 can reduce the impact on the first transistor T1 due to the change of the signal transmitted on the target data line pattern, thereby reducing the impact of the coupling between the gate electrode of the driving transistor (203g) and the target data line pattern, reducing the problem of vertical crosstalk, so that the display substrate can obtain a better display effect.

In addition, when the above-mentioned display substrate is manufactured using the manufacturing method provided by the embodiment of the present disclosure, the first shielding component 404 is coupled to the initialization signal line pattern, so that the first shielding component 404 have a fixed potential, and the voltage of the initialization signal line pattern is strengthened, the voltage of the initialization signal transmitted on the initialization signal line pattern is more stable, which is more conducive to the working performance of the sub-pixel driving circuit.

Figure 16:
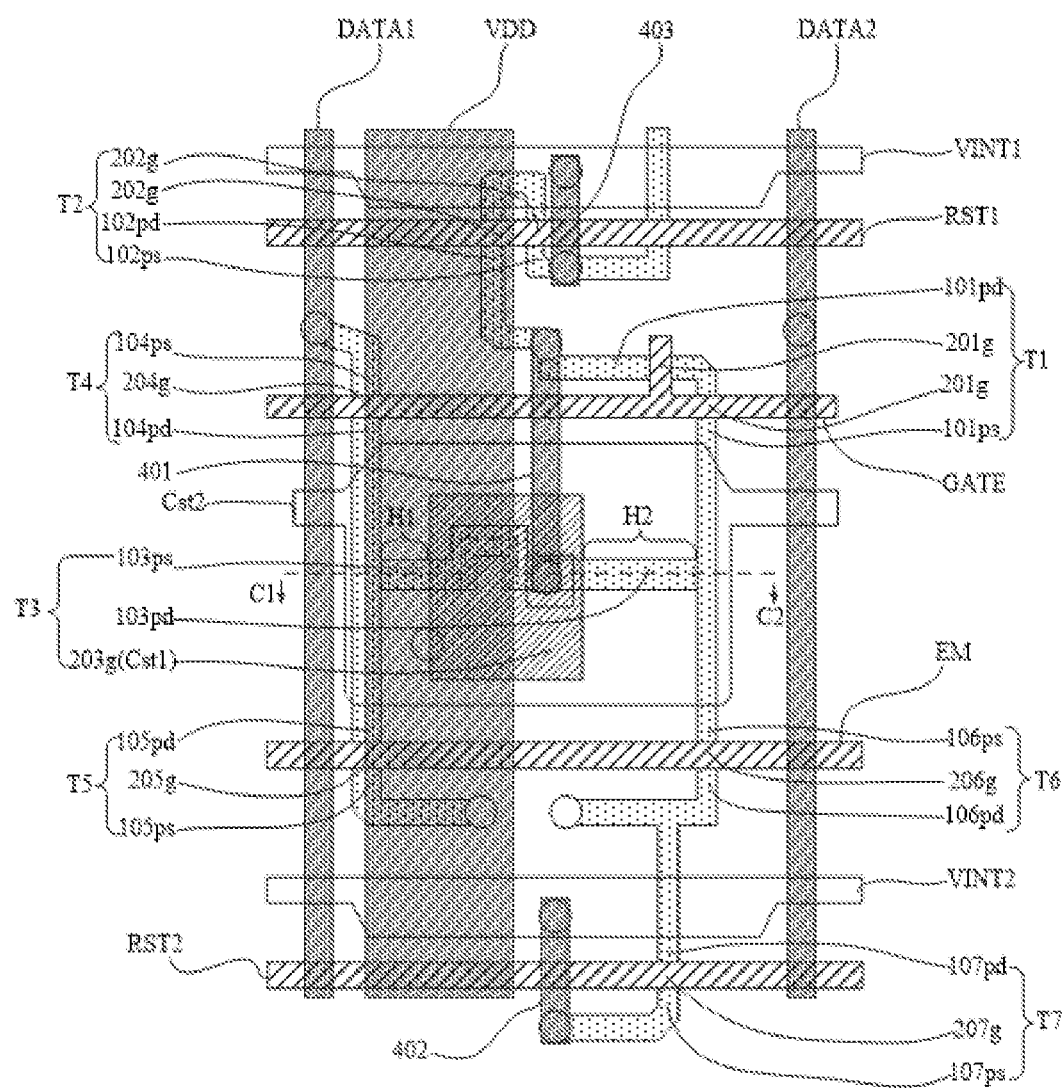
FIG. 16 is a schematic diagram of a seventh layout of a sub-pixel driving circuit in a display substrate provided by an embodiment of the disclosure.

As shown in FIG. 16, an embodiment of the present disclosure also provides a display substrate, including: a substrate 50 and a plurality of sub-pixels arranged in an array on the substrate 50; the sub-pixels include: a data line pattern (such as DATA1) extending along the first direction; a power supply signal line pattern VDD, the power supply signal line pattern VDD includes a portion extending in the first direction; a sub-pixel driving circuit, the sub-pixel driving circuit includes: two switching transistors (such as the fourth transistor T4 and the fifth transistor T5), a driving transistor (such as the third transistor T3) and a storage capacitor Cst. The first electrode plate Cst1 of the storage capacitor Cst is coupled to the gate electrode of the driving transistor (such as the gate electrode 203g of the third transistor T3), and the second electrode plate Cst2 of the storage capacitor Cst is coupled to the power signal line pattern VDD. The second electrodes of the two switching transistors (such as the drain electrode D4 of the fourth transistor T4 and the drain electrode D5 of the fifth transistor T5) are coupled to the first electrode of the driving transistor (such as the source electrode S3 of the third transistor T3), the orthographic projection of the second electrode of at least one of the two switching transistors on the substrate 50 at least partially overlaps the orthographic projection of the power signal line pattern VDD on the substrate 50, and at least partially overlap the orthographic projection of the second electrode plate Cst2 of the storage capacitor Cst on the substrate 50.

Specifically, the above-mentioned display substrate generally includes a plurality of sub-pixels arranged in an array, and each sub-pixel includes: a data line pattern (such as DATA1) extending in a first direction, and a power signal line pattern VDD extending at least partially in the first direction; for example, the first direction includes the Y direction, and the second direction includes the X direction.

It is worth noting that the specific structure of the power signal line pattern VDD is various. For example, the power signal line pattern VDD is a grid-like structure, and the power signal line pattern VDD of the grid-like structure includes a part extending along the first direction.

Each sub-pixel also includes a sub-pixel driving circuit and a light emitting element corresponding to the sub-pixel driving circuit in a one-to-one manner. The light emitting element includes an anode, an organic light emitting material layer, and a cathode that are stacked, wherein the anode of the light emitting element is coupled to the corresponding sub-pixel driving circuit, and the light emitting element realizes light emitting under the driving of the driving signal provided by the sub-pixel driving circuit.

As shown in FIG. 16, taking the sub-pixel driving circuit including the above 7T1C as an example, the gate electrode 203g of the third transistor T3 (that is, the driving transistor) is multiplexed as the first electrode plate Cst1 of the storage capacitor Cst, the second electrode plate Cst2 of the storage capacitor Cst is located on a side of the first electrode plate Cst1 away from the substrate, and the orthographic projection of the first plate Cst1 on the substrate at least partially overlaps the orthographic projection of the second electrode plate Cst2 on the substrate, and the orthographic projection of the second electrode plate Cst2 on the substrate at least partially overlaps the orthographic projection of the second electrode of at least one of the fourth transistor T4 and the fifth transistor T5 the substrate 50, and at least partially overlaps the orthographic projection of the power signal line pattern VDD on the substrate 50.

According to the specific structure of the above display substrate, in the display substrate provided by the embodiment of the present disclosure, the second electrode plate Cst2 of the storage capacitor Cst is coupled to the power signal line pattern VDD, so that the second electrode plate Cst2 of the storage capacitor Cst has the same fixed potential as the power signal transmitted on the power signal line pattern VDD; at the same time, the second electrodes of the two switching transistors are both coupled to the first electrode of the driving transistor, and the orthographic projection of the second electrode of at least one of the two switching transistors on the substrate 50 at least partially overlaps the orthographic projection of the power signal line pattern VDD on the substrate 50, and at least partially overlaps the orthographic projection of the second electrode plate Cst2 of the storage capacitor Cst on the substrate 50, so that the second electrode plate Cst2 of the storage capacitor Cst and the power signal line pattern VDD can both cover the second electrode of at least one of the two switching transistors, thereby reducing the crosstalk phenomenon generated by other conductive patterns (such as signal line patterns) located around at least one of the two switching transistor on the second electrode of the at least one of the two switching transistors, further reducing the crosstalk phenomenon generated on the first electrode of the driving transistor.

As shown in FIG. 16, in some embodiments, the second electrodes of the two switching transistors (such as the fourth transistor T4 and the fifth transistor T5) and the first electrode of the driving transistor (such as the third transistor T3) are an integral structure, the integral structure includes a first conductive portion 108 extending along the first direction, the orthographic projection of the first conductive portion 108 on the substrate, the orthographic projection of the power signal line pattern VDD on the substrate, and the orthographic projection of the second electrode plate Cst2 of the storage capacitor Cst on the substrate 50 have a first overlapping region, and the first overlapping region does not overlap the orthographic projections of the data line pattern (such as DATA1) on the substrate 50.

Specifically, the second electrodes of the two switching transistors and the first electrode of the driving transistor are formed into an integral structure, so that the second electrodes of the two switching transistors and the first electrode of the driving transistor are formed by a single patterning process.

In the display substrate provided by the embodiment, the integral structure includes a first conductive portion 108 extending along the first direction, and the orthographic projection of the data line pattern on the substrate is located at a side of the orthographic projection of the first conductive portion 108 on the substrate away from the orthographic projection of the driving transistor on the substrate, and the orthographic projection of the first conductive portion 108 on the substrate, the orthographic projection of the power signal line pattern VDD on the substrate and the orthographic projection of the second electrode plate Cst2 of the storage capacitor Cst on the substrate 50 have a first overlapping region, so that the second electrode plate Cst2 of the storage capacitor Cst and the power signal line pattern VDD can both cover the first conductive portion 108, thereby reducing the crosstalk caused by the signal transmitted on the data line pattern to the first conductive portion 108, reducing the crosstalk phenomenon to the first electrode of the driving transistor.

As shown in FIG. 16, in some embodiments, an orthographic projection of the first electrode of the driving transistor on the substrate 50 is located within the orthographic projection of the second electrode plate Cst2 of the storage capacitor Cst on the substrate.

The above arrangement enables the second electrode plate Cst2 of the storage capacitor Cst to completely cover the first electrode of the driving transistor, thereby more effectively reducing the crosstalk phenomenon caused by the signal transmitted on the data line pattern to the first electrode of the driving transistor.

Figure 17:
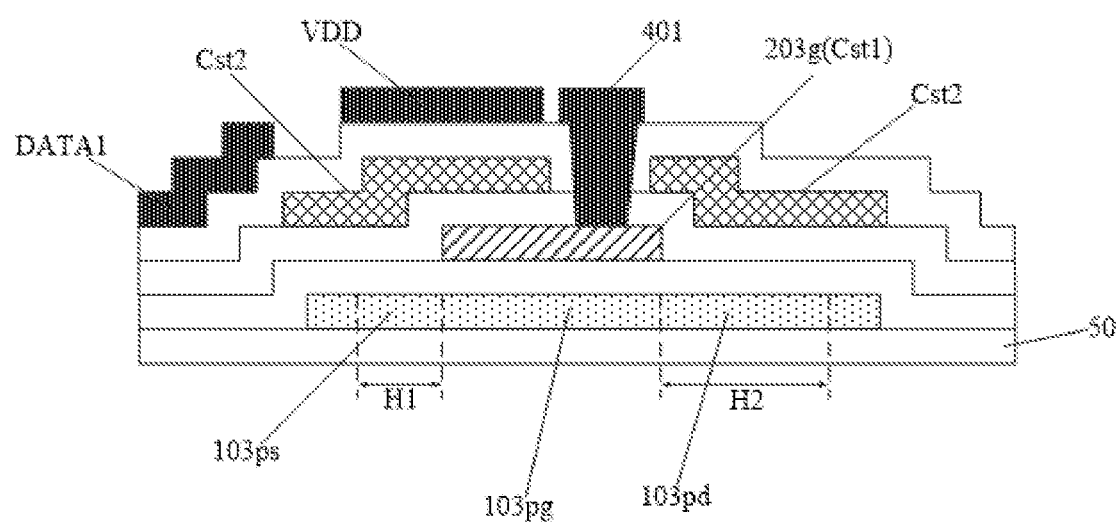
FIG. 17 is a schematic cross-sectional view along the direction C1-C2 in FIG. 16.

As shown in FIG. 16 and FIG. 17, in some embodiments, the sub-pixel further includes: a gate line pattern GATE and a light emitting control signal line pattern EM that both extend in a second direction, and the second direction intersects the first direction.

The sub-pixel driving circuit further includes: a first transistor T1 and a sixth transistor T6; the two switching transistors include a fourth transistor T4 and a fifth transistor T5.

The gate electrode 204g of the fourth transistor T4 is coupled to the gate line pattern GATE, the first electrode of the fourth transistor T4 is coupled to the data line pattern (such as DATA1), and the second electrode of the fourth transistor T4 is coupled to the second electrode of the fifth transistor T5, the gate electrode 205g of the fifth transistor T5 is coupled to the light emitting control signal line pattern EM, and the first electrode of the fifth transistor T5 is coupled to the power signal line pattern VDD.

The gate electrode 201g of the first transistor T1 is coupled to the gate line pattern GATE, the second electrode of the first transistor T1 is coupled to the gate electrode of the driving transistor. The first electrode of the first transistor T1, the first electrode of the sixth transistor T6 and the second electrode of the driving transistor form an integral structure, and the integral structure includes a second conductive portion 109 extending along the first direction. The gate electrode 206g of the sixth transistor T6 is coupled to the light emitting control signal line pattern EM, and the second electrode of the sixth transistor T6 is coupled to the light emitting element in the sub-pixel.

The orthographic projection of the channel region of the driving transistor (103pg in FIG. 18) on the substrate is located between the orthographic projection of the first conductive portion 108 on the substrate 50 and the orthographic projection of the second conductive portion 109 on the substrate 50. Along the second direction, the minimum distance between the orthographic projection of the channel region of the driving transistor on the substrate and the orthographic projection of the first conductive portion 108 on the substrate is smaller than the minimum distance between the orthographic projection of the channel region on the substrate 50 and the orthographic projection of the second conductive portion 109 on the substrate.

Specifically, in the above-mentioned display substrate, the plurality of sub-pixels may be arranged in an array, and the plurality of sub-pixels may be divided into a plurality of rows of sub-pixels and a plurality of columns of sub-pixels, and each row of sub-pixels includes a plurality of sub-pixels arranged along the second direction, each column of sub-pixels includes a plurality of sub-pixels arranged along a first direction, and the first direction intersects the second direction. The sub-pixel driving circuits included in each column of sub-pixels are located between the data line patterns included in the column of sub-pixels and the data line patterns included in a next column of sub-pixels adjacent to the column of sub-pixels.

It should be noted that, along the second direction, the minimum distance between the orthographic projection of the channel region of the driving transistor on the substrate and the orthographic projection of the first conductive portion 108 on the substrate refers to: along the second direction, in the orthographic projection of the channel region of the driving transistor on the substrate, the distance between the boundary closest to the orthographic projection of the first conductive portion 108 on the substrate, and the orthographic projection of the first conductive portion 108 on the substrate; in the second direction described above, the minimum distance between the orthographic projection of the channel region on the substrate 50 and the orthographic projections of the second conductive portion 109 on the substrate refers to: in the second direction, in the orthographic projection of the channel region of the drive transistor on the substrate, the distance between the boundary closest to the orthographic projection of the second conductive portion 109 on the substrate and the orthographic projection of the second conductive portion 109 on the substrate.

Figure 25:
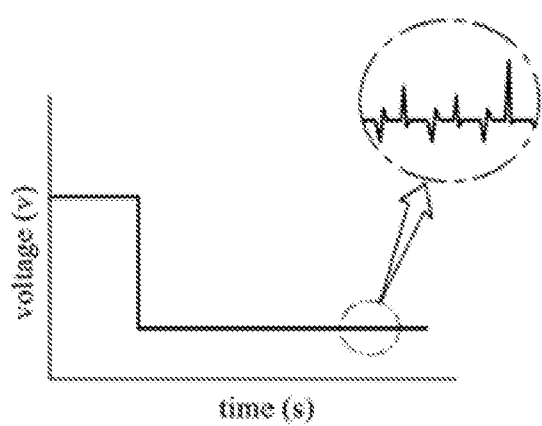
FIG. 25 is a schematic diagram of a crosstalk phenomenon occurring at a gate electrode of a driving transistor in the related art.

In more detail, the sub-pixel driving circuit included in each sub-pixel is located between two adjacent data line patterns (such as: DATA1 and DATA2). Because the data transmitted on the two data line patterns will change, and when the data changes, it is easy to cause crosstalk to the gate electrode of the driving transistor in the sub-pixel driving circuit, as shown in FIG. 25, which further affects the working stability of the driving transistor.

In the technical solution provided by the foregoing embodiment, the fourth transistor T4, the fifth transistor T5, the first transistor T1, and the sixth transistor T6 are all arranged in the peripheral area of the driving transistor, and one of the two data line patterns (such as DATA1) is located on the side of the fourth transistor T4 and the fifth transistor T5 away from the driving transistor, and the other of the two data line patterns (Such as DATA2) is located on the side of the first transistor T1 and the sixth transistor T6 away from the driving transistor; at the same time, the orthographic projection of the channel region of the driving transistor (103pg in FIG. 18) on the substrate is located between the orthographic projection of the first conductive portion 108 on the substrate 50 and the orthographic projection of the second conductive portion 109 on the substrate 50, and the minimum distance between the orthographic projection of the channel region of the drive transistor on the substrate and the orthographic projection of the first conductive portion 108 on the substrate is smaller than the minimum distance between the orthographic projection of the channel region on the substrate and the orthographic projection of the second conductive portions 109 on the substrate; thereby increase the distance between the channel region of the driving transistor and DATA2 in the greatest extent while ensuring a proper distance between the driving transistor and DATA1, thereby better reducing the crosstalk generated by the DATA2 to the driving transistor.

Moreover, since the portion of the channel region of the driving transistor close to DATA1 can be covered by the power signal line pattern VDD, the crosstalk caused by DATA1 to the channel region of the driving transistor can be effectively reduced. Therefore, in the technical solution provided by the embodiment, even if the channel region of the driving transistor is close to the DATA, the crosstalk influence is small.

In addition, since the second electrode plate Cst2 of the storage capacitor Cst has the same fixed potential as the power signal transmitted on the power signal line pattern VDD, and the orthographic projection of the first conductive portion 108 on the substrate, the orthographic projection of the power signal line pattern VDD on the substrate and the orthographic projection of the second electrode plate Cst2 of the storage capacitor Cst on the substrate 50 have a first overlapping area, so that both the second electrode plate Cst2 of the storage capacitor Cst and the power signal line pattern VDD can shield the first conductive portion 108, thereby reducing the crosstalk generated by the signal transmitted on DATA1 to the first conductive portion 108, and reducing the crosstalk phenomenon on the first electrode of the driving transistor and the channel region.

As shown in FIG. 16, in some embodiments, the sub-pixel further includes: a gate line pattern GATE and a light emitting control signal line pattern EM that both extend in a second direction, the second direction intersects the first direction.

The sub-pixel driving circuit further includes: a first transistor T1 and a sixth transistor T6; the two switching transistors include a fourth transistor T4 and a fifth transistor T5.

The gate electrode 204g of the fourth transistor T4 is coupled to the gate line pattern GATE, the first electrode of the fourth transistor T4 is coupled to the data line pattern (such as DATA1), and the second electrode of the fourth transistor T4 is coupled to the second electrode of the fifth transistor T5, the gate electrode 205g of the fifth transistor T5 is coupled to the light emitting control signal line pattern EM, and the first electrode of the fifth transistor T5 is coupled to the power signal line pattern VDD.

The gate electrode 201g of the first transistor T1 is coupled to the gate line pattern GATE, the second electrode of the first transistor T1 is coupled to the gate electrode of the driving transistor, and the first electrode of the first transistor T1, the first electrode of the sixth transistor T6 and the second electrode of the driving transistor form an integral structure, and the integral structure includes a second conductive portion 109 extending along the first direction. The gate electrode 206g of the sixth transistor T6 is coupled to the light emitting control signal line pattern EM, and the second electrode of the sixth transistor T6 is coupled to the light emitting element in the sub-pixel.

The orthographic projection of the channel region of the driving transistor (103pg in FIG. 18) on the substrate is located between the orthographic projection of the first conductive portion 108 on the substrate and the orthographic projection of the second conductive portion 109 on the substrate; the first electrode and the second electrode of the driving transistor both include a first portion extending along the second direction, and the length of the first portion of the first electrode along the second direction is different from the length of the first portion of the second electrode along the second direction.

Specifically, the first electrode and the second electrode of the driving transistor described above both include a first portion extending along the second direction, and the length of the first portion of the first electrode along the second direction is different from the length of the first portion of the second electrode along the second direction includes the following two cases:

In the first case, the length H1 of the first portion of the first electrode along the second direction is smaller than the length H2 of the first portion of the second electrode extending along the second direction, so that the channel region of the driving transistor (103pg in FIG. 18) is close to the data line pattern (such as DATA1) included in the sub-pixel including the driving transistor, and far away from the data line pattern (such as DATA2) included in the next sub-pixel adjacent to the sub-pixel including the driving transistor along the second direction, thereby increase the distance between the channel region of the driving transistor and DATA 2 in the greatest extent while ensuring a proper distance the driving transistor and DATA1, thereby better reducing the crosstalk generated by the DATA2 to the driving transistor. At the same time, since the second electrode plate Cst2 of the storage capacitor Cst and the power signal line pattern VDD can both shield the first conductive portion 108, the crosstalk is generated by the signal transmitted on DATA1 to the first conductive portion 108 is reduced, the crosstalk phenomenon generated to the first electrode and the channel region of the driving transistor is reduced.

In the second case, the length of the first portion of the first electrode along the second direction is greater than the length of the first portion of the second electrode extending along the second direction, so that the channel region of the driving transistor (103pg in FIG. 18) is far away from the data line pattern (such as DATA1) included in the sub-pixel including the driving transistor, and close to the data line pattern (such as DATA2) included in the next sub-pixel adjacent to the sub-pixel including the driving transistor along the second direction, thereby increase the distance between the channel region of the driving transistor and DATA1 in the greatest extent while ensuring a proper distance the driving transistor and DATA2, thereby better reducing the crosstalk generated by the DATA1 to the driving transistor. Moreover, when the display substrate includes a first shielding component, and the first shielding component can completely shield DATA2 from the second conductive portion 109, the crosstalk generated by the signal transmitted on DATA2 to the second conductive portion 109 can be reduced, the crosstalk phenomenon generated to the second electrode and the channel region of the driving transistor is reduced.

As shown in FIG. 16, in some embodiments, the sub-pixel further includes an initialization signal line pattern (such as VINT1), and the initialization signal line pattern includes a portion extending in a second direction. The second direction intersects the first direction, the initialization signal line pattern is used to transmit an initialization signal with a fixed potential.

The sub-pixel driving circuit further includes a second transistor T2 coupled to the gate electrode of the driving transistor, and the second transistor T2 includes: a first semiconductor pattern, a second semiconductor pattern, and a third conductor pattern respectively coupled to the first semiconductor pattern and the second semiconductor pattern, the conductivity of the third conductor pattern is better than the conductivity of the first semiconductor pattern and the conductivity of the second semiconductor pattern; a first gate pattern and a second gate pattern that are coupled to each other, wherein the orthographic projection of the first gate pattern on the substrate at least partially overlaps the orthographic projection of the first semiconductor pattern on the substrate, the orthographic projection of the second gate pattern on the substrate at least partially overlaps the orthographic projection of the second semiconductor pattern on the substrate; the orthographic projection of the third conductor pattern on the substrate, the orthographic projection of the first gate pattern on the substrate, and the orthographic projection of the second gate pattern on the substrate do not overlap; the orthographic projection of the third conductor pattern on the substrate at least partially overlaps the orthographic projection of the initialization signal line pattern on the substrate.

Specifically, as shown in FIG. 16, the above-mentioned second transistor T2 has a double-gate structure, and the first semiconductor pattern and the second semiconductor pattern included in the second transistor are formed as the channel region of the second transistor T2 (corresponding to 102pg in the FIG. 18), due to doping, the conductivity of the third conductor pattern 102px included is better than those of the first semiconductor pattern and the second semiconductor pattern. The first gate pattern and the second gate pattern included in the second transistor T2 cover the first semiconductor pattern and the second semiconductor pattern in a one-to-one manner, and can serve as the gate electrode 202g of the second transistor T2.

In the second transistor T2 of the above-mentioned structure, since the third conductive pattern 102px has good conductivity and is not covered by the gate pattern, it is easy to couple with other conductive patterns in the vicinity thereof, thereby causing crosstalk. In the technical solution provided by the foregoing embodiment, the orthographic projection of the third conductor pattern on the substrate 50 at least partially overlaps the orthographic projection of the initialization signal line pattern on the substrate 50, so that the initialization signal line pattern can cover the third conductor pattern 102px. Since the initialization signal with a fixed potential is transmitted on the initialization signal line pattern, the coupling effect between the third conductor pattern 102px and other nearby conductive patterns are better reduced, which makes the working performance of the display substrate more stable.

Figure 18:
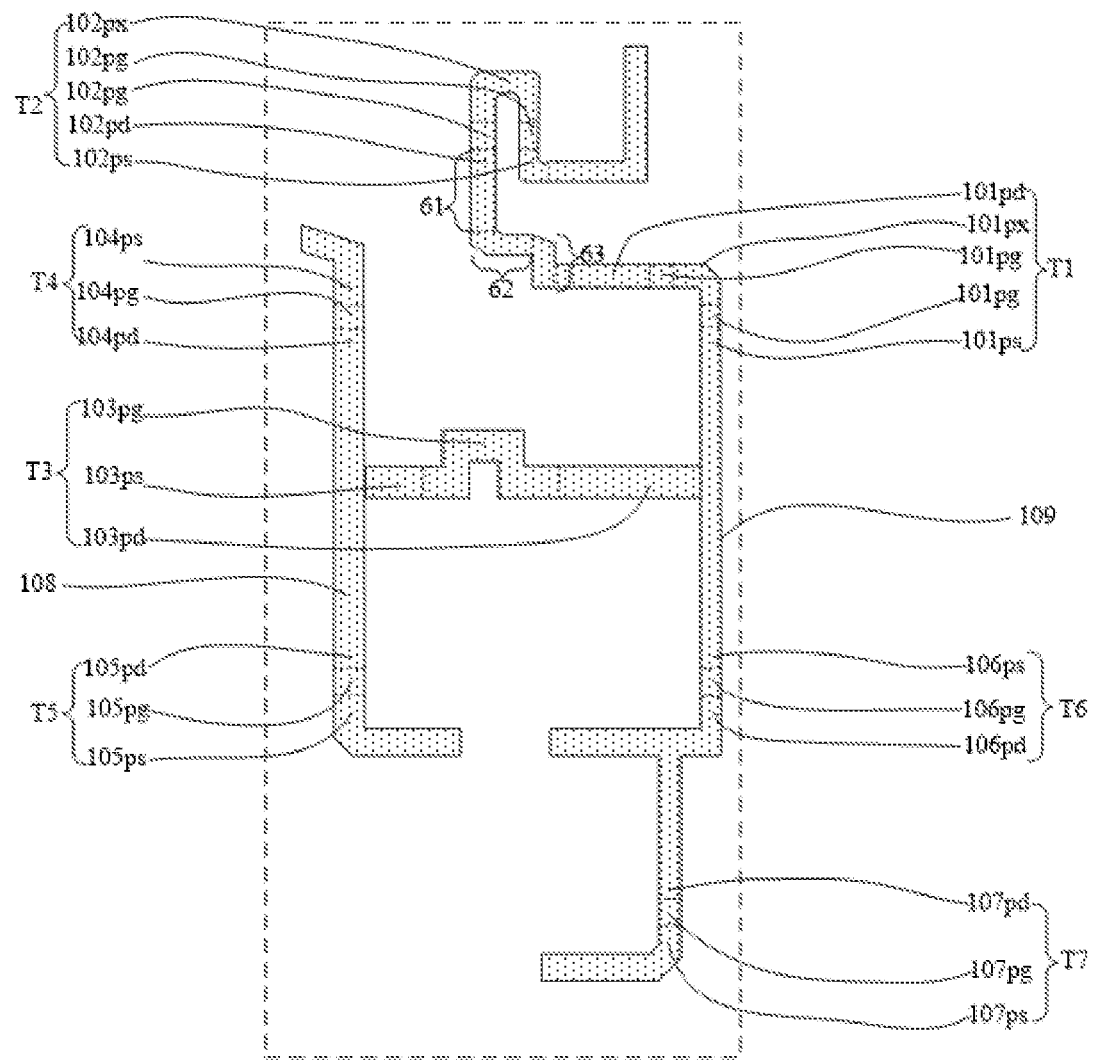
FIG. 18 is a schematic diagram of a second layout of an active film layer provided by an embodiment of the disclosure.

As shown in FIG. 16 and FIG. 18, in some embodiments, the sub-pixel driving circuit further includes a first extension portion extending from the first semiconductor pattern, and the conductivity of the first extension portion is better than that of the first semiconductor pattern; the first extension includes a first portion 61, a second portion 62 and a third portion 63, the first portion 61 and the third portion 63 extend along the first direction, the second portion 62 extends along the second direction, one end of the second portion 62 is coupled to the first portion 61, and the other end of the second portion 62 is coupled to the third portion 63; an end of the third portion 63 away from the second portion 62 is coupled to the first transistor T1.

Specifically, the first extension portion and the first semiconductor pattern can be fabricated in a single patterning process, and after the first semiconductor pattern is formed, the first extension portion is doped so that the conductivity of the first extension portion is better than that of the first semiconductor pattern.

After the first shielding component 404 is added, the first extension is set to the above structure, so that when the second transistor T2 is coupled to the gate electrodes of the first transistor T1 and the driving transistor through the first extension portion, respectively, it is more conducive to reducing the impact of the signal change transmitted on the target data line pattern on the performance of the first transistor T1 and the performance of the second transistor T2, thereby reducing the coupling effect between the gate electrode of the driving transistor (203g) and the target data line pattern, reducing the problem of vertical crosstalk, so that the display substrate can obtain a better display effect.

In some embodiments, the first transistor includes: a fourth semiconductor pattern, a fifth semiconductor pattern, and a sixth conductor pattern respectively coupled to the fourth semiconductor pattern and the fifth semiconductor pattern, the conductivity of the sixth conductor pattern is better than the conductivity of the fourth semiconductor pattern and the conductivity of the fifth semiconductor pattern; the third gate pattern and the fourth gate pattern are coupled to each other, and the orthographic projection of the third gate pattern on the substrate partially overlaps the orthographic projection of the fourth semiconductor pattern on the substrate, so the orthographic projection of the fourth gate pattern on the substrate partially overlaps the orthographic projection of the fifth semiconductor pattern on the substrate; the orthographic projection of the sixth conductor pattern on the substrate, the orthographic projection of the third gate pattern on the substrate, and the orthographic projection of the fourth gate pattern on the substrate do not overlap.

Specifically, as shown in FIG. 16, the first transistor has a dual-gate structure, and the fourth semiconductor pattern and the fifth semiconductor pattern included in the first transistor are formed as the channel region of the first transistor (corresponding to 101pg in FIG. 18), due to doping, the conductivity of the sixth conductor pattern 101px is better than those of the fourth semiconductor pattern and the fifth semiconductor pattern. The third gate pattern and the fourth gate pattern included in the first transistor cover the fourth semiconductor pattern and the fifth semiconductor pattern in a one-to-one manner, and can be used as the gate electrode 201g of the first transistor T1.

Figure 19:
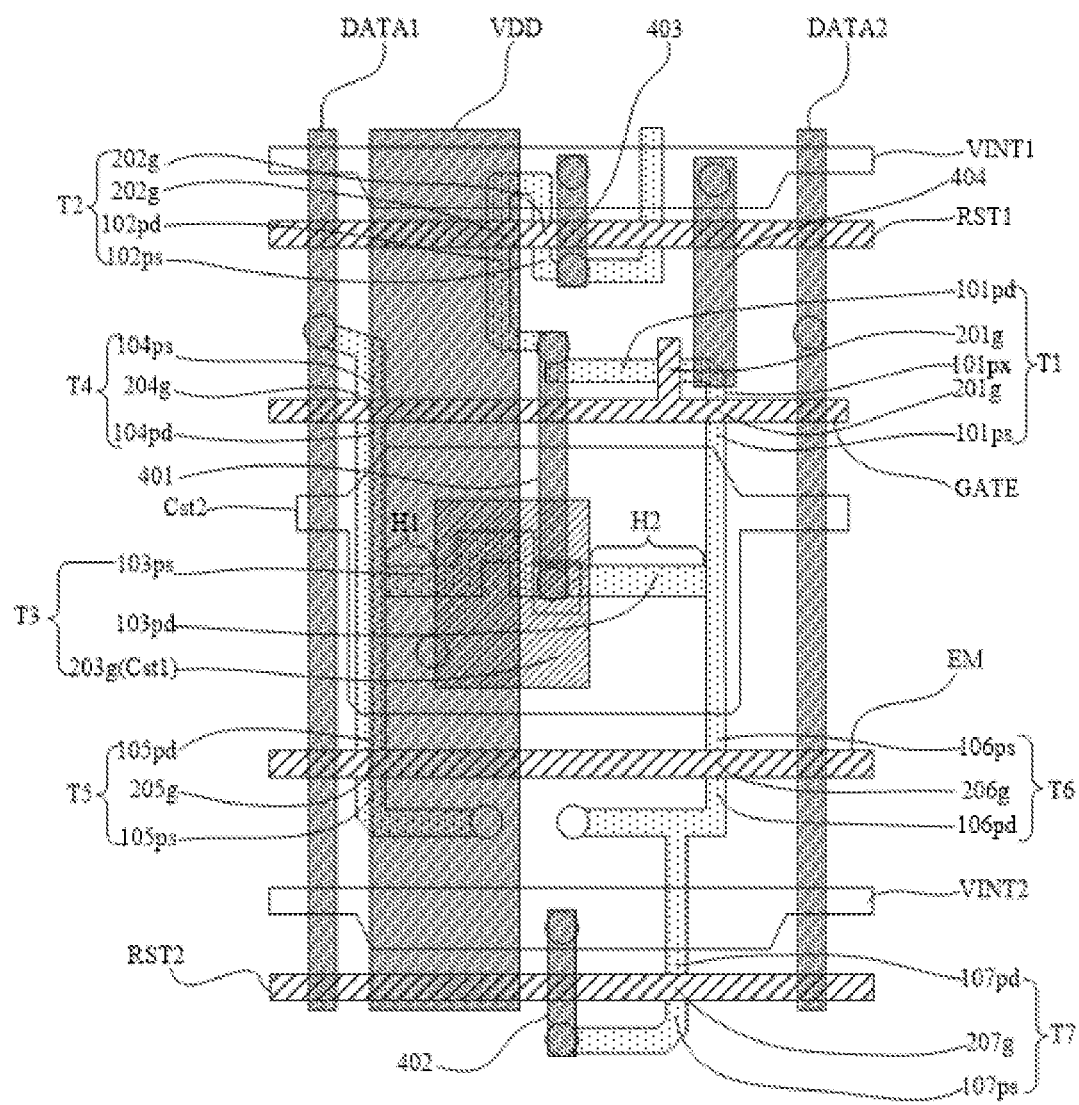
FIG. 19 is a schematic diagram of an eighth layout of a sub-pixel driving circuit in a display substrate provided by an embodiment of the disclosure.

As shown in FIG. 19, in some embodiments, the sub-pixel further includes an initialization signal line pattern (such as VINT1), and the initialization signal line pattern includes a portion extending in a second direction. The second direction intersects the first direction, the initialization signal line pattern is used to transmit an initialization signal with a fixed potential;

The sub-pixel driving circuit further includes: a first shielding component 404 coupled to the initialization signal line pattern, and the orthographic projection of the first shielding component 404 on the substrate 50 at least partially overlaps the orthographic projection of the sixth conductor pattern 101px on the substrate 50.

In the technical solution provided by the foregoing embodiment, the orthographic projection of the first shielding component 404 on the substrate 50 at least partially overlaps the orthographic projection of the sixth conductor pattern 101px on the substrate 50, so that the first shielding component 404 can cover the sixth conductor pattern 101px, and since the first shielding component 404 has a fixed potential, the coupling effect between sixth conductor pattern 101px and other nearby conductive patterns is reduced, the working performance of the display substrate is more stable.

Figure 20:
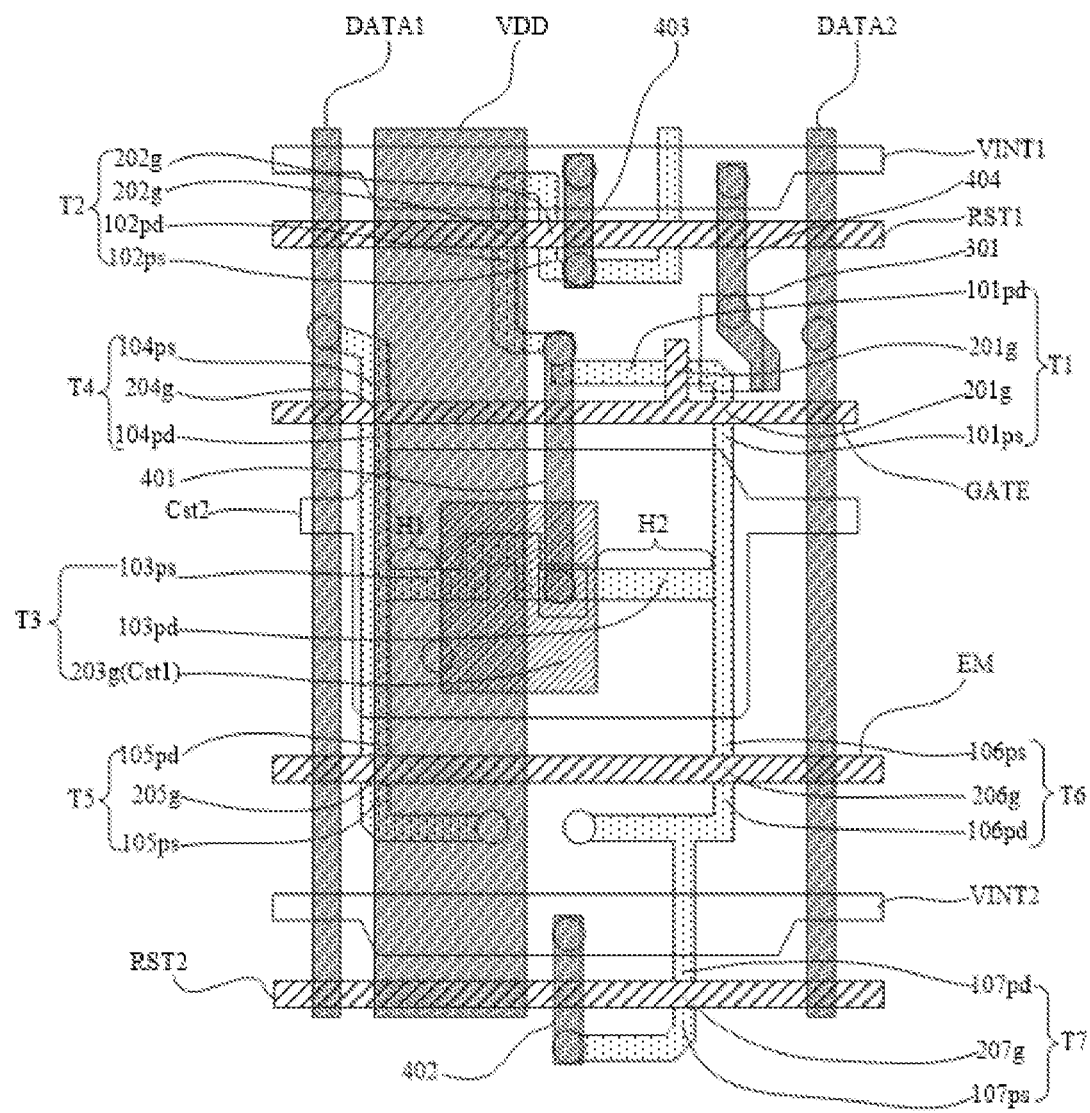
FIG. 20 is a schematic diagram of a ninth layout of a sub-pixel driving circuit in a display substrate provided by an embodiment of the disclosure.

As shown in FIG. 20, in some embodiments, the sub-pixel further includes an initialization signal line pattern (such as VINT1), and the initialization signal line pattern includes a portion extending in a second direction. The second direction intersects the first direction, the initialization signal line pattern is used to transmit an initialization signal with a fixed potential.

The sub-pixel driving circuit further includes: a first shielding component 404 coupled with the initialization signal line pattern, and a second shielding component 301 coupled with the first shielding component 404, the orthographic projection of the second shielding component 301 on the substrate at least partially overlaps the orthographic projection of the sixth conductor pattern on the substrate.

Specifically, the orthographic projection of the second shielding component 301 on the substrate 50 at least partially overlaps the orthographic projection of the sixth conductor pattern 101px on the substrate 50, so that the second shielding component 301 can cover the sixth conductor pattern 101px, and since the second shielding component 301 is coupled to the first shielding component 404, the second shielding component 301 has a fixed potential, the coupling effect between the sixth conductor pattern 101px and other nearby conductive patterns is reduced, so that the working performance of the display substrate is more stable.

Therefore, in the display substrate provided by the above-mentioned embodiment, since the first shielding component 404 and the second shielding component 301 both have a fixed potential, which prevents or reduces the parasitic capacitance formed between the first transistor T1 and the target data line pattern (For example, DATA2), which effectively prevents or reduces vertical crosstalk defects.

Figure 21:
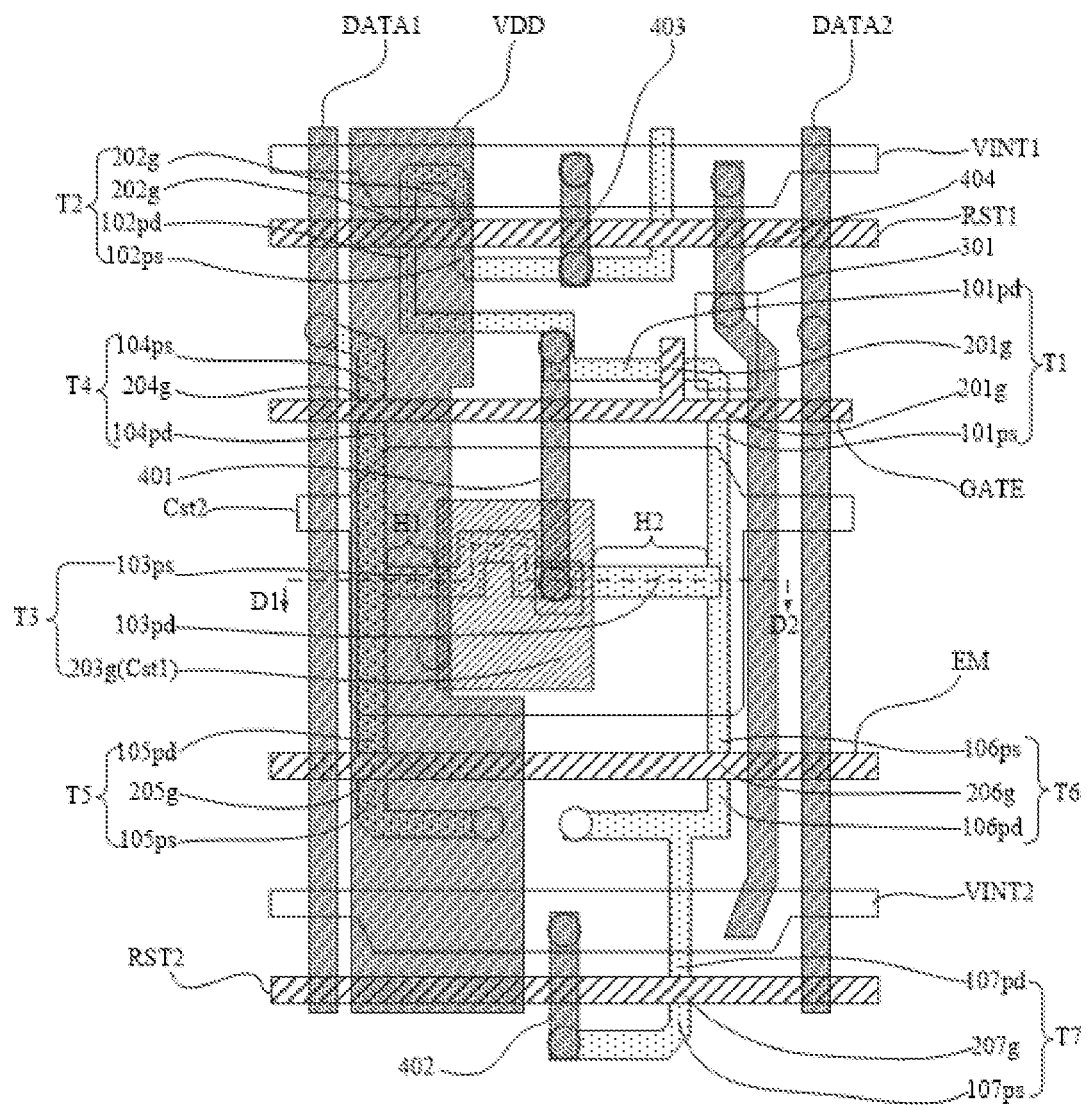
FIG. 21 is a schematic diagram of a tenth layout of a sub-pixel driving circuit in a display substrate provided by an embodiment of the disclosure.
Figure 22:
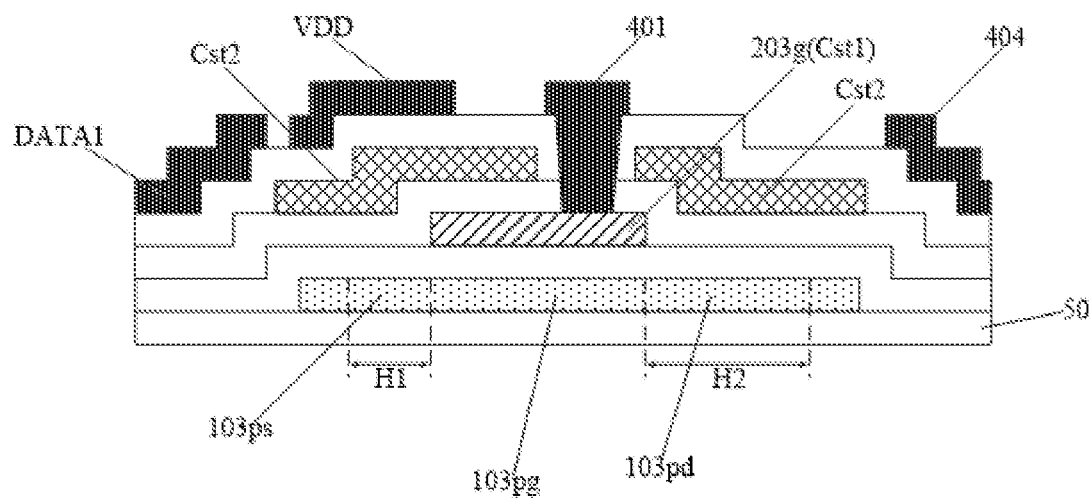
FIG. 22 is a schematic cross-sectional view along the direction D1-D2 in FIG. 21.

As shown in FIG. 21 and FIG. 22, in some embodiments, the plurality of sub-pixels include a plurality of rows of sub-pixels, and each row of sub-pixels includes a plurality of the sub-pixels arranged along the second direction, and are located in the same row. The initialization signal line patterns in the sub-pixels are sequentially coupled to form the initialization signal line corresponding to the row of sub-pixels; the first shielding component 404 extends along the first direction, and the first shielding component 404 is coupled to two adjacent initialization signal lines.

In some embodiments, the shape of the power signal line pattern can be laid out according to actual needs. For example, along the second direction, the width of the power signal line pattern close to the channel region of the driving transistor is smaller than the width of the power signal line pattern far away from the channel region of the driving transistor, so that the influence of the power signal line pattern on the gate electrode of the driving transistor can be reduced in the vicinity of the channel region of the driving transistor.

Figure 23:
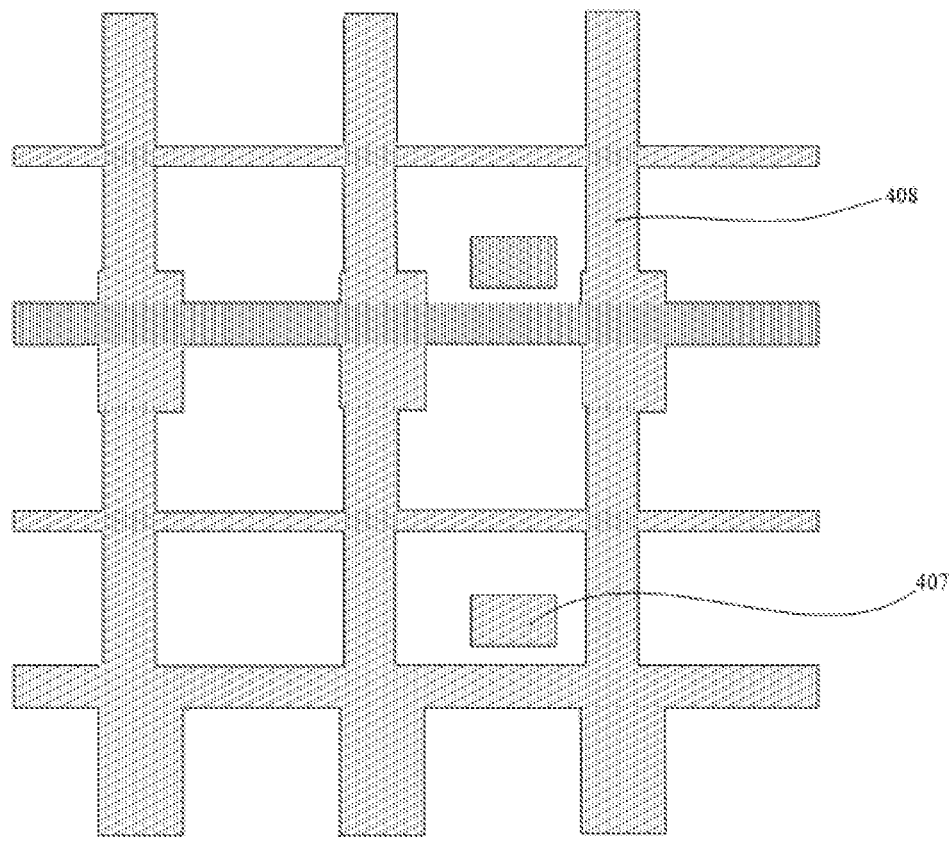
FIG. 23 is a schematic diagram of the layout of the third metal layer.

In some embodiments, as shown in FIG. 23, a compensation pattern 408 may be provided in the display substrate, and the compensation pattern 408 may be connected in parallel with the power signal line pattern to improve the transmission performance of the power signal line pattern. It is worth noting that the compensation pattern 408 can be formed in the same layer and the same material as the third conductive connection portion, so that the compensation pattern 408 and the third conductive connection portion can be formed in the same patterning process.

In some embodiments, in one sub-pixel, the orthographic projection of the power signal line pattern VDD on the substrate completely covers the orthographic projection of the first conductive portion 108 on the substrate.

In some embodiments, in one sub-pixel, the orthographic projection of the power signal line pattern VDD on the substrate covers the orthographic projection of the first semiconductor pattern, the second semiconductor pattern and the third conductor pattern of the second transistor T2 on the substrate, and covers at least a part of the orthographic projection of the first electrode of the second transistor T2 on the substrate, and at least a part of the orthographic projection of the second electrode of the second transistor T2 on the substrate.

In some embodiments, the first shielding component 404 is an extension structure extending from the initialization signal line pattern.

Specifically, the first shielding component 404 is an extension structure extended from the initialization signal line pattern, so that the first shielding component 404 and the initialization signal line pattern can be formed in the same patterning process, thereby simplifying the manufacturing process of the display substrate.

As shown in FIG. 20, in some embodiments, the first shielding component 404 and the initialization signal line pattern are arranged in different layers, and the orthographic projection of the first shielding component 404 on the substrate 50 and the orthographic projection of the initialization signal line pattern on the substrate 50 have a first overlapping region, and the first shielding component is coupled to the initialization signal line pattern through a first via at the first overlapping region.

The second shielding component 301 and the first shielding component 404 are arranged in different layers, and the orthographic projection of the second shielding component 301 on the substrate 50 and the orthographic projection of the first shielding component 404 on the substrate 50 have a second overlapping region, and the second shielding component 301 and the first shielding component 404 are coupled through a second via at the second overlapping region.

Specifically, the first shielding component 404 and the initialization signal line pattern can be arranged in the same layer or in different layers. When the first shielding component 404 and the initialization signal line pattern are arranged in different layers, the orthographic projection of the first shielding component 404 on the substrate 50 and the orthographic projection of the initialization signal line pattern on the substrate 50 have a first overlapping region, so that the first shielding component 404 is coupled to the initialization signal line through the via hole at the first overlapping region. Similarly, the second shielding component 301 and the first shielding component 404 can be arranged in the same layer or in different layers. When the second shielding component 301 and the first shielding component 404 are arranged in different layers, the orthographic projection of the second shielding component 301 on the substrate 50 and the orthographic projection of the first shielding component 404 on the substrate 50 have a second overlapping region, so that the second shielding component 301 is coupled to the first shielding component 404 through the second via hole at the second overlapping region.

In some embodiments, the first shielding component 404 and the data line pattern are made of the same material.

In some embodiments, the display substrate includes a first interlayer insulating layer, and both the first shielding component 404 and the data line pattern are located on a surface of the first interlayer insulating layer away from the substrate.

Specifically, the first shielding component 404 is arranged in the above-mentioned manner, so that the first shielding component 404 and the data line pattern can be simultaneously formed on the surface of the first interlayer insulating layer away from the substrate through a patterning process, thereby avoiding adding an additional patterning process for manufacturing the first shielding component 404, thereby simplifying the manufacturing process of the display substrate and saving the manufacturing cost.

In some embodiments, the second shielding component 301 and the initialization signal line pattern are made of the same material.

In some embodiments, the display substrate further includes a second interlayer insulating layer, and both the second shielding component 301 and the initialization signal line pattern are located on the surface of the second interlayer insulating layer away from the substrate.

Specifically, as described above, the second shielding component 301 and the initialization signal line pattern are made of the same material, and the second shielding component 301 and the initialization signal line pattern (VINT1 in FIG. 3) are both located on a surface of the second interlayer insulating layer away from the surface, so that the second shielding component 301 and the initialization signal line pattern can be formed at the same time in the same patterning process, avoiding adding a process for manufacturing the second shielding component 301, thereby simplifying the manufacturing process of the display substrate and saving the production cost.

In some embodiments, the first electrode plate Cst1 of the storage capacitor Cst is multiplexed as the gate electrode of the driving transistor, and the second electrode plate Cst2 of the storage capacitor Cst and the second shielding component 301 are made of the same material, and the second electrode plate Cst2 of the storage capacitor Cst is located on the surface of the second interlayer insulating layer away from the substrate 50.

Specifically, the storage capacitor Cst included in the sub-pixel driving circuit has a first electrode plate Cst1 and a second electrode plate Cst2, the first electrode plate Cst1 and the second electrode plate Cst2 are arranged oppositely, and the first electrode plate Cst1 is coupled to the gate electrode of the driving transistor, and the second electrode plate Cst2 is coupled to the power signal line pattern VDD. When laying out the storage capacitor Cst, the first electrode plate Cst1 can be directly multiplexed as the gate electrode of the driving transistor, which not only ensures that the storage capacitor Cst is coupled to the gate electrode of the driving transistor, but also reduces the space occupied by the sub-pixel driving circuit, which is more conducive to improving the resolution of the display substrate. In addition, the second electrode plate Cst2 of the storage capacitor Cst is located on the surface of the second interlayer insulating layer away from the substrate, so that the second electrode plate Cst2 of the storage capacitor Cst, the second shielding components 301 and the initialization signal line pattern are formed at the same time in the same patterning process, which greatly simplifies the manufacturing process of the display substrate and saves the production cost.

In some embodiments, the sub-pixel further includes: a reset signal line pattern (such as RST1) extending in a second direction intersecting the first direction, and the sub-pixel driving circuit further includes: a first conductive connection portion 405, the orthographic projection of the first conductive connection portion 405 on the substrate 50 covers at least part of the orthographic projection of the sixth conductor pattern 101px on the substrate 50; a second transistor T2, the first electrode (such as the source electrode S2) of the second transistor T2 is coupled to the initialization signal line pattern (such as VINT1) through the first conductive connection portion 405, and the second electrode (such as the drain electrode D2) of the second transistor is coupled to the gate electrode of the driving transistor, and the gate electrode 202g of the second transistor T2 is coupled to the reset signal line pattern (such as RST1).

Specifically, the first conductive connection portion 405 can be made of a metal material, and can be formed in the same patterning process as the data line pattern.

The above-mentioned orthographic projection of the first conductive connecting portion 405 on the substrate 50 covers at least part of the orthographic projection of the sixth conductor pattern 101px on the substrate 50, so that the first conductive connecting portion 405 can cover the sixth conductor pattern 101px, and since the first conductive connection portion 405 is coupled to the initialization signal line pattern, the first conductive connection portion 405 has a fixed potential, thereby better reducing the coupling effect between the sixth conductive pattern 101px and other conductive patterns nearby, and making the working performance of the display substrate more stable.

As shown in FIG. 16, in some embodiments, the sub-pixel further includes: a gate line pattern GATE, a light emitting control signal line pattern EM, a reset signal line pattern (such as RST1), and an initialization signal line pattern (such as VINT1). The gate line pattern GATE, the light emitting control signal line pattern EM, the reset signal line pattern, and the initialization signal line pattern all extend in a second direction, and the second direction intersects the first direction.

The two switching transistors include a fourth transistor T4 and a fifth transistor T5.

The sub-pixel driving circuit further includes: a first transistor T1, a second transistor T2, a sixth transistor T6, and a seventh transistor T7.

The gate electrode of the driving transistor (such as the gate electrode 203g of the third transistor T3) is coupled to the second electrode of the first transistor T1, and the first electrode of the driving transistor is coupled to the second electrode of the fifth transistor T5, the second electrode of the driving transistor is coupled to the first electrode of the first transistor T1.

The gate electrode 201g of the first transistor T1 is coupled to the gate line pattern GATE.

The gate electrode 202g of the second transistor T2 is coupled to the reset signal line pattern, the first electrode of the second transistor T2 is coupled to the initialization signal line pattern, and the second electrode of the second transistor T2 is coupled to the gate electrode of the driving transistor;

The gate electrode 204g of the fourth transistor T4 is coupled to the gate line pattern GATE, and the first electrode of the fourth transistor T4 is coupled to the data line pattern (DATA1), the second electrode of the fourth transistor T4 is coupled to the first electrode of the driving transistor.

The gate electrode 205g of the fifth transistor T5 is coupled to the light emitting control signal line pattern EM, and the first electrode of the fifth transistor T5 is coupled to the power signal line pattern VDD.

The gate electrode 206g of the sixth transistor T6 is coupled to the light emitting control signal line pattern EM, the first electrode of the sixth transistor T6 is coupled to the second electrode of the driving transistor, and the second electrode of the sixth transistor T6 is coupled to the light emitting element in the sub-pixel.

The gate electrode 207g of the seventh transistor T7 is coupled to the reset signal line pattern (such as RST2) included in the next adjacent sub-pixel along the first direction, and the first electrode of the seventh transistor T7 is coupled to the initialization signal line pattern (such as VINT2) included in the next adjacent sub-pixel, and the second electrode of the seventh transistor T7 is coupled to the light emitting element in the sub-pixel.

Specifically, in the above-mentioned display substrate, the plurality of sub-pixels may be arranged in an array, and the plurality of sub-pixels may be divided into a plurality of rows of sub-pixels and a plurality of columns of sub-pixels, and each row of sub-pixels includes a plurality of sub-pixels arranged along the second direction, and each column of sub-pixels includes a plurality of sub-pixels arranged along a first direction, and the first direction intersects the second direction.

It should be noted that the above-mentioned next adjacent sub-pixel along the first direction is the next adjacent sub-pixel located in the same column as the seventh transistor T7.

The sub-pixel and the sub-pixel driving circuit included in the above-mentioned structure can effectively reduce the layout space occupied by the sub-pixel driving circuit while ensuring the working performance of the sub-pixel driving circuit, which is beneficial to improve the resolution of the display substrate.

The embodiments of the present disclosure also provide a display device, including the display substrate provided in the above-mentioned embodiments.

Since in the display substrate provided by the foregoing embodiment, the second electrode plate Cst2 of the storage capacitor Cst is coupled to the power signal line pattern VDD, so that the second electrode plate Cst2 of the storage capacitor Cst has a same potential with the power signal transmitted on the power signal line pattern VDD; at the same time, the second electrodes of the two switching transistors are coupled to the first electrode of the driving transistor, and the orthographic projection of the second electrode of at least one of the two switching transistors on the substrate 50 at least partially overlaps the orthographic projection of the power signal line pattern VDD on the substrate 50, and at least partially overlaps the orthographic projection of the second electrode plate Cst2 of the storage capacitor Cst on the substrate 50, so that both the second electrode plate Cst2 of the storage capacitor Cst and the power signal line pattern VDD can shield the second electrode of at least one of the two switching transistors, thereby reducing the crosstalk phenomenon caused by the signal on other conductive patterns (such as signal line patterns) located around at least one of the two switching transistors to the second electrode of at least one of the two switching transistors, thereby reducing the crosstalk phenomenon generated to the first electrode of the driving transistor.

Therefore, when the display device provided by the embodiment of the present disclosure includes the above-mentioned display substrate, it also has the above-mentioned beneficial effects, which will not be repeated here.

The embodiment of the present disclosure also provides a manufacturing method of a display substrate, the manufacturing method includes: forming a plurality of sub-pixels arranged in an array on a substrate; the sub-pixels include: a data line pattern extending in a first direction; a power signal line pattern, the power signal line pattern includes a portion extending along the first direction; a sub-pixel driving circuit, the sub-pixel driving circuit includes: two switching transistors, a driving transistor and a storage capacitor; a first electrode plate of the storage capacitor is coupled to the gate electrode of the driving transistor, a second electrode plate of the storage capacitor is coupled to the power signal line pattern; the second electrodes of the two switching transistors are both coupled to the first electrode of the driving transistor, the orthographic projection of the second electrode of at least one of the two switching transistors on the substrate at least partially overlaps the orthographic projection of the power signal line pattern on the substrate, and at least partially overlaps the orthographic projection of the second plate of the storage capacitor on the substrate.

In the display substrate manufactured by the manufacturing method provided by the embodiment of the present disclosure, the second electrode plate Cst2 of the storage capacitor Cst is coupled to the power signal line pattern VDD, so that the second electrode plate Cst2 of the storage capacitor Cst has the same fixed potential as the power signal transmitted on the power signal line pattern VDD; at the same time, the second electrodes of the two switching transistors are coupled to the first electrode of the driving transistor. The orthographic projection of the second electrode of at least one of the two switching transistors on the substrate 50 at least partially overlaps the orthographic projection of the power signal line pattern VDD on the substrate 50, and at least partially overlaps the orthographic projection of the second electrode plate Cst2 of the storage capacitor Cst on the substrate 50, so that the second electrode plate Cst2 of the storage capacitor Cst and the power signal line pattern VDD can both shield the second electrode of at least one of the two switching transistors, thereby reducing the crosstalk phenomenon generated by the signal on other conductive patterns (such as signal line patterns) located around at least one of the two switching transistors on the second electrode of at least one of the two switching transistors, further reducing the crosstalk phenomenon generated on the first electrode of the driving transistor.

It should be noted that the various embodiments in this specification are described in a progressive manner, and the same or similar parts between the various embodiments can be referred to each other, and each embodiment focuses on the differences from other embodiments. In particular, for the method embodiment, since it is basically similar to the product embodiment, the description is relatively simple, and the relevant parts can be referred to the part of the description of the product embodiment.

Unless otherwise defined, the technical terms or scientific terms used in the present disclosure shall have the usual meanings understood by those with ordinary skills in the art. The "first", "second" and similar words used in the present disclosure do not indicate any order, quantity or importance, but are only used to distinguish different components. "Include" or "comprise" and other similar words mean that the element or item appearing before the word covers the element or item listed after the word and their equivalents, but does not exclude other elements or items. Similar words such as "connected" or "coupled" are not limited to physical or mechanical connections, but may include electrical connections, whether direct or indirect. "Up", "Down", "Left", "Right", etc. are only used to indicate the relative position relationship. When the absolute position of the described object changes, the relative position relationship may also change accordingly.

It can be understood that when an element such as a layer, film, region or substrate is referred to as being "above" or "under" another element, the element can be "directly" above or under the other element. Or there may be intermediate elements.

In the description of the foregoing embodiments, specific features, structures, materials, or characteristics may be combined in any one or more embodiments or examples in an appropriate manner.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display substrate, comprising a substrate and a plurality of sub-pixels arranged in an array on the substrate; wherein the sub-pixel comprises:
   a data line pattern extending along a first direction;
   a power signal line pattern, the power signal line pattern including a portion extending along the first direction;
   a sub-pixel driving circuit, wherein the sub-pixel driving circuit includes two switching transistors, a driving transistor, and a storage capacitor; a first electrode plate of the storage capacitor is coupled to a gate electrode of the driving transistor, and a second electrode plate of the storage capacitor is coupled to the power signal line pattern; second electrodes of the two switching transistors are both coupled to a first electrode of the driving transistor, and an orthographic projection of a second electrode of at least one of the two switching transistors on the substrate at least partially overlaps an orthographic projection of the power signal line pattern on the substrate, and at least partially overlaps an orthographic projection of the second electrode plate of the storage capacitor on the substrate,
   wherein the display substrate further includes a shielding component, at least part of the shielding component extends along the first direction,
   wherein the second electrodes of the two switching transistors and the first electrode of the driving transistor are an integral structure, and the integral structure includes a first conductive portion extending in the first direction, an orthographic projection of the first conductive portion on the substrate, the orthographic projection of the power signal line pattern on the substrate, and the orthographic projection of the second electrode plate of the storage capacitor on the substrate have a first overlapping region, and the first overlapping region does not overlap an orthographic projection of the data line pattern on the substrate.

2. The display substrate according to claim 1, wherein an orthographic projection of the first electrode of the driving transistor on the substrate is located in the orthographic projection of the second electrode plate of the storage capacitor on the substrate.

3. The display substrate according to claim 1, wherein the sub-pixel further comprises: a gate line pattern and a light emitting control signal line pattern both extending along a second direction, the second direction intersecting the first direction;
   the sub-pixel driving circuit further includes: a first transistor and a sixth transistor; the two switching transistors include a fourth transistor and a fifth transistor;
   a gate electrode of the fourth transistor is coupled to the gate line pattern, a first electrode of the fourth transistor is coupled to the data line pattern, and a second electrode of the fourth transistor is coupled to a second electrode of the fifth transistor, a gate electrode of the fifth transistor is coupled to the light emitting control signal line pattern, and a first electrode of the fifth transistor is coupled to the power signal line pattern;

a gate electrode of the first transistor is coupled to the gate line pattern, a second electrode of the first transistor is coupled to the gate electrode of the driving transistor, the first electrode of the first transistor, a first electrode of the six transistor and the second electrode of the driving transistor are formed as an integral structure, and the integral structure includes a second conductive portion extending along the first direction, a gate electrode of the sixth transistor is coupled to the light emitting control signal line pattern, and a second electrode of the sixth transistor is coupled to the light emitting element in the sub-pixel;

an orthographic projection of a channel region of the driving transistor on the substrate is located between an orthographic projection of the first conductive portion on the substrate and an orthographic projection of the second conductive portion on the substrate; and along the second direction, a minimum distance between the orthographic projection of the channel region of the driving transistor on the substrate and the orthographic projection of the first conductive portion on the substrate is smaller than a minimum distance between the orthographic projection of the channel region of the driving transistor on the substrate and the orthographic projection of the second conductive portion on the substrate.

4. The display substrate according to claim 1, wherein the sub-pixel further comprises: a gate line pattern and a light emitting control signal line pattern both extending along a second direction, the second direction intersecting the first direction, the sub-pixel driving circuit further includes: a first transistor and a sixth transistor; the two switching transistors include a fourth transistor and a fifth transistor;

a gate electrode of the fourth transistor is coupled to the gate line pattern, a first electrode of the fourth transistor is coupled to the data line pattern, and a second electrode of the fourth transistor is coupled to a second electrode of the fifth transistor, a gate electrode of the fifth transistor is coupled to the light emitting control signal line pattern, and a first electrode of the fifth transistor is coupled to the power signal line pattern;

a gate electrode of the first transistor is coupled to the gate line pattern, a second electrode of the first transistor is coupled to the gate electrode of the driving transistor, the first electrode of the first transistor, a first electrode of the sixth transistor and the second electrode of the driving transistor are formed as an integral structure, and the integral structure includes a second conductive portion extending along the first direction, a gate electrode of the sixth transistor is coupled to the light emitting control signal line pattern, and a second electrode of the sixth transistor is coupled to the light emitting element in the sub-pixel;

an orthographic projection of a channel region of the driving transistor on the substrate is located between an orthographic projection of the first conductive portion on the substrate and an orthographic projection of the second conductive portion on the substrate; the first electrode and the second electrode of the driving transistor both include a first portion extending along the second direction, and a length of the first portion of the first electrode along the second direction is different from a length of the first portion of the second electrode along the second direction.

5. The display substrate according to claim 1, wherein the sub-pixel further comprises an initialization signal line pattern, the initialization signal line pattern includes a portion extending along a second direction, and the second direction intersects the first direction, and the initialization signal line pattern is used to transmit an initialization signal with a fixed potential;

the sub-pixel driving circuit further includes a second transistor coupled to the gate electrode of the driving transistor, and the second transistor includes:

a first semiconductor pattern, a second semiconductor pattern, and a third conductor pattern coupled to the first semiconductor pattern and the second semiconductor pattern, conductivity of the third conductor pattern is better than conductivity of the first semiconductor pattern and conductivity of the second semiconductor pattern;

a first gate pattern and the second gate pattern, an orthographic projection of the first gate pattern on the substrate at least partially overlaps an orthographic projection of the first semiconductor pattern on the substrate, an orthographic projection of the second gate pattern on the substrate at least partially overlaps an orthographic projection of the second semiconductor pattern on the substrate;

an orthographic projection of the third conductor pattern on the substrate, the orthographic projection of the first gate pattern on the substrate, and the orthographic projection of the second gate pattern on the substrate do not overlap;

the orthographic projection of the third conductor pattern on the substrate at least partially overlaps the orthographic projection of the initialization signal line pattern on the substrate.

6. The display substrate according to claim 5, wherein the sub-pixel driving circuit further comprises a first extension part extending from the first semiconductor pattern, and the conductivity of the first extension part is better than that of the first semiconductor pattern;

the first extension includes a first part, a second part, and a third part, the first part and the third part all extend along the first direction, and the second part extends along the second direction, one end of the second part is coupled to the first part, and the other end of the second part is coupled to the third part;

one end of the third part away from the second part is coupled to the first transistor.

7. The display substrate of claim 1, wherein the sub-pixel driving circuit further comprises: a first transistor and a sixth transistor; the first transistor comprises:

a fourth semiconductor pattern, a fifth semiconductor pattern, and a sixth conductor pattern coupled to the fourth semiconductor pattern and the fifth semiconductor pattern, conductivity of the sixth conductor pattern is better than conductivity of the fourth semiconductor pattern and conductivity of the fifth semiconductor pattern;

the third gate pattern and the fourth gate pattern coupled to each other, and an orthographic projection of the third gate pattern on the substrate partially overlaps an orthographic projection of the fourth semiconductor pattern on the substrate, an orthographic projection of the fourth gate pattern on the substrate partially overlaps an orthographic projection of the fifth semiconductor pattern on the substrate;
an orthographic projection of the sixth conductor pattern on the substrate, the orthographic projection of the third gate pattern on the substrate, and the orthographic projection of the fourth gate pattern on the substrate do not overlap.

8. The display substrate according to claim 7, wherein the sub-pixel further comprises an initialization signal line pattern, the initialization signal line pattern includes a portion extending along a second direction, and the second direction intersects the first direction, the initialization signal line pattern is used to transmit an initialization signal with a fixed potential;
the sub-pixel driving circuit further includes:
a first shielding component coupled to the initialization signal line pattern, an orthographic projection of the first shielding component on the substrate at least partially overlaps the orthographic projection of the sixth conductor pattern on the substrate.

9. The display substrate according to claim 8, wherein the first shielding component is an extension structure extending from the initialization signal line pattern.

10. The display substrate according to claim 8, wherein the first shielding component and the data line pattern are made of a same material.

11. The display substrate according to claim 8, wherein the display substrate comprises a first interlayer insulating layer, and the first shielding component and the data line pattern are both located on a surface of the first interlayer insulating layer away from the substrate.

12. The display substrate according to claim 7, wherein the sub-pixel further comprises an initialization signal line pattern, the initialization signal line pattern includes a portion extending along a second direction, and the second direction intersects the first direction, and the initialization signal line pattern is used to transmit an initialization signal with a fixed potential;
the sub-pixel driving circuit further includes:
a first shielding component coupled with the initialization signal line pattern, a second shielding component coupled with the first shielding component, an orthographic projection of the second shielding component on the substrate at least partially overlaps the orthographic projections of the sixth conductor patterns on the substrate.

13. The display substrate according to claim 12, wherein the first shielding component and the initialization signal line pattern are arranged in different layers, and the orthographic projection of the first shielding component on the substrate and the orthographic projection of the initialization signal line pattern on the substrate have a first overlapping region, the first shielding component is coupled to the initialization signal line pattern through a first via hole at the first overlapping region;
the second shielding component and the first shielding component are arranged in different layers, and the orthographic projection of the second shielding component on the substrate and the orthographic projection of the first shielding component on the substrate have a second overlapping region, the second shielding component and the first shielding component are coupled through a second via hole at the second overlapping region.

14. The display substrate according to claim 12, wherein the second shielding component and the initialization signal line pattern are made of a same material.

15. The display substrate according to claim 12, wherein the display substrate further comprises a second interlayer insulating layer, and the second shielding component and the initialization signal line pattern are both located on a surface of the second interlayer insulating layer away from the substrate.

16. The display substrate according to claim 15, wherein the first electrode plate of the storage capacitor is multiplexed as the gate electrode of the drive transistor, and the second electrode plate of the storage capacitor and the second shielding component are made of a same material, and the second electrode plate of the storage capacitor is located on a surface of the second interlayer insulating layer away from the substrate.

17. The display substrate according to claim 7, wherein the sub-pixel further comprises: a reset signal line pattern extending along a second direction intersecting the first direction, and the sub-pixel driving circuit further comprises:
a first conductive connection portion, an orthographic projection of the first conductive connection portion on the substrate covers at least part of the orthographic projection of the sixth conductor pattern on the substrate;
a second transistor, a first electrode of the second transistor is coupled to the initialization signal line pattern through the first conductive connection portion, and a second electrode of the second transistor is coupled to the gate electrode of the driving transistor, a gate electrode of the second transistor is coupled to the reset signal line pattern.

18. The display substrate according to claim 1, wherein the sub-pixel further comprises: a gate line pattern, a light emitting control signal line pattern, a reset signal line pattern, and an initialization signal line pattern; the gate line pattern, the light emitting control signal line pattern, the reset signal line pattern, and the initialization signal line pattern all extend along a second direction, and the second direction intersects the first direction;
the two switching transistors include a fourth transistor and a fifth transistor;
the sub-pixel driving circuit further includes: a first transistor, a second transistor, a sixth transistor, and a seventh transistor;
a gate electrode of the driving transistor is coupled to a second electrode of the first transistor, a first electrode of the driving transistor is coupled to a second electrode of the fifth transistor, and a second electrode of the driving transistor is coupled to a first electrode of the first transistor;
a gate electrode of the first transistor is coupled to the gate line pattern;
a gate electrode of the second transistor is coupled to the reset signal line pattern, a first electrode of the second transistor is coupled to the initialization signal line pattern, and a second electrode of the second transistor is coupled to the gate electrode of the driving transistor;
a gate electrode of the fourth transistor is coupled to the gate line pattern, a first electrode of the fourth transistor is coupled to the data line pattern, and a second electrode of the fourth transistor is coupled to the first electrode of the driving transistor;

a gate electrode of the fifth transistor is coupled to the light emitting control signal line pattern, and a first electrode of the fifth transistor is coupled to the power signal line pattern;

a gate electrode of the sixth transistor is coupled to the light emitting control signal line pattern, a first electrode of the sixth transistor is coupled to the second electrode of the driving transistor, and a second electrode of the sixth transistor is coupled to a corresponding light emitting element in the sub-pixel;

a gate electrode of the seventh transistor is coupled to the reset signal line pattern included in a next sub-pixel adjacent along the first direction, and a first electrode of the seventh transistor is connected to the initialization signal line pattern included in the next sub-pixel, and a second electrode of the seventh transistor is coupled to the light emitting element in the sub-pixel.

19. A display device comprising the display substrate according to claim 1.

\* \* \* \* \*